United States Patent
Shimizu et al.

(10) Patent No.: US 8,790,868 B2
(45) Date of Patent: Jul. 29, 2014

(54) METHOD OF FORMING RESIST PATTERN AND NEGATIVE TONE-DEVELOPMENT RESIST COMPOSITION

(75) Inventors: Hiroaki Shimizu, Kawasaki (JP); Hideto Nito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 45 days.

(21) Appl. No.: 13/456,768

(22) Filed: Apr. 26, 2012

(65) Prior Publication Data
US 2012/0276481 A1 Nov. 1, 2012

(30) Foreign Application Priority Data
Apr. 27, 2011 (JP) ................ P2011-099952

(51) Int. Cl.
*G03F 7/039* (2006.01)
*G03F 7/26* (2006.01)
*G03F 7/30* (2006.01)

(52) U.S. Cl.
USPC ............................ 430/434; 430/326; 430/910

(58) Field of Classification Search
USPC .................. 430/270.1, 326, 434, 907, 910
See application file for complete search history.

(56) References Cited

U.S. PATENT DOCUMENTS

| 5,945,517 A | 8/1999 | Nitta et al. |
| 6,153,733 A | 11/2000 | Yukawa et al. |
| 2008/0318171 A1 | 12/2008 | Tsubaki |
| 2010/0266957 A1* | 10/2010 | Harada et al. ............ 430/285.1 |

FOREIGN PATENT DOCUMENTS

| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-090991 | 3/2002 |
| JP | A-2008-309879 | 12/2008 |
| WO | WO 2004/074242 A2 | 9/2004 |

* cited by examiner

*Primary Examiner* — Anca Eoff
(74) *Attorney, Agent, or Firm* — Knobbe Martens Olson & Bear LLP

(57) ABSTRACT

A method of forming a resist pattern, the method including: forming a resist film on a substrate using a resist composition containing a base component (A) that exhibits reduced solubility in an organic solvent under the action of acid, an acid generator component (B) that generates acid upon exposure and a fluorine-containing polymeric compound (F), exposing the resist film, and patterning the resist film by negative tone development using a developing solution containing the organic solvent, thereby forming a resist pattern, wherein the base component (A) contains a resin component (A1) containing a structural unit (a1) derived from an acrylate ester, the dissolution rates of (A1) and (F) in the developing solution are each at least 10 nm/s, and the absolute value of the difference in the dissolution rates of (A1) and (F) in the developing solution is not more than 80 nm/s.

5 Claims, No Drawings

METHOD OF FORMING RESIST PATTERN AND NEGATIVE TONE-DEVELOPMENT RESIST COMPOSITION

TECHNICAL FIELD

The present invention relates to a method of forming a resist pattern, and a resist composition for negative tone development that can be used in the method of forming a resist pattern.

Priority is claimed on Japanese Patent Application No. 2011-099952, filed Apr. 27, 2011, the content of which is incorporated herein by reference.

DESCRIPTION OF RELATED ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and higher energy) than these excimer lasers, such as electron beam, extreme ultraviolet radiation (EUV) and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist composition is used, which includes a base component that exhibits changed solubility in a developing solution under the action of acid, and an acid generator component that generates acid upon exposure.

For example, in the case where the developing solution is an alkali developing solution (alkali developing process), a chemically amplified positive resist composition which contains, as a resin component (base resin), a resin which exhibits increased solubility in an alkali developing solution under the action of acid, and an acid generator component is typically used. If the resist film formed using this resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution. In this manner, the unexposed portions remain to form a positive resist pattern. The base resin used exhibits increased polarity under the action of acid, thereby exhibiting increased solubility in an alkali developing solution, whereas the solubility in an organic solvent is decreased. Therefore, when such a base resin is applied to a process using a developing solution containing an organic solvent (organic developing solution) (hereafter, this process is referred to as a "solvent developing process" or "negative tone developing process") instead of an alkali developing process, the solubility of the exposed portions in an organic developing solution is decreased. As a result, in the solvent developing process, the unexposed portions of the resist film are dissolved and removed by the organic developing solution, and a negative resist pattern in which the exposed portions remain is formed.

In a positive tone developing process, which uses a resist composition that forms a positive pattern in an alkali developing process, if a trench pattern (isolated space pattern) or hole pattern is formed, then compared with the formation of a line pattern or dot pattern, pattern formation must be performed under a weak incident light intensity, meaning the contrast between the light intensities irradiated onto the exposed portions and the unexposed portions decreases. As a result, there tend to be limitations on the pattern formation capabilities including the resolution, and forming a high-resolution resist pattern tends to be difficult.

In contrast, a negative tone developing process that employs a combination of an organic developing solution and a negative-type chemically amplified resist composition, namely a chemically amplified resist composition that exhibits reduced solubility in an alkali developing solution upon exposure, is thought to be more advantageous for the formation of trench patterns and hole patterns. Accordingly, in recent years, negative tone developing processes have become more important in the formation of fine resist patterns, and base resins and the like that are suited to negative tone developing processes have been proposed.

For example, Patent Document 1 discloses a method of forming a pattern that uses a resist composition for negative tone development which contains a resin having structural units derived from (meth)acrylate esters within the main chain.

DOCUMENTS OF RELATED ART

Patent Document

[Patent Document 1] Japanese Unexamined Patent Application, First Publication No. 2008-309879

SUMMARY OF THE INVENTION

As further progress is made in lithography techniques, and as resist patterns become ever finer, resist materials will require further improvements in a variety of lithography properties such as CDU (CD uniformity).

In negative tone development, because the unexposed portions dissolve in the developing solution, the solubility of the resist material in the developing solution has a large effect on the lithography properties. However, with conventional resist compositions for negative tone development such as the resist composition disclosed in Patent Document 1, the solubility of the material in the developing solution is not considered, and pattern formation using this type of resist composition for negative tone development still leaves room for improvement in terms of the lithography properties achieved.

The present invention takes the above circumstances into consideration, with an object of providing a method of forming a resist pattern that is capable of forming a resist pattern having excellent lithography properties in a negative tone developing process that uses a developing solution containing an organic solvent, as well as providing a resist composition for negative tone development that can be used in this method of forming a resist pattern.

In order to achieve the above object, the present invention adopts the aspects described below.

Namely, a first aspect of the present invention is a method of forming a resist pattern, the method including a step of forming a resist film on a substrate using a resist composition containing a base component (A) that exhibits reduced solubility in an organic solvent under the action of acid, an acid generator component (B) that generates acid upon exposure and a fluorine-containing polymeric compound (F), a step of exposing the resist film, and a step of patterning the resist film by negative tone development using a developing solution containing the organic solvent, thereby forming a resist pattern, wherein the base component (A) contains a resin component (A1) containing a structural unit (a1), which is derived from an acrylate ester in which the hydrogen atom bonded to the carbon atom on the α-position may be substituted with a substituent, and contains an acid-decomposable group that exhibits increased polarity under the action of acid, the dissolution rates of the resin component (A1) and the fluorine-containing polymeric compound (F) in the developing solution are each at least 10 nm/s, and the absolute value of the difference in the dissolution rates of the resin component (A1) and the fluorine-containing polymeric compound (F) in the developing solution is not more than 80 nm/s.

A second aspect of the present invention is a resist composition for negative tone development including a base component (A) that exhibits reduced solubility in an organic solvent under the action of acid, an acid generator component (B) that generates acid upon exposure and a fluorine-containing polymeric compound (F), and the resist composition used in a method of forming a resist pattern that includes a step of forming a resist film on a substrate using the resist composition, a step of exposing the resist film, and a step of patterning the resist film by negative tone development using a developing solution containing the organic solvent, thereby forming a resist pattern, wherein the base component (A) contains a resin component (A1) containing a structural unit (a1), which is derived from an acrylate ester in which the hydrogen atom bonded to the carbon atom on the α-position may be substituted with a substituent, and contains an acid-decomposable group that exhibits increased polarity under the action of acid, the dissolution rates of the resin component (A1) and the fluorine-containing polymeric compound (F) in the developing solution are each at least 10 nm/s, and the absolute value of the difference in the dissolution rates of the resin component (A1) and the fluorine-containing polymeric compound (F) in the developing solution is not more than 80 nm/s.

In the present description and claims, the term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise. This definition also applies for the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom, wherein examples of the halogen atom include a fluorine atom, chlorine atom, bromine atom and iodine atom.

A "fluorinated alkyl group" or a "fluorinated alkylene group" is a group in which part or all of the hydrogen atoms of an alkyl group or alkylene group respectively have each been substituted with a fluorine atom.

The term "structural unit" refers to a monomer unit that contributes to the formation of a polymeric compound (resin, polymer, copolymer).

An "acrylate ester" refers to a compound in which the terminal hydrogen atom of the carboxyl group of acrylic acid ($CH_2=CH-COOH$) has been substituted with an organic group.

A "structural unit derived from an acrylate ester" refers to a structural unit that is formed by the cleavage of the ethylenic double bond of an acrylate ester.

Examples of the substituent in an "acrylate ester in which the hydrogen atom bonded to the carbon atom on the α-position may be substituted with a substituent" include a halogen atom, an alkyl group of 1 to 5 carbon atoms, a halogenated alkyl group of 1 to 5 carbon atoms and a hydroxyalkyl group. With respect to a "structural unit derived from an acrylate ester", the "α-position" (the carbon atom on the α-position) refers to the carbon atom having the carbonyl group bonded thereto, unless specified otherwise.

Examples of the halogen atom as the substituent which may be bonded to the carbon atom on the α-position include a fluorine atom, chlorine atom, bromine atom and iodine atom.

Specific examples of the alkyl group of 1 to 5 carbon atoms for the substituent which may be bonded to the carbon atom on the α-position include linear and branched alkyl groups such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms for the substituent include groups in which part or all of the hydrogen atoms of an aforementioned "alkyl group of 1 to 5 carbon atoms for the substituent" are each substituted with a halogen atom. Examples of the halogen atom include a fluorine atom, chlorine atom, bromine atom and iodine atom, and a fluorine atom is particularly desirable.

Specific examples of the hydroxyalkyl group of 1 to 5 carbon atoms for the substituent include groups in which part or all of the hydrogen atoms of an aforementioned "alkyl group of 1 to 5 carbon atoms for the substituent" are each substituted with a hydroxyl group.

In the present invention, a hydrogen atom, an alkyl group of 1 to 5 carbon atoms or a halogenated alkyl group of 1 to 5 carbon atoms is preferably bonded to the carbon atom on the α-position, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

The term "exposure" is used as a general concept that includes irradiation with any form of radiation.

The present invention can provide a method of forming a resist pattern that is capable of forming a resist pattern having excellent lithography properties in a negative tone developing process that uses a developing solution containing an organic solvent, and can also provide a resist composition for negative tone development that can be used in this method of forming a resist pattern.

DETAILED DESCRIPTION OF THE INVENTION

The method of forming a resist pattern according to the first aspect of the present invention includes a step of forming a resist film on a substrate using a resist composition (hereafter frequently referred to as the "resist composition for negative tone development") containing a base component (A) that exhibits reduced solubility in an organic solvent under the action of acid, an acid generator component (B) that generates acid upon exposure and a fluorine-containing polymeric compound (F), a step of exposing the resist film, and a step of patterning the resist film by negative tone development using a developing solution containing the organic solvent, thereby forming a resist pattern.

In this method of forming a resist pattern, the base component (A) contains a resin component (A1) containing a structural unit (a1), which is derived from an acrylate ester in which the hydrogen atom bonded to the carbon atom on the α-position may be substituted with a substituent, and contains an acid-decomposable group that exhibits increased polarity under the action of acid, the dissolution rates of the resin component (A1) and the fluorine-containing polymeric compound (F) in the developing solution are each at least 10 nm/s, and the absolute value of the difference in the dissolution rates of the resin component (A1) and the fluorine-containing polymeric compound (F) in the developing solution is not more than 80 nm/s.

When this resist composition for negative tone development is irradiated (exposed) with radiation, acid is generated from the acid generator component (B), and the action of that acid causes a reduction in the solubility of the base component (A) in organic solvents. As a result, in the above method of forming a resist pattern, when a resist film obtained using the resist composition for negative tone development is subjected to selective exposure, the exposed portions of the resist film exhibit reduced solubility in a developing solution containing an organic solvent, whereas the solubility of the unexposed portions in organic-based developing solutions does not change, meaning subsequent negative tone development using an organic developing solution causes the unexposed portions to be removed, thus forming a resist pattern.

As the resist composition for negative tone development, the resist composition for negative tone development of the present invention described below can be used.

More specifically, the method of forming a resist pattern according to the present invention can be conducted, for example, in the manner described below.

First, the resist composition for negative tone development described above is applied onto a substrate using a spinner or the like, and a bake (post applied bake (PAB)) treatment is conducted at a temperature of 80 to 150° C. for a period of 40 to 120 seconds, and preferably 60 to 90 seconds, to form a resist film. Next, the resist film is subjected to selective exposure, either by exposure through a mask having a predetermined pattern formed therein (mask pattern) using an exposure apparatus such as an ArF exposure apparatus, an electron beam lithography apparatus or an EUV exposure apparatus, or by patterning via direct irradiation with an electron beam without using a mask pattern, and another bake (post exposure bake (PEB)) is then conducted under temperature conditions of 80 to 150° C. for a period of 40 to 120 seconds, and preferably 60 to 90 seconds. A developing treatment is then performed using an organic developing solution, preferably followed by a rinse treatment using a rinse liquid containing an organic solvent.

Following the developing treatment or rinse treatment, residual developing solution or rinse liquid adhered to the pattern may be removed using a supercritical fluid.

Further, in some cases a bake (post bake) treatment may be performed following the developing treatment, the rinse treatment, or the treatment with a supercritical fluid to remove any residual organic solvent.

There are no particular limitations on the substrate, and a conventionally known substrate may be used. For example, substrates for electronic components, and such substrates having wiring patterns formed thereon can be used. Specific examples include metal substrates composed of metals such as silicon wafer, copper, chromium, iron and aluminum, and glass substrates. Examples of materials that may be used for the wiring pattern include copper, aluminum, nickel, and gold.

Further, as the substrate, any one of the above-mentioned substrates provided with an inorganic and/or organic film on the surface thereof may also be used. Examples of the inorganic film include inorganic antireflection films (inorganic BARC). Examples of the organic film include organic antireflection films (organic BARC) and organic films such as the lower organic film formed in a multilayer resist method.

Here, a "multilayer resist method" is a method in which at least one layer of an organic film (a lower-layer organic film) and at least one layer of a resist film (an upper-layer resist film) are provided on a substrate, and a resist pattern formed in the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

There are no particular limitations on the wavelength used for exposure, and the exposure can be conducted using radiation such as an ArF excimer laser, KrF excimer laser, $F_2$ excimer laser, extreme ultraviolet radiation (EUV), vacuum ultraviolet radiation (VUV), electron beam (EB), X-rays, and soft X-rays. The resist composition described above exhibits good usability with a KrF excimer laser, ArF excimer laser, EB or EUV, and is particularly effective for use with an ArF excimer laser, EB or EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably has a refractive index larger than the refractive index of air but smaller than the refractive index of the resist film that is to be exposed. The refractive index of the immersion medium is not particularly limited as long at it satisfies the above requirements.

Examples of this immersion medium having a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

The organic solvent contained within the organic developing solution used for development may be selected appropriately from any conventional organic solvent capable of dissolving the base component (A) (the base component (A) prior to exposure). Specific examples of organic solvents that may be used include polar solvents such as ketone-based solvents, ester-based solvents, alcohol-based solvents, amide-based solvents and ether-based solvents, and hydrocarbon solvents. Among these, ester-based solvents and ketone-based solvents are preferred. As the ester-based solvent, butyl acetate is particularly desirable. As the ketone-based solvent, methyl amyl ketone (2-heptanone) is particularly desirable.

A ketone-based solvent is an organic solvent containing C—C(=O)—C within the structure. An ester-based solvent is an organic solvent containing C—C(=O)—O—C within the structure. An alcohol-based solvent is an organic solvent containing an alcoholic hydroxyl group within the structure, wherein an "alcoholic hydroxyl group" describes a hydroxyl group bonded to a carbon atom of an aliphatic hydrocarbon group. An amide-based solvent is an organic solvent containing an amide group within the structure. An ether-based solvent is an organic solvent containing C—O—C within the structure. Among organic solvents, there also exist organic solvents which contain a plurality of the different functional groups that characterize each of the above solvent types, and these solvents may be classified as any of the solvent types for which the characteristic functional group is contained within the solvent structure. For example, diethylene glycol monomethyl ether may be classified as both an alcohol-based solvent and an ether-based solvent. Further, hydrocarbon solvents are composed of hydrocarbons, wherein the hydrocarbons contain no substituents (atoms or groups other than a hydrogen atom or a hydrocarbon group).

Specific examples of each of the above solvent types are listed below. Examples of the ketone-based solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, γ-butyrolactone and methyl amyl ketone (2-heptanone).

Examples of the ester-based solvents include methyl acetate, butyl acetate, ethyl acetate, isopropyl acetate, amyl acetate, isoamyl acetate, ethyl methoxyacetate, ethyl ethoxyacetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate and propyl 3-methoxypropionate.

As the ester-based solvent, the use of a solvent represented by a general formula (1) described below or a solvent represented by a general formula (2) described below is preferred, the use of a solvent represented by the general formula (1) is more preferred, the use of an alkyl acetate is still more preferred, and the use of butyl acetate is the most desirable.

Examples of the alcohol-based solvents include primary alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol-based solvents such as ethylene glycol, diethylene glycol and triethylene glycol; and glycol ether-based solvents that contain a hydroxyl group such as ethylene glycol monomethyl ether, propylene glycol monomethyl ether, diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these, the glycol ether-based solvents are preferred.

Examples of the amide-based solvents include N-methyl-2-pyrrolidone, N,N-dimethylacetamide, N,N-dimethylformamide, hexamethylphosphoric triamide and 1,3-dimethyl-2-imidazoldinone.

Examples of the ether-based solvents include the aforementioned glycol ether-based solvents that contain a hydroxyl group; glycol ether-based solvents such as propylene glycol dimethyl ether, propylene glycol diethyl ether, diethylene glycol dimethyl ether and diethylene glycol diethyl ether; as well as dioxane, tetrahydrofuran, anisole, perfluoro-2-butyltetrahydrofuran, perfluorotetrahydrofuran and 1,4-dioxane. Among these, glycol ether-based solvents are preferred, including the glycol ether-based solvents that contain a hydroxyl group and glycol-ether based solvents that do not contain a hydroxyl group.

Examples of the hydrocarbon solvents include aliphatic hydrocarbon solvents such as pentane, hexane, octane, decane, 2,2,4-trimethylpentane, 2,2,3-trimethylhexane, perfluorohexane and perfluoroheptane; and aromatic hydrocarbons such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these, aromatic hydrocarbon-based solvents are preferred.

Any of the above organic solvents may be used individually, or two or more solvents may be mixed together and used in combination. Further, organic solvents other than those listed above and water may also be mixed with the solvent.

A solvent represented by a general formula (1) or a general formula (2) shown below is preferred as the organic solvent used in the organic developing solution.

$$R^{00}-C(=O)-O-R^{01} \qquad (1)$$

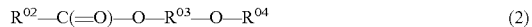

$$R^{02}-C(=O)-O-R^{03}-O-R^{04} \qquad (2)$$

In the formula (1), each of $R^{00}$ and $R^{01}$ independently represents a hydrogen atom, alkyl group, alkoxy group, alkoxycarbonyl group, carboxyl group, hydroxyl group, cyano group or halogen atom, or $R^{00}$ and $R^{01}$ may be bonded to each other to form a ring. In the formula (2), each of $R^{02}$ and $R^{04}$ independently represents a hydrogen atom, alkyl group, alkoxy group, alkoxycarbonyl group, carboxyl group, hydroxyl group, cyano group or halogen atom, or $R^{02}$ and $R^{04}$ may be bonded to each other to form a ring, and $R^{03}$ represents an alkylene group.

In the formula (1), the alkyl group for $R^{00}$ and $R^{01}$ may be a linear, branched or cyclic group, but is preferably a linear or branched group, and preferably contains 1 to 5 carbon atoms. The alkyl group may have a substituent. Examples of the substituent include a hydroxyl group, carboxyl group and cyano group.

The alkyl group within the alkoxy group or alkoxycarbonyl group is the same as defined above for the alkyl group.

Examples of the halogen atom include a fluorine atom, chlorine atom, bromine atom and iodine atom, and a fluorine atom is preferred.

Each of $R^{00}$ and $R^{01}$ is preferably a hydrogen atom or an alkyl group.

Specific examples of the solvent represented by the formula (1) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Among the solvents listed above, the solvent represented by the formula (1) is preferably a solvent in which $R^{00}$ and $R^{01}$ are both unsubstituted alkyl groups, is more preferably an alkyl acetate, and is most preferably butyl acetate.

In the formula (2), $R^{02}$ and $R^{04}$ are the same as defined above for $R^{00}$ and $R^{01}$.

The alkylene group for $R^{03}$ may be a linear, branched or cyclic group, but is preferably a linear or branched group, and preferably contains 1 to 5 carbon atoms. The alkylene group may have a substituent. Examples of the substituent include a hydroxyl group, carboxyl group and cyano group. In those cases where the alkylene group contains 2 or more carbon atoms, an oxygen atom (—O—) may be interposed between carbon atoms of the alkylene group.

Specific examples of the solvent represented by the formula (2) include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl 3-methoxypropionate, ethyl 3-methoxypropionate, ethyl 3-ethoxypropionate, propyl 3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

Any of the solvents represented by the formula (1) or the formula (2) may be used individually, or two or more of the solvents may be mixed together and used in combination. Further, a solvent of the formula (1) or (2) may also be mixed with one or more other solvents.

There are no particular limitations on these other solvents, provided they can be mixed with the solvent represented by the formula (1) or (2) without separating out, and such other solvents may be selected appropriately from among the aforementioned ester-based solvents, ketone-based solvents, alcohol-based solvents, amide-based solvents, ether-based solvents and hydrocarbon solvents.

From the viewpoint of reducing the cost of the solvent used in the development, the organic solvent used in the organic developing solution is preferably an organic solvent that does not contain halogen atoms. The amount of organic solvents containing no halogen atoms relative to the total weight of the organic developing solution is preferably not less than 60% by weight, more preferably not less than 80% by weight, still more preferably not less than 90% by weight, and may even be 100% by weight.

The boiling point of the organic solvent used in the organic developing solution is preferably at least 50° C. but less than 250° C.

The flash point of the organic solvent used in the organic developing solution is preferably at least 200° C.

Conventional additives may be added to the organic developing solution as required. Examples of these additives include surfactants. There are no particular limitations on the surfactants, and ionic or nonionic fluorine-based and/or silicon-based surfactants can be used.

Examples of commercially available surfactants that may be used include fluorine-based surfactants and silicon-based surfactants such as Eftop EF301 and EF303 (manufactured by Shin-Akita Kasei Co., Ltd.), Fluorad FC430 and 431 (manufactured by Sumitomo 3M Ltd.), Megafac F171, F173, F176, F189 and R08 (manufactured by DIC Corporation), Surflon S-382, SC101, 102, 103, 104, 105 and 106 (manufactured by Asahi Glass Co., Ltd.), and Troysol S-366 (manufactured by Troy Corporation). Further, the polysiloxane polymer KP-341 (manufactured by Shin-Etsu Chemical Co., Ltd.) can also be used as a silicon-based surfactant.

Furthermore, as the surfactant, besides the conventional surfactants described above, surfactants that use a polymer having fluoroaliphatic groups derived from a fluoroaliphatic compound produced by the telomerization method (also known as the telomer method) or the oligomerization method (also known as the oligomer method) can also be used. The fluoroaliphatic compound can be synthesized using the method disclosed in Japanese Unexamined Patent Application, First Publication No. 2002-90991.

The polymer having fluoroaliphatic groups is preferably a copolymer of a monomer having a fluoroaliphatic group and a (poly(oxyalkylene)) acrylate and/or a (poly(oxyalkylene)) methacrylate, and may be either a random copolymer or a block copolymer. Examples of the poly(oxyalkylene) group include a poly(oxyethylene) group, poly(oxypropylene) group and poly(oxybutylene) group, or a unit having alkylenes with different chain lengths within the same chain, such as a poly(oxyethylene-oxypropylene-oxyethylene block) group or a poly(oxyethylene-oxypropylene block) group. Moreover, the copolymer of the monomer having a fluoroaliphatic group and the (poly(oxyalkylene)) acrylate (or methacrylate) is not limited to binary copolymers, and ternary or higher copolymers prepared by simultaneous copolymerization of two or more different monomers having a fluoroaliphatic group, and/or two or more different (poly(oxyalkylene)) acrylates (or methacrylates) may also be used.

Examples of commercially available products of such surfactants include Megafac F178, F-470, F-473, F-475, F-476 and F-472 (manufactured by DIC Corporation). Other examples include copolymers of an acrylate (or methacrylate) having a C6F13 group and a (poly(oxyalkylene)) acrylate (or methacrylate), copolymers of an acrylate (or methacrylate) having a C6F13 group, a (poly(oxyethylene)) acrylate (or methacrylate) and a (poly(oxypropylene)) acrylate (or methacrylate), copolymers of an acrylate (or methacrylate) having a C8F17 group and a (poly(oxyalkylene)) acrylate (or methacrylate), and copolymers of an acrylate (or methacrylate) having a C8F17 group, a (poly(oxyethylene)) acrylate (or methacrylate) and a (poly(oxypropylene)) acrylate (or methacrylate).

As the surfactant, a nonionic surfactant is preferred, and a fluorine-based surfactant or silicon-based surfactant is particularly preferred.

In those cases where a surfactant is added, the amount added of the surfactant, relative to the total weight of the organic developing solution, is typically within a range from 0.001 to 5% by weight, preferably from 0.005 to 2% by weight, and more preferably from 0.01 to 0.5% by weight.

The developing treatment using the organic developing solution can be performed using conventional developing methods. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Following the above developing treatment, prior to performing drying, a rinse treatment may be performed using a rinse liquid containing an organic solvent. Performing rinsing enables more favorable pattern formation.

The organic solvent used for the rinse liquid may be selected appropriately from those organic solvents among the organic solvents described above for use in the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The alcohol-based solvent used in the rinse liquid is preferably a monohydric alcohol of 6 to 8 carbon atoms, wherein the monohydric alcohol may have a linear, branched or cyclic structure. Specific examples include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferred, and 1-hexanol or 2-hexanol is particularly desirable.

Any of these organic solvents may be used individually, or two or more solvents may be mixed together and used in combination. Further, organic solvents other than those listed above and water may also be mixed with the organic solvent. However, if due consideration is given to the developing properties, then the amount of water within the rinse liquid, relative to the total weight of the rinse liquid, is preferably not more than 30% by weight, more preferably not more than 10% by weight, still more preferably not more than 5% by weight, and most preferably 3% by weight or less.

Conventional additives may be added to the rinse liquid as required. Examples of these additives include surfactants. Examples of these surfactants include the same surfactants as those described above, but nonionic surfactants are preferred, and a fluorine-based surfactant or silicon-based surfactant is particularly desirable.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the rinse liquid.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

<<Resist Composition for Negative Tone Development>>

The resist composition for negative tone development according to the present invention (hereafter also referred to as simply "the resist composition") contains a base component (A) that exhibits reduced solubility in an organic solvent under the action of acid (hereafter referred to as "component (A)"), an acid generator component (B) that generates acid upon exposure (hereafter referred to as "component (B)"), and a fluorine-containing polymeric compound (F) (hereafter referred to as "component (F)"), and is used as the resist composition in a method of forming a resist pattern that includes a step of forming a resist film on a substrate using the resist composition, a step of exposing the resist film, and a step of patterning the resist film by negative tone development using a developing solution containing the above organic solvent, thereby forming a resist pattern.

As the component (A), a resin component (A1) (hereafter referred to as "component (A1)") containing a structural unit (a1), which is derived from an acrylate ester in which the hydrogen atom bonded to the carbon atom on the α-position may be substituted with a substituent, and contains an acid-decomposable group that exhibits increased polarity under the action of acid is used.

In this resist composition, when irradiation (exposure) is performed, acid is generated from the component (B) within the exposed portions, and the action of that acid causes a reduction in the solubility of the component (A) in the organic solvent. As a result, during formation of a resist pattern, when a resist film obtained using the resist composition is subjected to selective exposure, the exposed portions of the resist film exhibit reduced solubility in an organic developing solution containing the organic solvent, whereas the solubility of the unexposed portions in the organic developing solution does not change, meaning subsequent negative tone development using the organic developing solution causes the unexposed portions to be removed, thus forming a resist pattern.

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern at the nano level can be easily formed.

The "organic compounds having a molecular weight of 500 or more" which can be used as a base component are broadly classified into non-polymers and polymers.

In general, compounds which have a molecular weight of at least 500 but less than 4,000 may be used as non-polymers. Hereafter, the term "low molecular weight compound" is used to describe a non-polymer having a molecular weight of at least 500 but less than 4,000.

In terms of the polymers, typically, compounds which have a molecular weight of 1,000 or more may be used. Hereafter, a polymer having a molecular weight of 1,000 or more is referred to as a polymeric compound. For these polymeric compounds, the "molecular weight" is the weight-average molecular weight in terms of the polystyrene-equivalent value determined by gel permeation chromatography (GPC). Hereafter, a polymeric compound is frequently referred to simply as a "resin".

[Component (A1)]

In the present invention, the component (A) contains a resin component (A1) containing a structural unit (a1), which is derived from an acrylate ester in which the hydrogen atom bonded to the carbon atom on the α-position may be substituted with a substituent, and contains an acid-decomposable group that exhibits increased polarity under the action of acid.

In the present invention, the dissolution rate of the resin component (A1) in the developing solution containing the organic solvent is at least 10 nm/s, and is preferably within a range from 10 to 200 nm/s, more preferably from 10 to 180 nm/s, and still more preferably 10 to 100 nm/s.

By ensuring that the dissolution rate of the component (A1) in the developing solution is at least 10 nm/s, the unexposed portions of the resist film dissolve readily in the developing solution, resulting in more favorable lithography properties such as CDU.

Furthermore, the absolute value of the difference in the dissolution rates of the resin component (A1) and the fluorine-containing polymeric compound (F) described below in the developing solution containing the organic solvent is not more than 80 nm/s, and is preferably within a range from 0 to 70 nm/s, more preferably from 0 to 65 nm/s, still more preferably from 0 to 60 nm/s, still more preferably from 0 to 30 nm/s, and most preferably from 0 to 10 nm/s. The component (A1) and the component (F) may both exhibit large dissolution rates in the organic solvent.

By ensuring that the absolute value of the difference in the dissolution rates of the resin component (A1) and the component (F) in the developing solution is not more than 80 nm/s, the resin that constitutes the unexposed portions of the resist film can be dissolved uniformly in the developing solution, enabling the formation of a resist pattern having excellent lithography properties.

There are no particular limitations on the method used for measuring the dissolution rate in the developing solution, and typical methods may be used. In one specific example of a method that may be used, the resin that is to be measured (the component (A1) or the component (F)) is dissolved in a suitable solvent, the resulting solution is applied uniformly to a substrate such as a silicon substrate using a spinner or the like, and a prebake (PAB) treatment is then performed at a temperature of 80 to 150° C. for a period of 40 to 120 seconds, and preferably 60 to 90 seconds, to form a resist film. The resist film is then dipped in the organic developing solution for a period of approximately 10 to 90 seconds, and the amount of thickness loss is measured. The dissolution rate is then calculated from the formula: [amount of thickness loss (A)/dipping time (s)].

There are no particular limitations on the component (A1), provided it contains the structural unit (a1) and satisfies the above dissolution rate requirement.

In the present invention, the component (A1) preferably includes, in addition to the structural unit (a1), at least one structural unit (a2) selected from the group consisting of structural units derived from an acrylate ester in which the hydrogen atom bonded to the carbon atom on the α-position may be substituted with a substituent and containing an —$SO_2$-containing cyclic group, and structural units derived from an acrylate ester in which the hydrogen atom bonded to the carbon atom on the α-position may be substituted with a substituent and containing a lactone-containing cyclic group.

The component (A1) preferably also includes, either in addition to the aforementioned structural unit (a1), or in addition to a combination of the structural unit (a1) and the structural unit (a2), a structural unit (a3) derived from an acrylate ester in which the hydrogen atom bonded to the carbon atom on the α-position may be substituted with a substituent and containing a polar group-containing aliphatic hydrocarbon group.

(Structural Unit (a1))

The structural unit (a1) is a structural unit derived from an acrylate ester in which the hydrogen atom bonded to the carbon atom on the α-position may be substituted with a substituent, and containing an acid-decomposable group that exhibits increased polarity under the action of acid.

The term "acid-decomposable group" describes a group having acid decomposability which, under the action of an acid (acid generated from the component (B) upon exposure), undergoes cleavage of at least some of the bonds within the structure of the acid-decomposable group.

Examples of acid-decomposable groups which exhibit increased polarity under the action of acid include groups which are decomposed by the action of acid to form a polar group.

Examples of the polar group include a carboxyl group, a hydroxyl group, an amino group and a sulfo group (—$SO_3H$). Among these, a polar group containing —OH in the structure thereof (hereafter referred to as an "OH-containing polar group") is preferable, and a carboxyl group or a hydroxyl group is more preferable.

More specific examples of the acid-decomposable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of an acid (acid generated from the component (B) upon exposure), undergoes cleavage of at least the bond between the acid-dissociable group and the adjacent atom. It is necessary that the acid-dissociable group that constitutes the acid-decomposable group is a group which exhibits a lower polarity than the polar group generated by the dissociation of the acid-dissociable group. Thus, when the acid-dissociable group dissociates under the action of acid, a polar group exhibiting a higher polarity than that of the acid-dissociable group is generated, thereby increasing the polarity. As a result, the polarity of the entire component (A1) is increased. By increasing the polarity, the solubility in an alkali developing solution increases relatively in the case of an alkali developing process. On the other hand, in the case of a solvent developing process, the solubility in an organic developing solution containing an organic solvent decreases.

As the acid-dissociable group for the structural unit (a1), any of those groups which have been proposed as acid-dissociable groups for the base resins of chemically amplified resists may be used. Generally, groups that form either a cyclic or chain-like tertiary alkyl ester with the carboxyl group of the (meth)acrylic acid, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group. As a result, the polarity of the component (A1) is increased.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched, acid-dissociable groups and aliphatic cyclic group-containing acid-dissociable groups.

In the present description and claims, the term "aliphatic branched" refers to a branched structure having no aromaticity.

The structure of the "aliphatic branched acid-dissociable group" is not limited to groups constituted of only carbon atoms and hydrogen atoms (not limited to hydrocarbon groups), but is preferably a hydrocarbon group.

Further, the "hydrocarbon group" may be either saturated or unsaturated, but in most cases, is preferably saturated.

Examples of the aliphatic branched, acid-dissociable group include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" excluding substituents is not limited to structures constituted of only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of the aliphatic cyclic group-containing acid-dissociable group include groups having a tertiary carbon atom on the ring structure of a cycloalkyl group. Specific examples include groups represented by any one of general formulas (1-1) to (1-9) shown below, such as a 2-methyl-2-adamantyl group and a 2-ethyl-2-adamantyl group.

Further, examples of the aliphatic branched acid-dissociable group include groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, such as the groups represented by general formulas (2-1) to (2-6) shown below.

[Chemical Formula 1]

(1-1)

(1-2)

(1-3)

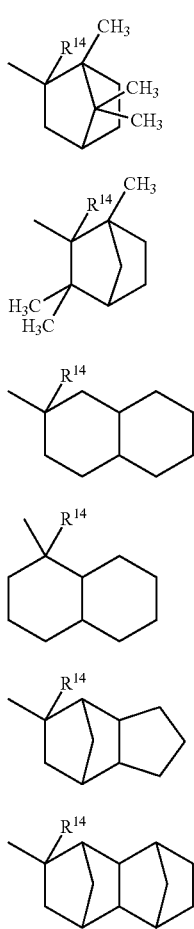

(1-4)
(1-5)
(1-6)
(1-7)
(1-8)
(1-9)

In the above formulas, R$^{14}$ represents an alkyl group, and g represents an integer of 0 to 8.

[Chemical Formula 2]

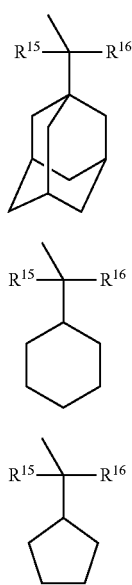

(2-1)
(2-2)
(2-3)

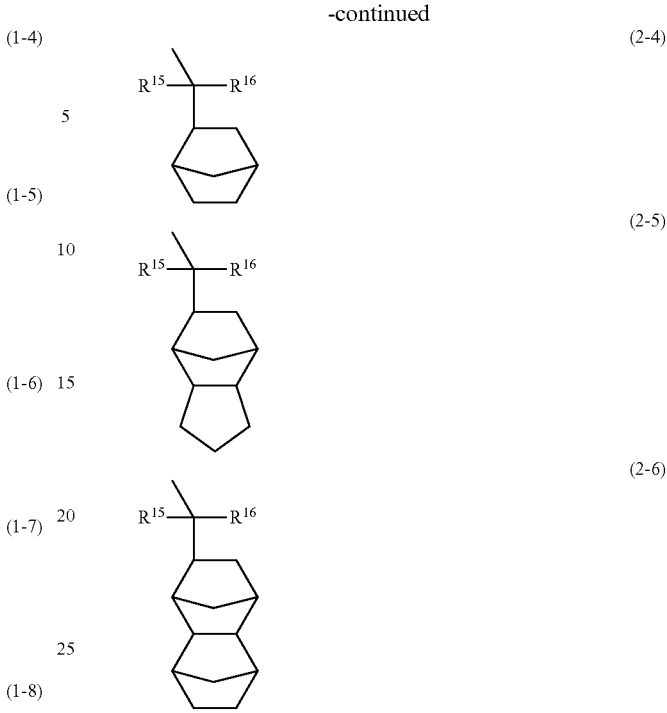

(2-4)
(2-5)
(2-6)

In the above formulas, each of R$^{15}$ and R$^{16}$ independently represents an alkyl group (which may be linear or branched, and preferably has 1 to 5 carbon atoms).

As the alkyl group for R$^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group or tert-butyl group is particularly desirable.

g is preferably an integer of 0 to 3, more preferably 1 to 3, and still more preferably 1 or 2.

As the alkyl group for R$^{15}$ and R$^{16}$, the same alkyl groups as those for R$^{14}$ can be used.

In the formulas (1-1) to (1-9) and (2-1) to (2-6), part of the carbon atoms that constitute the ring may be replaced with an ethereal oxygen atom (—O—).

Further, in the formulas (1-1) to (1-9) and (2-1) to (2-6), one or more of the hydrogen atoms bonded to the carbon atoms that constitute the ring may be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group. As a result, the polarity of the component (A1) is increased.

Examples of acetal-type acid-dissociable groups include groups represented by a general formula (p1) shown below.

[Chemical Formula 3]

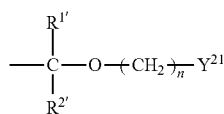

(p1)

In the formula, each of $R^{1'}$ and $R^{2'}$ independently represents a hydrogen atom or an alkyl group of 1 to 5 carbon atoms, n represents an integer of 0 to 3, and $Y^{21}$ represents an alkyl group of 1 to 5 carbon atoms or an aliphatic cyclic group.

In the general formula (p1) above, n is preferably an integer of 0 to 2, more preferably 0 or 1, and most preferably 0.

Examples of the alkyl group of 1 to 5 carbon atoms for $R^{1'}$ and $R^{2'}$ include the same alkyl groups of 1 to 5 carbon atoms as those described above for R, although a methyl group or ethyl group is preferable, and a methyl group is particularly desirable.

In the present invention, it is preferable that at least one of $R^{1'}$ and $R^{2'}$ is a hydrogen atom. That is, it is preferable that the acid-dissociable group (p1) is a group represented by a general formula (p1-1) shown below.

[Chemical Formula 4]

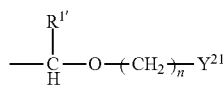

(p1-1)

In the formula, $R^{1'}$, n and $Y^{21}$ are the same as defined above.

Examples of the alkyl group of 1 to 5 carbon atoms for $Y^{21}$ include the same alkyl groups of 1 to 5 carbon atoms as those described above for R.

As the aliphatic cyclic group for $Y^{21}$, any of the aliphatic monocyclic or polycyclic groups which have been proposed for conventional ArF resists and the like can be appropriately selected for use. For example, the same groups described above in connection with the "aliphatic cyclic group" can be used.

Further, as the acetal-type, acid-dissociable group, groups represented by a general formula (p2) shown below can also be used.

[Chemical Formula 5]

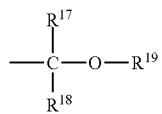

(p2)

In the formula, $R^{17}$ and $R^{18}$ each independently represent a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Examples of such groups include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In the formula (p2) above, $R^{17}$ and $R^{19}$ may each independently represent a linear or branched alkylene group (preferably an alkylene group of 1 to 5 carbon atoms), wherein the terminal of $R^{19}$ is bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one structural unit selected from the group consisting of structural units represented by a formula (a1-0-1) shown below and structural units represented by a formula (a1-0-2) shown below.

[Chemical Formula 6]

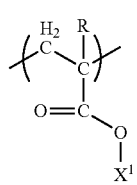

(a1-0-1)

In the formula, R represents a hydrogen atom, an alkyl group of 1 to 5 carbon atoms or a halogenated alkyl group of 1 to 5 carbon atoms, and $X^1$ represents an acid-dissociable group.

[Chemical Formula 7]

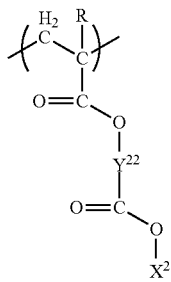

(a1-0-2)

In the formula, R represents a hydrogen atom, an alkyl group of 1 to 5 carbon atoms or a halogenated alkyl group of 1 to 5 carbon atoms, $X^2$ represents an acid-dissociable group, and $Y^{22}$ represents a divalent linking group.

In the general formula (a1-0-1), the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be used as the substituent bonded to the carbon atom on the α-position of the aforementioned acrylate ester.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In the general formula (a1-0-2), R is the same as defined above.

$X^2$ is the same as defined for $X^1$ in the formula (a1-0-1).

Preferred examples of the divalent linking group for $Y^{22}$ include divalent hydrocarbon groups which may have a substituent, and divalent linking groups containing a hetero atom.

The description that the hydrocarbon group "may have a substituent" means that part or all of the hydrogen atoms within the hydrocarbon group may each be substituted with a substituent (an atom other than a hydrogen atom or a group).

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

Specific examples of the aliphatic hydrocarbon group for the hydrocarbon group of $Y^{22}$ include linear or branched aliphatic hydrocarbon groups, and aliphatic hydrocarbon groups having a ring in the structure thereof.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable. Specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the hydrocarbon group containing a ring in the structure thereof include cyclic aliphatic hydrocarbon groups (groups in which two hydrogen atoms have been removed from an aliphatic hydrocarbon ring), and groups in which a cyclic aliphatic hydrocarbon group is bonded to the terminal of an aforementioned chain-like aliphatic hydrocarbon group or interposed within an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aforementioned aromatic hydrocarbon group for the hydrocarbon group of $Y^{22}$ include divalent aromatic hydrocarbon groups in which one hydrogen atom has been removed from a benzene ring of a monovalent aromatic hydrocarbon group such as a phenyl group, biphenylyl group, fluorenyl group, naphthyl group, anthryl group or phenanthryl group; aromatic hydrocarbon groups in which part of the carbon atoms that constitute the ring of an aforementioned divalent aromatic hydrocarbon group have been substituted with a hetero atom such as an oxygen atom, a sulfur atom or a nitrogen atom; and aromatic hydrocarbon groups in which one hydrogen atom has been removed from a benzene ring of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

When $Y^{22}$ represents a divalent linking group containing a hetero atom, examples thereof include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, -A-O—B— (wherein O is an oxygen atom, and each of A and B independently represents a divalent hydrocarbon group which may have a substituent), and combinations of a divalent hydrocarbon group which may have a substituent with a divalent linking group containing a hetero atom. Examples of the divalent hydrocarbon group which may have a substituent include the same groups as those described above for the hydrocarbon group which may have a substituent, and a linear or branched aliphatic hydrocarbon group or an aliphatic hydrocarbon group containing a ring in the structure thereof is preferable.

When $Y^{22}$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^{22}$ is -A-O—B—, each of A and B independently represents a divalent hydrocarbon group which may have a substituent.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

Specific examples of the aliphatic hydrocarbon group for A include linear or branched aliphatic hydrocarbon groups, and aliphatic hydrocarbon groups having a ring in the structure thereof. These groups are the same as defined above.

Among these groups, A is preferably a linear aliphatic hydrocarbon group, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

B is preferably a linear or branched aliphatic hydrocarbon group, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 8]

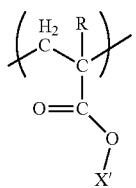
(a1-1)

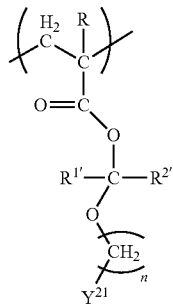
(a1-2)

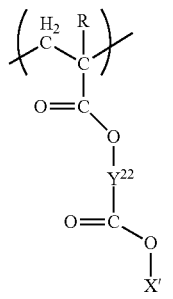
(a1-3)

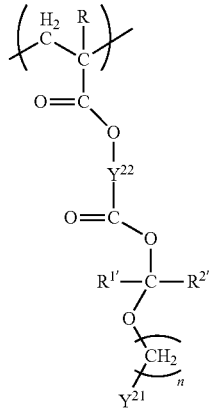
(a1-4)

In the formulas, X' represents a tertiary alkyl ester-type acid-dissociable group, $Y^{21}$ represents an alkyl group of 1 to 5 carbon atoms or an aliphatic cyclic group, n represents an integer of 0 to 3, $Y^{22}$ represents a divalent linking group, R is the same as defined above, and each of $R^{1\prime}$ and $R^{2\prime}$ independently represents a hydrogen atom or an alkyl group of 1 to 5 carbon atoms.

In the above formulas, examples of the tertiary alkyl ester-type acid-dissociable group for X' include the same tertiary alkyl ester-type acid-dissociable groups as those described above for $X^1$.

$R^{1\prime}$, $R^{2\prime}$, n and $Y^{21}$ are respectively the same as defined for $R^{1\prime}$, $R^{2\prime}$, n and $Y^{21}$ in the general formula (p1) described above in connection with the "acetal-type acid-dissociable group".

Examples of $Y^{22}$ include the same groups as those described above for $Y^{22}$ in the general formula (a1-0-2).

Specific examples of structural units represented by the above general formulas (a1-1) to (a1-4) are shown below.

In the formulas shown below, $R^{\alpha}$ represents a hydrogen atom, a methyl group or a trifluoromethyl group.

[Chemical Formula 9]
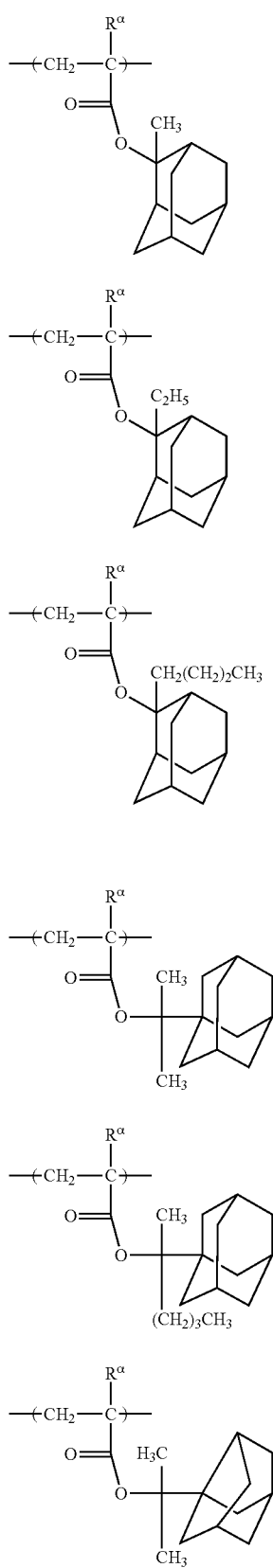
[Chemical Formula 10]
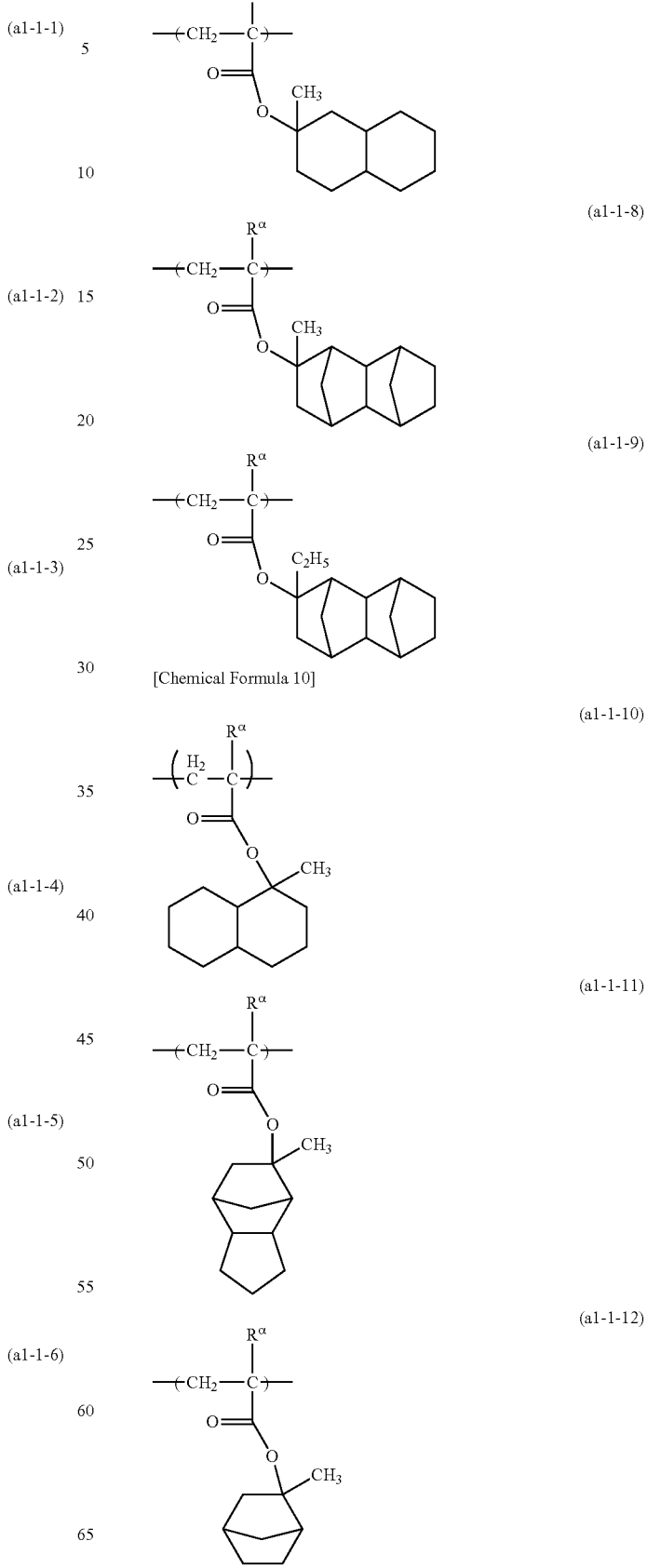

(a1-1-13)
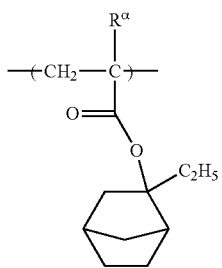
(a1-1-14)
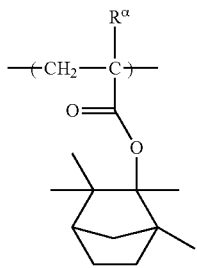
(a1-1-15)
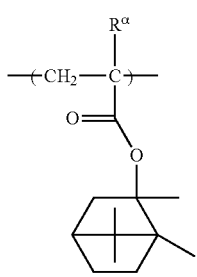
(a1-1-16)
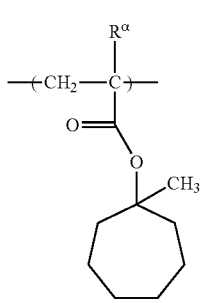
(a1-1-17)
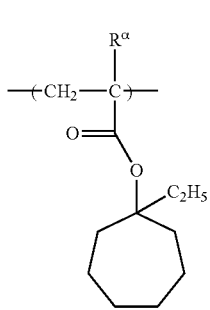
(a1-1-18)
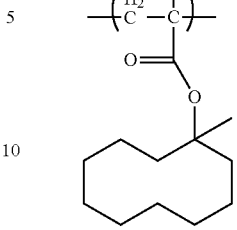
(a1-1-19)
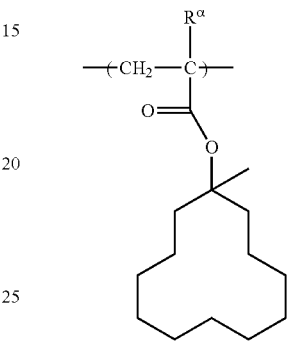
(a1-1-20)
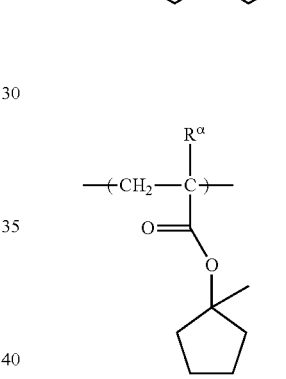
(a1-1-21)
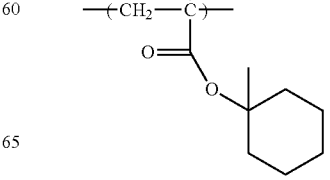
[Chemical Formula 11]
(a1-1-22)

(a1-1-23)
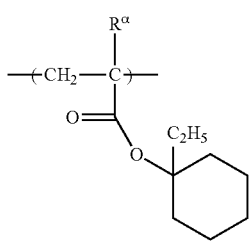
(a1-1-24)
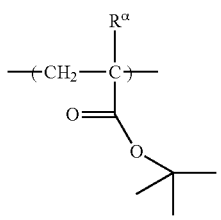
(a1-1-25)
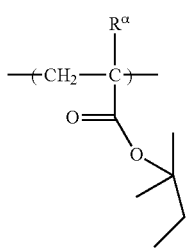
(a1-1-26)
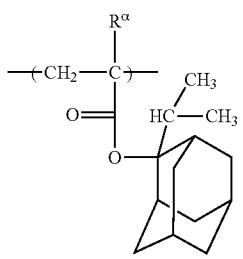
(a1-1-27)
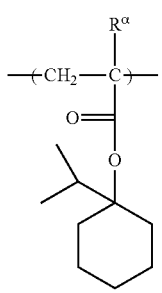
(a1-1-28)
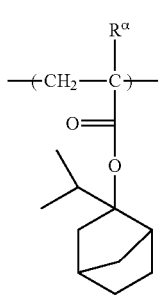
(a1-1-29)
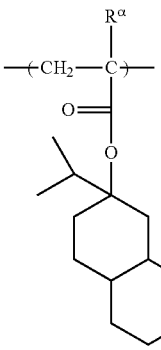
(a1-1-30)
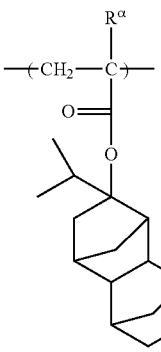
(a1-1-31)
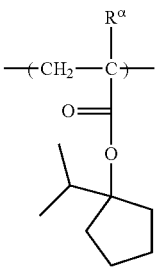
(a1-1-32)
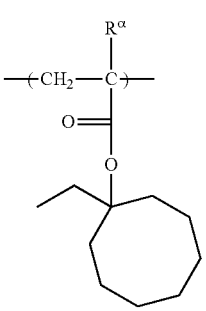

[Chemical Formula 12]
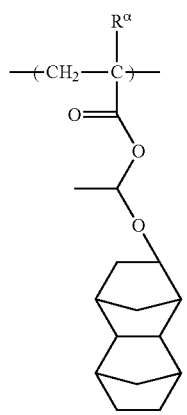 (a1-2-1)
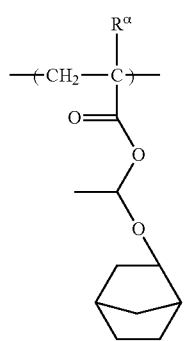 (a1-2-2)
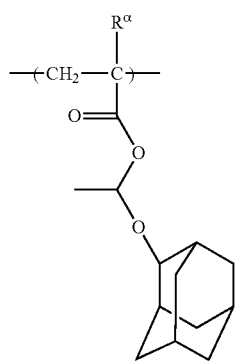 (a1-2-3)
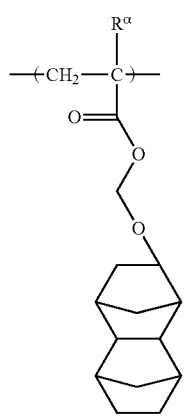 (a1-2-4)
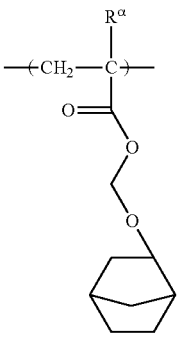 (a1-2-5)
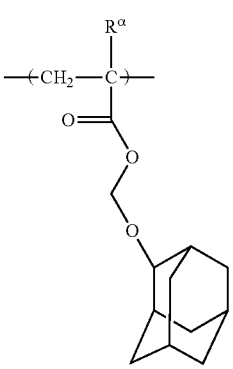 (a1-2-6)
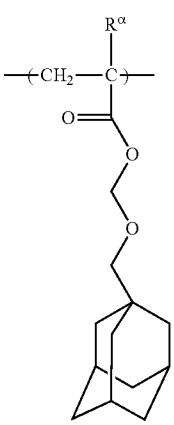 (a1-2-7)
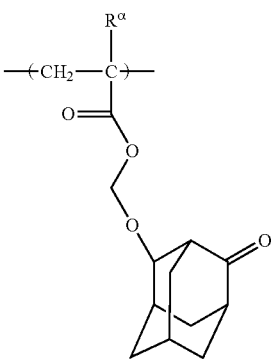 (a1-2-8)

(a1-2-9) 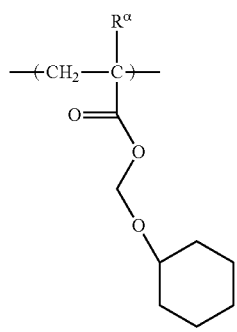
(a1-2-10) 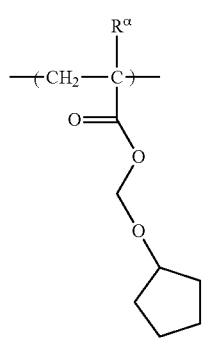
(a1-2-11) 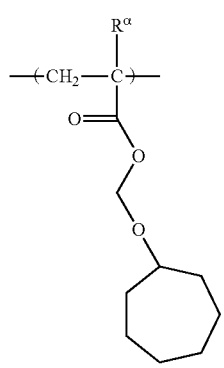
(a1-2-12) 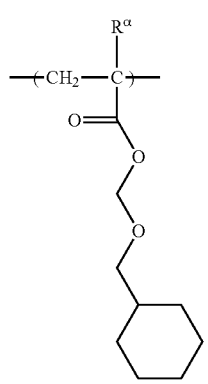
(a1-2-13) 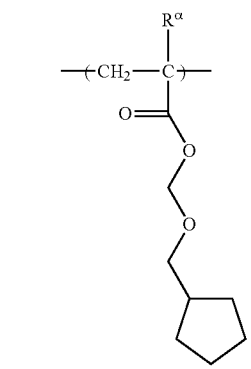
(a1-2-14) 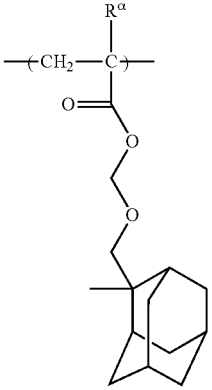
(a1-2-15) 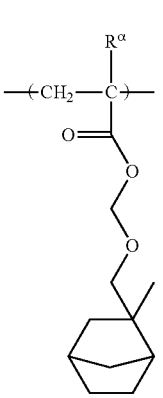
(a1-2-16) 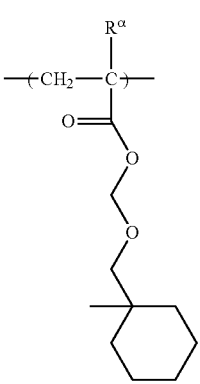

(a1-2-17)
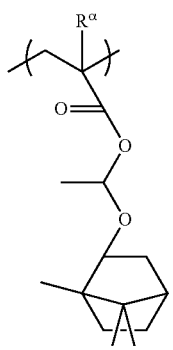
(a1-2-18)
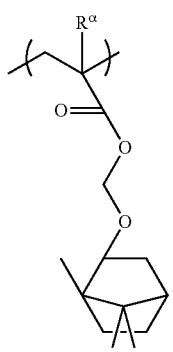
(a1-2-19)
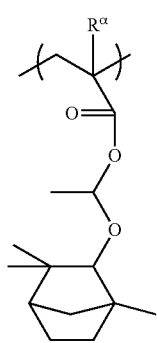
(a1-2-20)
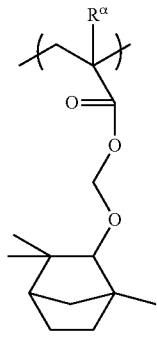
(a1-2-21)
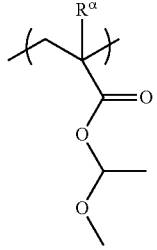
(a1-2-22)
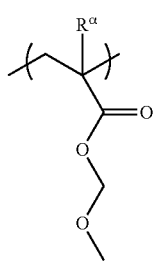
(a1-2-23)
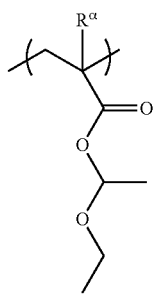
(a1-2-24)
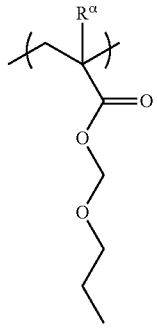
[Chemical Formula 13]
(a1-3-1)
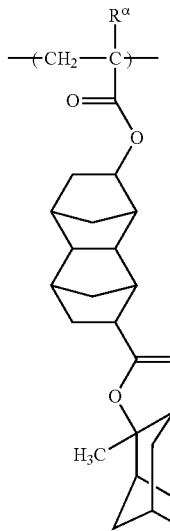

(a1-3-2)
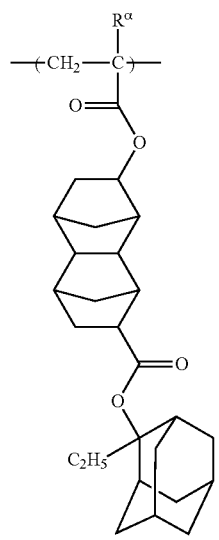
(a1-3-3)
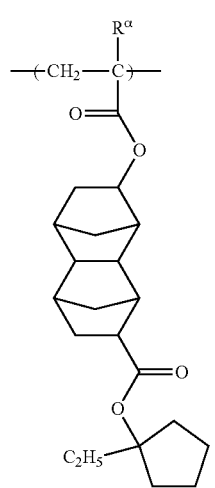
(a1-3-5)
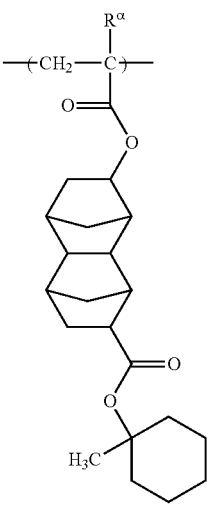
(a1-3-6)
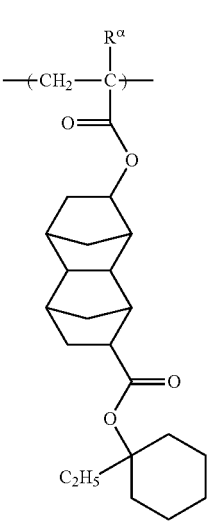
(a1-3-7)
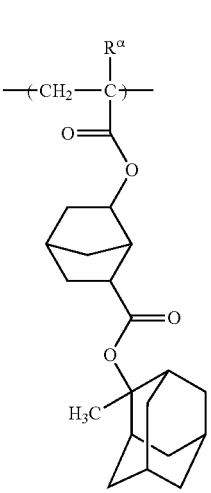

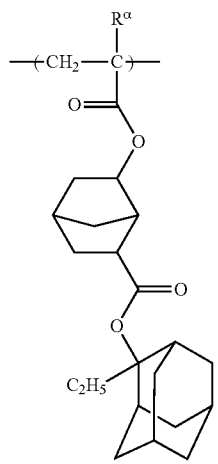
(a1-3-8)
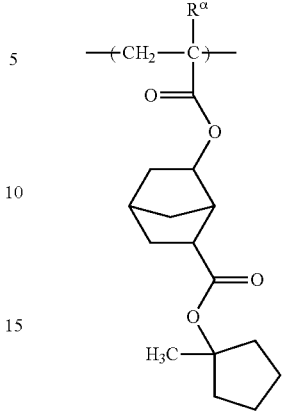
(a1-3-11)
(a1-3-9)
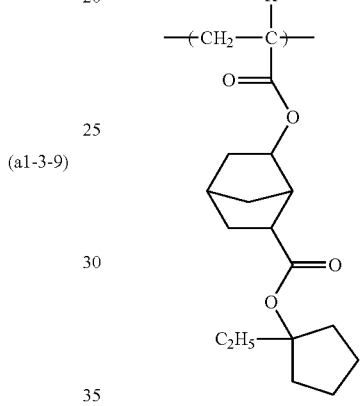
(a1-3-12)
(a1-3-10)
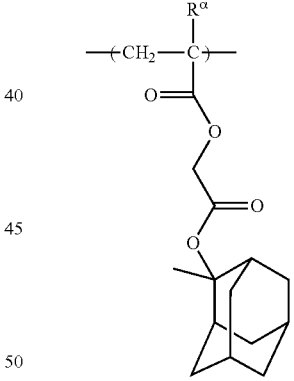
(a1-3-13)
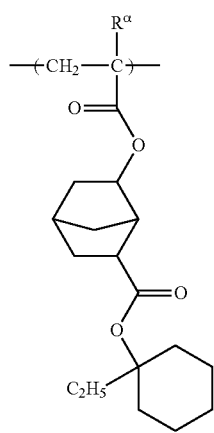
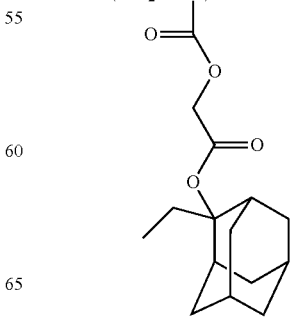
(a1-3-14)

(a1-3-15) 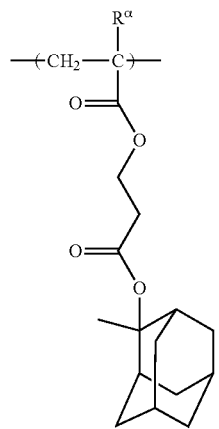
(a1-3-16) 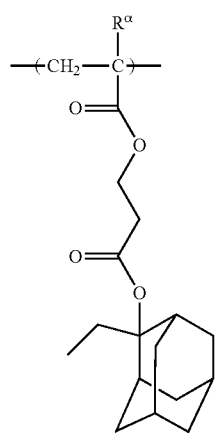
(a1-3-17) 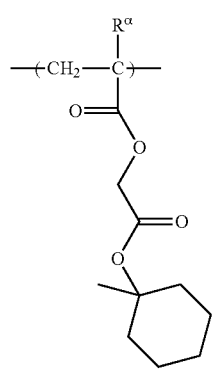
(a1-3-18) 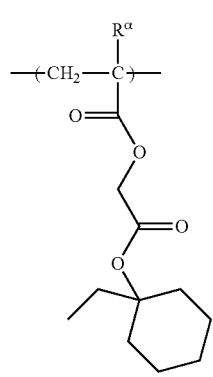
[Chemical Formula 14]
(a1-3-19) 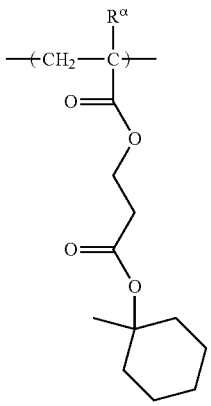
(a1-3-20) 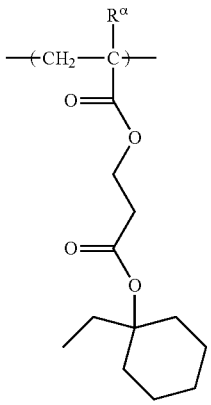
(a1-3-21) 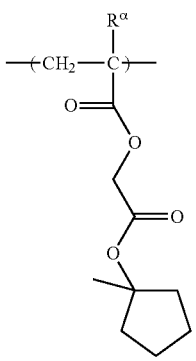
(a1-3-22) 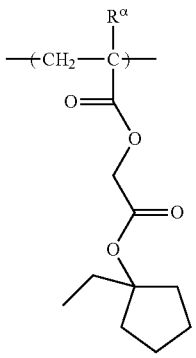

(a1-3-23)
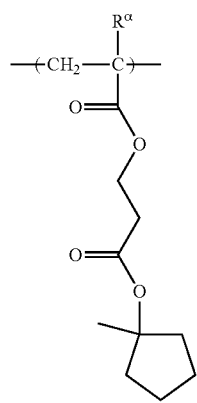
(a1-3-26)
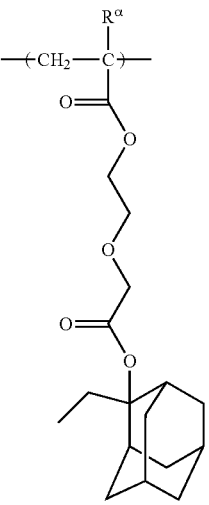
(a1-3-24)
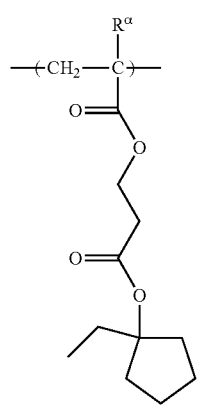
(a1-3-27)
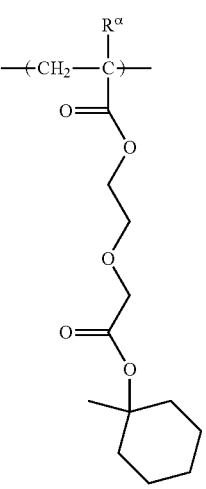
[Chemical formula 15]
(a1-3-25)
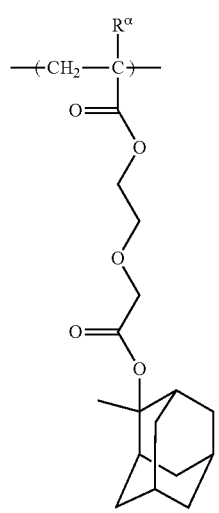
(a1-3-28)

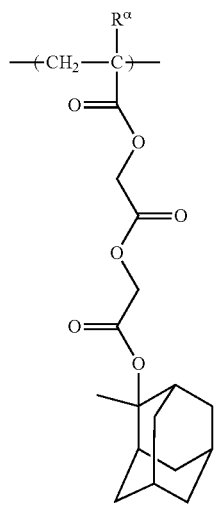 (a1-3-29)
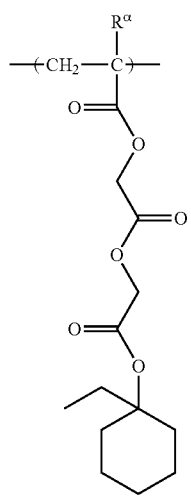 (a1-3-30)
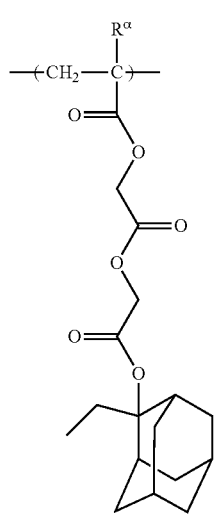 (a1-3-31)
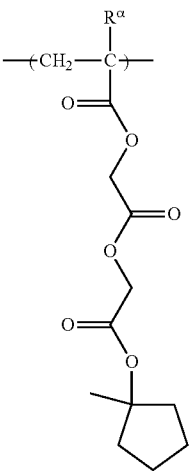 (a1-3-32)
[Chemical Formula 16]
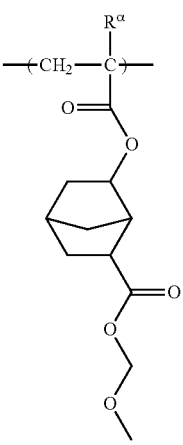 (a1-4-1)
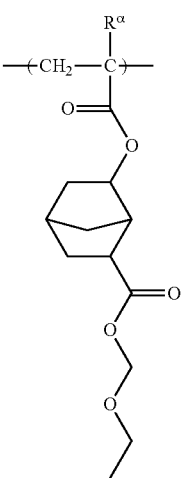 (a1-4-2)

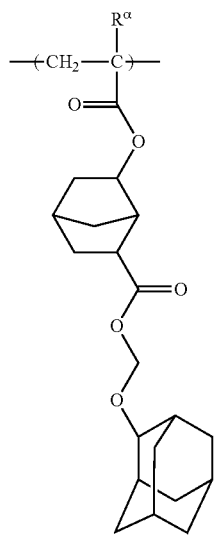 (a1-4-3)
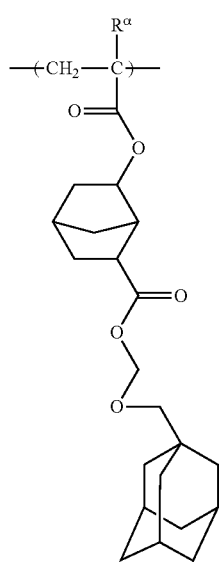 (a1-4-4)
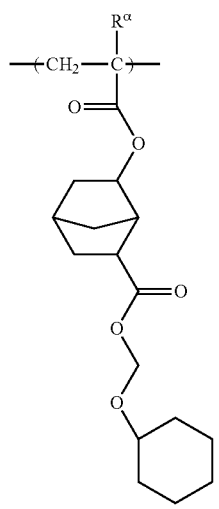 (a1-4-5)
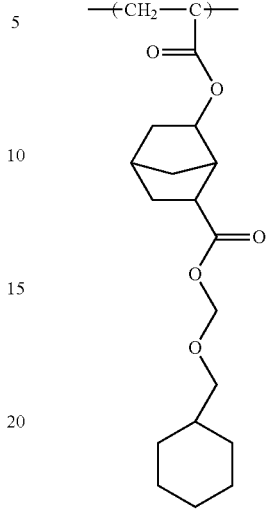 (a1-4-6)
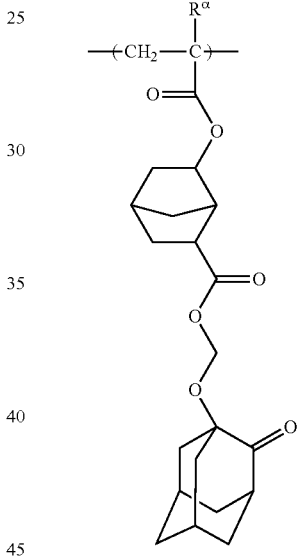 (a1-4-7)
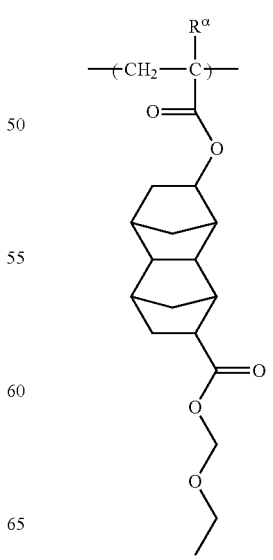 (a1-4-8)

(a1-4-9)
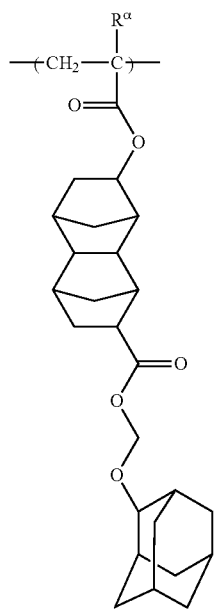
(a1-4-11)
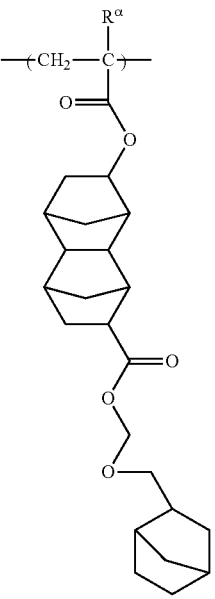
(a1-4-10)
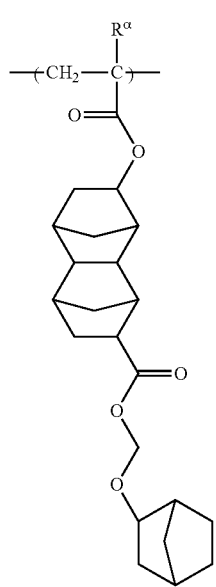
(a1-4-12)
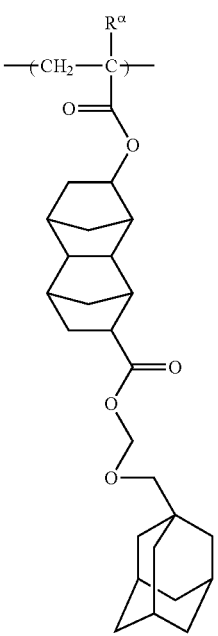

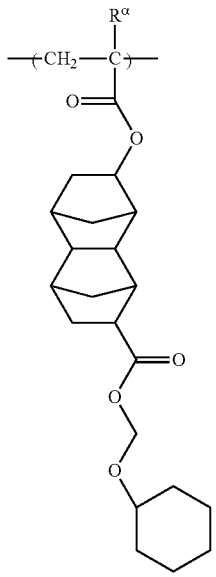

(a1-4-13)

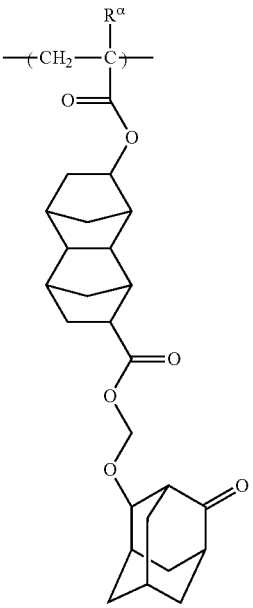

(a1-4-15)

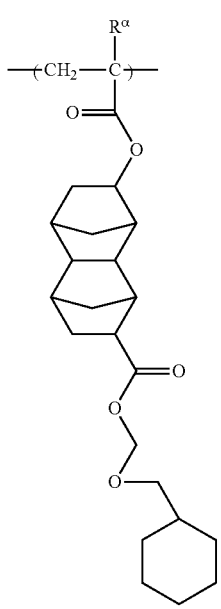

(a1-4-14)

As the structural unit (a1), structural units represented by the general formula (a1-1), (a1-2) and (a1-3) are preferable. More specifically, the use of at least one structural unit selected from the group consisting of structural units represented by the formulas (a1-1-1) to (a-1-1-4), (a1-1-20) to (a1-1-23), (a1-2-1) to (a1-2-24) and (a1-3-25) to (a1-3-28) is particularly desirable.

Further, as the structural unit (a1), structural units represented by a general formula (a1-1-01) shown below, which includes the structural units represented by the formulas (a1-1-1) to (a1-1-3) and (a1-1-26), structural units represented by a general formula (a1-1-02) shown below, which includes the structural units represented by the formulas (a1-1-16), (a1-1-17), (a1-1-20) to (a1-1-23) and (a1-1-32), structural units represented by a general formula (a1-1-03) shown below, which includes the structural units represented by the formulas (a1-2-3) and (a1-2-6), structural units represented by a general formula (a1-3-01) shown below, which include the structural units represented by the formulas (a1-3-25) and (a1-3-26), structural units represented by a general formula (a1-3-02) shown below, which include the structural units represented by the formulas (a1-3-27) and (a1-3-28), and structural units represented by a general formula (a1-3-03) shown below, which includes the structural units represented by the formulas (a1-3-29) and (a1-3-30) are also preferable.

[Chemical Formula 17]

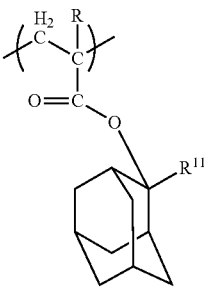

(a1-1-01)

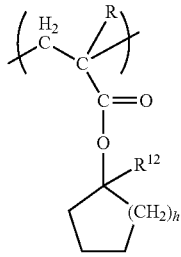
(a1-1-02)

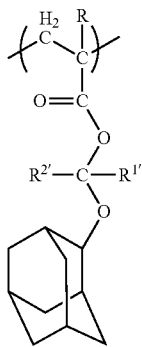
(a1-1-03)

In the formulas, each R independently represents a hydrogen atom, an alkyl group of 1 to 5 carbon atoms or a halogenated alkyl group of 1 to 5 carbon atoms, $R^{11}$ represents an alkyl group of 1 to 5 carbon atoms, $R^{12}$ represents an alkyl group of 1 to 7 carbon atoms, each of $R^{15'}$ and $R^{16'}$ independently represents an alkyl group of 1 to 5 carbon atoms, $R^C$ represents an aliphatic cyclic group, and h represents an integer of 1 to 6.

In the general formula (a1-1-01), R is the same as defined above. The alkyl group of 1 to 5 carbon atoms for $R^{11}$ is the same as defined above for the alkyl group of 1 to 5 carbon atoms for R, and a methyl group, ethyl group or isopropyl group is preferable.

In the general formula (a1-1-02), R is the same as defined above. The alkyl group of 1 to 5 carbon atoms for $R^{12}$ is the same as defined above for the alkyl group of 1 to 5 carbon atoms for R, and a methyl group, ethyl group or isopropyl group is preferable. h is preferably 1 or 2, and is most preferably 2.

In the general formula (a1-1-03), R, $R^{1'}$ and $R^{2'}$ are each the same as defined above.

[Chemical Formula 18]

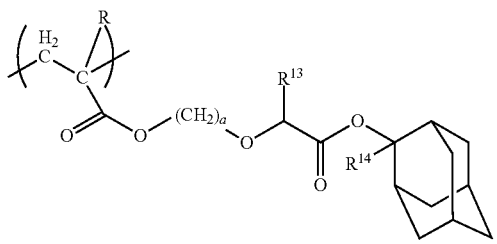
(a1-3-01)

In the formula, R represents a hydrogen atom, an alkyl group of 1 to 5 carbon atoms or a halogenated alkyl group of 1 to 5 carbon atoms, $R^{14}$ is the same as defined above, $R^{13}$ represents a hydrogen atom or a methyl group, and a represents an integer of 1 to 10.

[Chemical Formula 19]

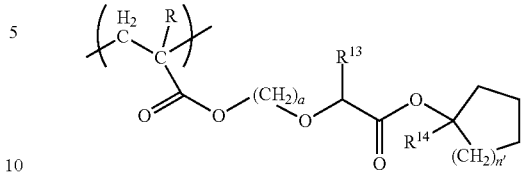
(a1-3-02)

In the formula, R represents a hydrogen atom, an alkyl group of 1 to 5 carbon atoms or a halogenated alkyl group of 1 to 5 carbon atoms, $R^{14}$ is the same as defined above, $R^{13}$ represents a hydrogen atom or a methyl group, a represents an integer of 1 to 10, and n' represents an integer of 1 to 6.

[Chemical Formula 20]

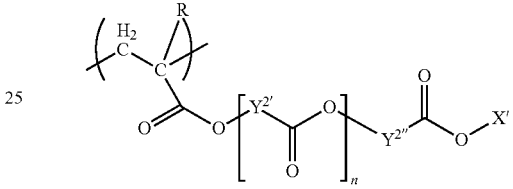
(a1-3-03)

In the formula, R is the same as defined above, each of $Y^{2'}$ and $Y^{2''}$ independently represents a divalent linking group, X' represents an acid-dissociable group, and n represents an integer of 0 to 3.

In the general formulas (a1-3-01) to (a1-3-03), R is the same as defined above.

$R^{13}$ is preferably a hydrogen atom.

n' is preferably 1 or 2, and most preferably 2.

a is preferably an integer of 1 to 8, more preferably an integer of 2 to 5, and most preferably 2.

Examples of the divalent linking group for $Y^{2'}$ and $Y^{2''}$ include the same groups as those described above for $Y^{22}$ in the general formula (a1-3).

$Y^{2'}$ is preferably a divalent hydrocarbon group which may have a substituent, more preferably a linear aliphatic hydrocarbon group, and still more preferably a linear alkylene group. Among linear alkylene groups, a linear alkylene group of 1 to 5 carbon atoms is preferable, and a methylene group or an ethylene group is particularly desirable.

$Y^{2''}$ is preferably a divalent hydrocarbon group which may have a substituent, more preferably a linear aliphatic hydrocarbon group, and still more preferably a linear alkylene group. Among linear alkylene groups, a linear alkylene group of 1 to 5 carbon atoms is preferable, and a methylene group or an ethylene group is particularly desirable.

Examples of the acid-dissociable group for X' include the same groups as those described above. X is preferably a tertiary alkyl ester-type acid-dissociable group, and more preferably an aforementioned group having a tertiary carbon atom on the ring structure of a cyclic alkyl group. Among these groups, groups represented by the above general formulas (1-1) to (1-9) are preferable.

n represents an integer of 0 to 3, preferably an integer of 0 to 2, more preferably 0 or 1, and most preferably 1.

Furthermore, as the structural unit (a1), a structural unit (a1-5) represented by a general formula (a1-5) shown below is also preferable.

[Chemical Formula 21]

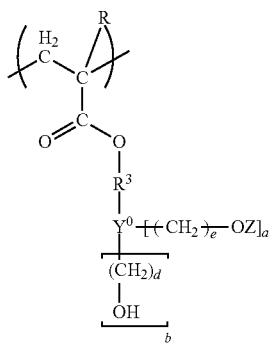

(a1-5)

In the formula, R represents a hydrogen atom, an alkyl group of 1 to 5 carbon atoms or a halogenated alkyl group of 1 to 5 carbon atoms, $R^3$ represents a single bond or a divalent linking group, $Y^0$ represents an aliphatic hydrocarbon group which may have a substituent, OZ represents an acid-decomposable group, a represents an integer of 1 to 3 and b represents an integer of 0 to 2, provided that a+b=1 to 3, and each of d and e independently represents an integer of 0 to 3.

In the formula (a1-5), R is the same as defined above. R is preferably a hydrogen atom or a methyl group.

In the formula (a1-5), $R^3$ represents a single bond or a divalent linking group. Examples of the divalent linking group for $R^3$ include the same divalent linking groups as those described above for $Y^{22}$ in the aforementioned formula (a1-0-2).

In the formula (a1-5), $Y^0$ represents an aliphatic hydrocarbon group, and is the same as the aliphatic hydrocarbon group for $Y^{22}$ in the aforementioned formula (a1-0-2). Among these, an aliphatic cyclic group is preferable. The term "aliphatic cyclic group" refers to a monocyclic group or polycyclic group that has no aromaticity.

The "aliphatic cyclic group" within the structural unit (a1-5) may or may not have a substituent. Examples of the substituent include an alkyl group of 1 to 5 carbon atoms, a fluorine atom, a fluorinated alkyl group of 1 to 5 carbon atoms, and an oxygen atom (=O).

The basic ring of the "aliphatic cyclic group" excluding substituents (namely, the aliphatic ring) is not limited to rings composed of only carbon and hydrogen (not limited to hydrocarbon rings), and the ring (aliphatic ring) may contain an oxygen atom within the structure. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane.

Further examples of the aliphatic cyclic group include groups in which two or more hydrogen atoms have been removed from a tetrahydrofuran or tetrahydropyran which may or may not be substituted with an alkyl group of 1 to 5 carbon atoms, a fluorine atom or a fluorinated alkyl group.

The aliphatic cyclic group within the structural unit (a1-5) is preferably a polycyclic group, and a group in which two or more hydrogen atoms have been removed from adamantane is particularly desirable.

In the above general formula (a1-5), OZ represents an acid-decomposable group.

The acid-decomposable group for OZ is preferably an acid-decomposable group that decomposes to form a hydroxyl group (—OH), and examples of such acid-decomposable groups include (1) groups in which a hydroxyl group is protected with an acetal-type acid-dissociable group for Z, and (2) groups in which Z includes a tertiary alkyl ester-type acid-dissociable group within the structure, and undergoes further decomposition via a decarboxylation reaction following acid dissociation.

In the aforementioned "(1) groups in which a hydroxyl group is protected with an acetal-type acid-dissociable group for Z", examples of the acetal-type acid-dissociable group for Z include the same groups as those described above. In such a group (1), Z is preferably a 1-n-butoxyethyl group (—CH(CH$_3$)—O—C$_4$H$_9$) or an n-butoxymethyl group (—CH$_2$—O—C$_4$H$_9$).

Here, the oxygen atom of OZ is an oxygen atom derived from a hydroxyl group that has been protected with the acetal-type acid-dissociable group. Under the action of acid, the bond between this oxygen atom and the acetal-type acid-dissociable group is cleaved, generating a polar hydroxyl group (—OH) at the terminal of the structural unit.

In the aforementioned "(2) groups in which Z includes a tertiary alkyl ester-type acid-dissociable group within the structure, and undergoes further decomposition via a decarboxylation reaction following acid dissociation", the tertiary alkyl ester-type acid-dissociable group is as described above, and upon dissociation of this tertiary alkyl ester-type acid-dissociable group and a subsequent generation of carbon dioxide, a polar hydroxyl group (—OH) is generated at the terminal of the structural unit.

The alkyl group in the tertiary alkyl ester-type acid-dissociable group for Z within OZ may be an alkyl group having no cyclic structure (namely, a chain-like group), or may be a group having a cyclic structure.

In the case of a chain-like group, examples of Z in OZ include tertiary alkyloxycarbonyl groups represented by a general formula (II) shown below.

In the formula (II), each of $R^{21}$ to $R^{23}$ independently represents a linear or branched alkyl group. The number of carbon atoms within the alkyl group is preferably from 1 to 5, and more preferably from 1 to 3.

Further, the group represented by —C($R^{21}$)($R^{22}$)($R^{23}$) in the general formula (II) preferably contains a total of 4 to 7 carbon atoms, more preferably 4 to 6 carbon atoms, and most preferably 4 to 5 carbon atoms.

Examples of the group represented by —C($R^{21}$)($R^{22}$)($R^{23}$) in the general formula (II) include a tert-butyl group and a tert-pentyl group, and a tert-butyl group is particularly desirable. In other words, in the case of a chain-like group, Z is preferably a tert-butyloxycarbonyl group (t-boc) or a tert-pentyloxycarbonyl group.

[Chemical Formula 22]

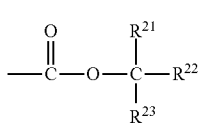
(II)

Further in those cases where the acid-decomposable group of OZ is (3) a group that decomposes but does not form a hydroxyl group (—OH) (but rather, for example, forms a carboxyl group), Z in OZ is preferably a tertiary alkyloxycarbonylalkyl group represented by a general formula (III) shown below.

In the general formula (III), $R^{21}$ to $R^{23}$ are the same as defined above for $R^{21}$ to $R^{23}$ in the general formula (II).

f represents an integer of 1 to 3, and is preferably 1 or 2.

As the chain-like tertiary alkyloxycarbonylalkyl group, a tert-butyloxycarbonylmethyl group or a tert-butyloxycarbonylethyl group is preferable.

Among the groups described above, the tertiary alkyl group-containing group having no cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

[Chemical Formula 23]

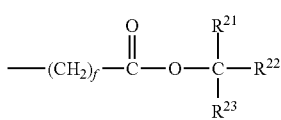
(III)

In those cases where Z is a tertiary alkyl ester-type acid-dissociable group having a cyclic structure within the group structure, examples of Z in OZ include groups in which a group represented by one of the aforementioned formulas (1-1) to (1-9) or (2-1) to (2-6) is bonded to the terminal oxygen atom of —C(═O)—O— or —(CH$_2$)$_f$—C(═O)— (wherein f is the same as defined above in the formula (III)).

Among the aforementioned examples, OZ is preferably a group of the type (1) or (2) described above that decomposes to generate a hydroxyl group (—OH), and Z is more preferably a group represented by the above general formula (II), and is most preferably a tert-butyloxycarbonyl group (t-boc) or a 1,1-dimethylpropoxycarbonyl group.

In the general formula (a1-5), a represents an integer of 1 to 3, and b represents an integer of 0 to 2, provided that a+b=1 to 3.

a is preferably 1 or 2, and more preferably 1.
b is preferably 0.
a+b is preferably 1 or 2, and more preferably 1.
d represents an integer of 0 to 3, preferably 0 or 1, and more preferably 0.
e represents an integer of 0 to 3, preferably 0 or 1, and more preferably 0.

When b is 1 or more, the structural unit (a1-5) falls under the definition of the structural unit (a3) described below. However, a structural unit represented by the formula (a1-5) is regarded as a structural unit (a1-5), and not as a structural unit (a3).

In particular, as the structural unit (a1-5), a structural unit represented by a general formula (a11-1-1), (a11-1-2) or (a11-2) shown below is preferable, and a structural unit represented by the formula (a11-1-1) is particularly desirable.

[Chemical Formula 24]

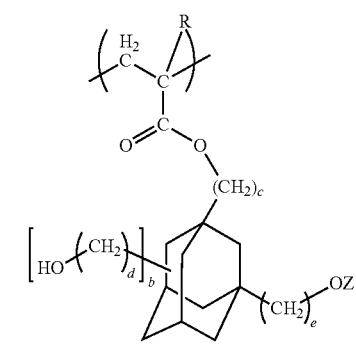
(a11-1-1)

In the formula, R, Z, b, c, d and e are each the same as defined above, and c represents an integer of 0 to 3.

[Chemical Formula 25]

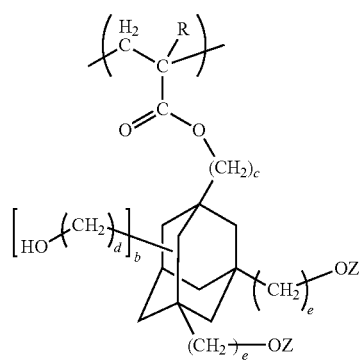
(a11-1-2)

In the formula, R, Z, b, c, d and e are each the same as defined above, and the pluralities of e and Z in the formula may each be the same or different from each other.

[Chemical Formula 26]

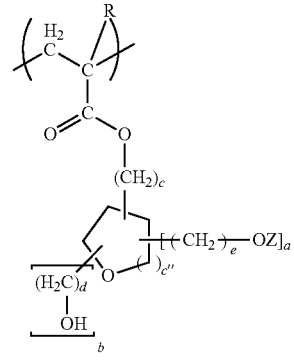
(a11-2)

In the formula, R, Z, a, b, c, d and e are each the same as defined above, and c" represents an integer of 1 to 3.

In the formula (a11-2), c" represents an integer of 1 to 3, preferably 1 or 2, and still more preferably 1.

When c represents 0 in the formula (a11-2), the oxygen atom at the terminal of the carbonyloxy group (—C(=O)—O—) within the acrylate ester is preferably not bonded to the carbon atom which is bonded to the oxygen atom within the cyclic group. That is, when c represents 0, it is preferable that there are at least two carbon atoms present between the terminal oxygen atom and the oxygen atom within the cyclic group (excluding the case where the number of such carbon atom is one (namely, the case where an acetal bond is formed)).

A monomer for deriving the structural unit (a1-5) can be synthesized, for example, by protecting part or all of the hydroxyl groups within a compound represented by a general formula (a11-0) shown below (namely, an acrylate ester containing an aliphatic cyclic group having 1 to 3 alcoholic hydroxyl groups) with alkoxyalkyl groups or the aforementioned Z groups using a conventional method.

[Chemical Formula 27]

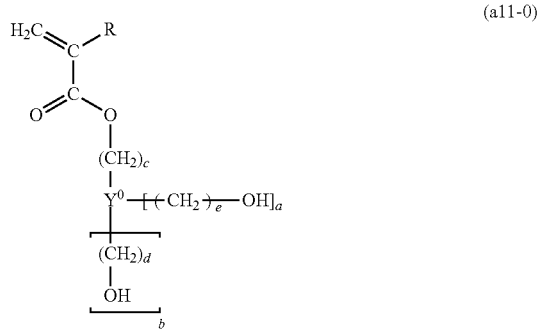

(a11-0)

In the formula, R, $Y^0$, a, b, c, d and e are each the same as defined above.

In the component (A1), the amount of the structural unit (a1), based on the combined total of all the structural units that constitute the component (A1), is preferably within a range from 5 to 90 mol %, more preferably from 10 to 85 mol %, and still more preferably from 15 to 80 mol %. When the amount of the structural unit (a1) is at least as large as the lower limit of the above range, a pattern can be formed easily using a resist composition prepared from the component (A1). On the other hand, when the amount of the structural unit (a1) is not more than the upper limit of the above range, a good balance can be achieved with the other structural units.

(Structural Unit (a2))

The structural unit (a2) is at least one structural unit selected from the group consisting of structural units derived from an acrylate ester in which the hydrogen atom bonded to the carbon atom on the α-position may be substituted with a substituent and containing an —$SO_2$-containing cyclic group (hereafter referred to as "structural unit ($a2^S$)"), and structural units derived from an acrylate ester in which the hydrogen atom bonded to the carbon atom on the α-position may be substituted with a substituent and containing a lactone-containing cyclic group (hereafter referred to as "structural unit ($a2^L$)").

By incorporating an —$SO_2$-containing cyclic group or a lactone-containing cyclic group, the structural unit (a2) contributes to improvements in the lithography properties, including improving the adhesion between the substrate and a resist film formed using a resist composition containing the component (A1), and increasing the compatibility with developing solutions containing water (particularly in the case of an alkali developing process).

Structural Unit ($a2^S$):

The structural unit ($a2^S$) is a structural unit derived from an acrylate ester in which the hydrogen atom bonded to the carbon atom on the α-position may be substituted with a substituent and containing an —$SO_2$-containing cyclic group.

Here, the term "—$SO_2$-containing cyclic group" refers to a cyclic group which includes a ring containing an —$SO_2$— moiety within the ring structure, and specifically refers to cyclic groups in which the sulfur atom (S) of the —$SO_2$— forms a part of the ring structure of the cyclic group. The ring containing the —$SO_2$— moiety within the ring structure is counted as the first ring. A cyclic group in which the only ring structure is the ring that contains —$SO_2$— in the ring structure is referred to as a monocyclic group, and a group containing other ring structures is described as a polycyclic group regardless of the structure of the other rings. The —$SO_2$-containing cyclic group may be either a monocyclic group or a polycyclic group.

The —$SO_2$-containing cyclic group is preferably a cyclic group containing an —O—$SO_2$-moiety within the ring structure, namely a cyclic group containing a sultone ring in which the —O—S— within the —O—$SO_2$— forms a part of the ring structure.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$— moiety that constitutes part of the ring structure has been substituted with an —$SO_2$— moiety, and groups in which at least one hydrogen atom has been removed from an aliphatic hydrocarbon ring in which a —$CH_2$—$CH_2$— moiety that constitutes part of the ring structure has been substituted with an —O—$SO_2$— moiety.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, groups in which two hydrogen atoms have been removed from a monocycloalkane of 3 to 6 carbon atoms are preferable, and specific examples of such monocycloalkanes include cyclopentane and cyclohexane. As the polycyclic alicyclic hydrocarbon group, groups in which two hydrogen atoms have been removed from a polycycloalkane of 7 to 12 carbon atoms are preferable, and specific examples of such polycycloalkanes include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. The alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear alkoxy group or a branched alkoxy group. Specific examples include groups in which an oxygen atom (—O—) is bonded to any of the alkyl groups described above for the substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferred as the halogenated alkyl group, and a perfluoroalkyl group is particularly desirable.

In the aforementioned —COOR" group and —OC(=O)R" group, R" represents a hydrogen atom, or a linear, branched or cyclic alkyl group of 1 to 15 carbon atoms.

In those cases where R" represents a linear or branched alkyl group, the alkyl group preferably contains 1 to 10 carbon atoms, and more preferably 1 to 5 carbon atoms, and is most preferably a methyl group or ethyl group.

In those cases where R" is a cyclic alkyl group (cycloalkyl group), the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably contains 1 to 6 carbon atoms, and specific examples include groups in which at least one hydrogen atom within an aforementioned alkyl group substituent has been substituted with a hydroxyl group.

More specific examples of the —SO$_2$-containing cyclic group include groups represented by general formulas (3-1) to (3-4) shown below.

[Chemical Formula 28]

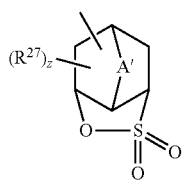

(3-1)

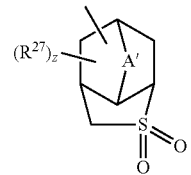

(3-2)

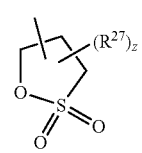

(3-3)

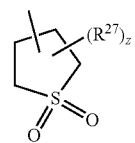

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and specific examples include a methylene group, ethylene group, n-propylene group and isopropylene group.

Examples of the alkylene groups which contain an oxygen atom or a sulfur atom include the aforementioned alkylene groups in which —O— or —S— is either bonded to the terminal of the alkylene group or interposed between the carbon atoms of the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different from each other.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above as the substituent for the —SO$_2$— containing cyclic group.

Specific examples of the cyclic groups represented by the general formulas (3-1) to (3-4) are shown below. In the formulas shown below, "Ac" represents an acetyl group.

[Chemical Formula 29]
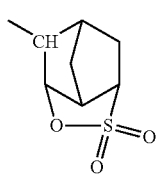 (3-1-1)
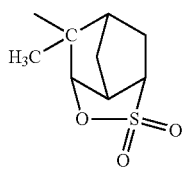 (3-1-2)
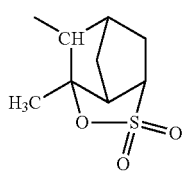 (3-1-3)
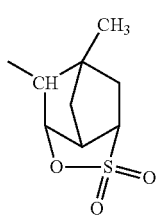 (3-1-4)
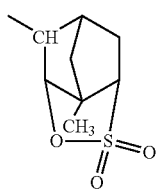 (3-1-5)
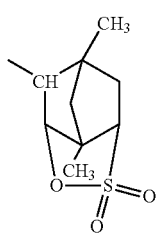 (3-1-6)
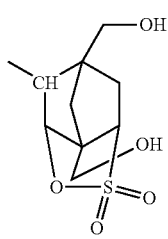 (3-1-7)
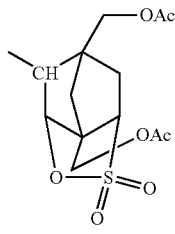 (3-1-8)
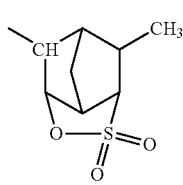 (3-1-9)
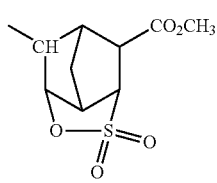 (3-1-10)
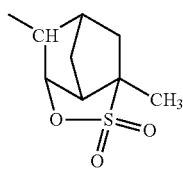 (3-1-11)
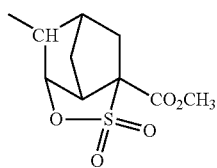 (3-1-12)
[Chemical Formula 30]
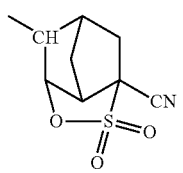 (3-1-13)
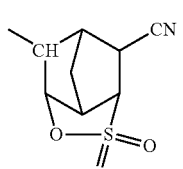 (3-1-14)
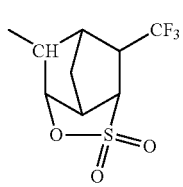 (3-1-15)

(3-1-16)
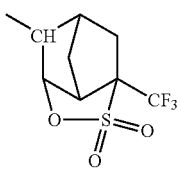
(3-1-17)
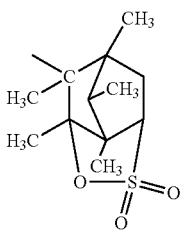
[Chemical Formula 31]
(3-1-18)
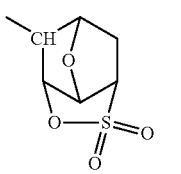
(3-1-19)
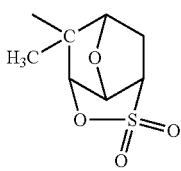
(3-1-20)
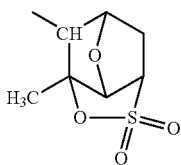
(3-1-21)
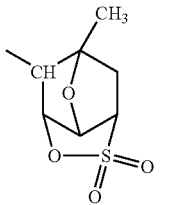
(3-1-22)
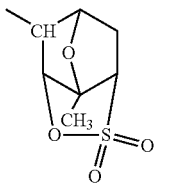
(3-1-23)
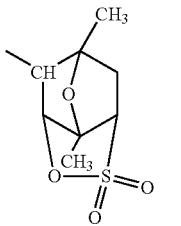
(3-1-24)
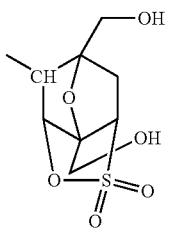
(3-1-25)
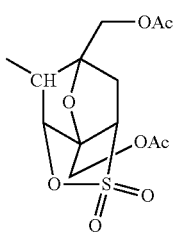
[Chemical Formula 32]
(3-1-26)
(3-1-27)
(3-1-28)
(3-1-29)
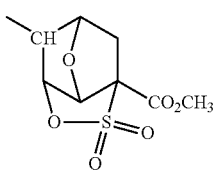
(3-1-30)
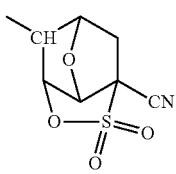
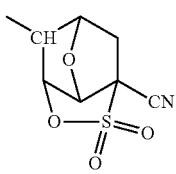

-continued (3-1-31)
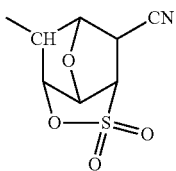

(3-1-32)
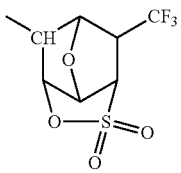

(3-1-33)
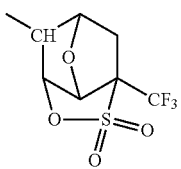

[Chemical Formula 33]

(3-2-1)
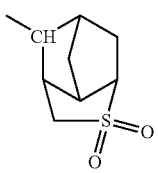

(3-2-2)
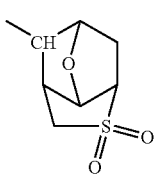

(3-3-1)
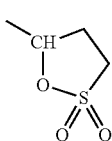

(3-4-1)
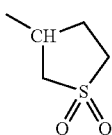

Of the groups shown above, the —SO$_2$-containing cyclic group is preferably a group represented by the general formula (3-1), (3-3) or (3-4), more preferably at least one group selected from the group consisting of groups represented by the above chemical formulas (3-1-1), (3-1-18), (3-3-1) and (3-4-1), and most preferably a group represented by the chemical formula (3-1-1).

More specific examples of the structural unit (a2$^S$) include structural units represented by a general formula (a2-0) shown below.

[Chemical Formula 34]

(a2-0)
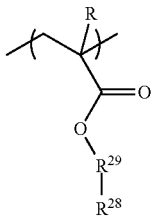

In the formula, R represents a hydrogen atom, an alkyl group of 1 to 5 carbon atoms or a halogenated alkyl group of 1 to 5 carbon atoms, $R^{28}$ represents an —SO$_2$-containing cyclic group, and $R^{29}$ represents a single bond or a divalent linking group.

In the formula (a2-0), R is the same as defined above.

$R^{28}$ is the same as defined above for the aforementioned —SO$_2$-containing group.

$R^{29}$ may be either a single bond or a divalent linking group. In terms of the effects of the present invention, a divalent linking group is preferable.

There are no particular limitations on the divalent linking group for $R^{29}$, and examples include the same divalent linking groups as those described above for $Y^{22}$ in the aforementioned formula (a1-0-2). Among these, an alkylene group or a divalent linking group containing an ester linkage (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^{22}$.

As the divalent linking group containing an ester linkage, a group represented by a general formula: —$R^{30}$—C(=O)—O— (wherein $R^{30}$ represents a divalent linking group) is particularly desirable. That is, the structural unit (a2$^S$) is preferably a structural unit represented by a general formula (a2-0-1) shown below.

[Chemical Formula 35]

(a2-0-1)
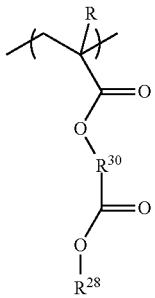

In the formula, R and $R^{28}$ are each the same as defined above, and $R^{30}$ represents a divalent linking group.

There are no particular limitations on $R^{30}$, and examples include the same divalent linking groups as those described above for $Y^{22}$ in the aforementioned formula (a1-0-2).

As the divalent linking group for $R^{30}$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, cyclic aliphatic hydrocarbon groups, and divalent linking groups containing a hetero atom as those described above for $Y^{22}$.

Among these, a linear or branched alkylene group, or a divalent linking group containing an oxygen atom as a hetero atom is preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing an oxygen atom, a divalent linking group containing an ether linkage or an ester linkage is preferable, and a group represented by the aforementioned formula -A-O—B—, or a formula -[A-C(=O)—O]$_m$—B— or -A-O—C(=O)—B— is more preferable.

Among these, a group represented by the formula -A-O—C(=O)—B— is preferable, and a group represented by the formula: —(CH$_2$)$_{c1}$—C(=O)—O—(CH$_2$)$_{d1}$— is particularly desirable. c1 represents an integer of 1 to 5, and is preferably 1 or 2. d1 represents an integer of 1 to 5, and is preferably 1 or 2.

As the structural unit (a2$^S$), a structural unit represented by a general formula (a0-1-11) or (a0-1-12) shown below is preferred, and a structural unit represented by the formula (a0-1-12) is particularly desirable.

[Chemical Formula 36]

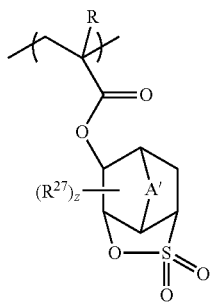
(a0-1-11)

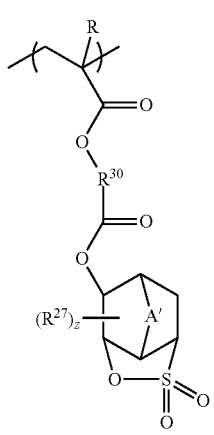
(a0-1-12)

In the formulas, R, A', $R^{27}$, z and $R^{30}$ are each the same as defined above.

In the formula (a0-1-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group and the divalent linking group containing an oxygen atom represented by $R^{30}$ include the same linear or branched alkylene groups and divalent linking groups containing an oxygen atom as those described above.

As the structural unit represented by the formula (a0-1-12), a structural unit represented by a general formula (a0-1-12a) or (a0-1-12b) shown below is particularly desirable.

[Chemical Formula 37]

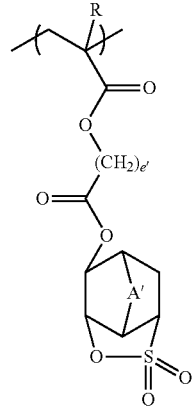
(a0-1-12a)

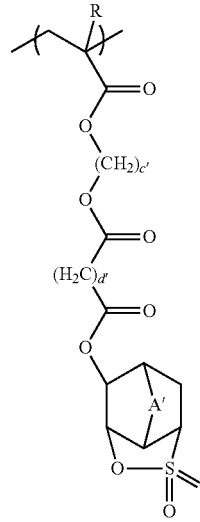
(a0-1-12b)

In the formulas, R and A' are each the same as defined above, and each of c' to e' independently represents an integer of 1 to 3.

Structural Unit (a2$^L$):

The structural unit (a2$^L$) is a structural unit derived from an acrylate ester in which the hydrogen atom bonded to the carbon atom on the α-position may be substituted with a substituent and containing a lactone-containing cyclic group.

In this description, the term "lactone-containing cyclic group" refers to a cyclic group including a ring (lactone ring) containing an —O—C(=O)— moiety. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

There are no particular limitations on the lactone-containing cyclic group for the structural unit (a2$^L$), and an arbitrary structural unit may be used. Specific examples of lactone-containing monocyclic groups include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2$^L$) include structural units represented by the aforementioned general formula (a2-0) in which the R$^{28}$ group has been substituted with a lactone-containing cyclic group. Specific examples include structural units represented by general formulas (a2-1) to (a2-5) shown below.

[Chemical Formula 38]

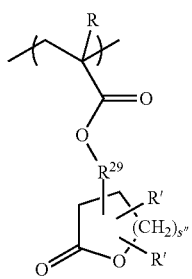
(a2-1)

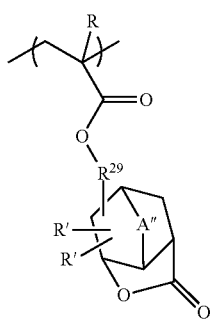
(a2-2)

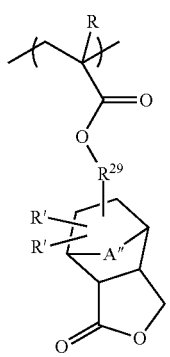
(a2-3)

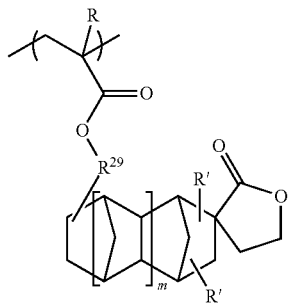
(a2-4)

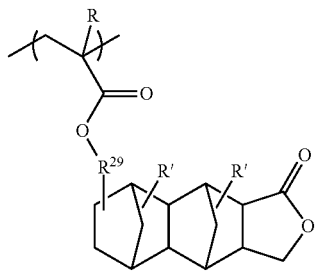
(a2-5)

In the above formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, R$^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

In the general formulas (a2-1) to (a2-5), R is the same as defined above.

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of factors such as ease of industrial availability, R' is preferably a hydrogen atom.

The alkyl group for R" may be any of linear, branched or cyclic.

When R" is a linear or branched alkyl group, the alkyl group preferably contains 1 to 10 carbon atoms, and more preferably 1 to 5 carbon atoms.

When R" is a cyclic alkyl group (cycloalkyl group), the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of A" include the same groups as those described above for A' in the general formula (3-1). A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ is the same as defined above for $R^{29}$ in the general formula (a2-0).

In the formula (a2-1), s" is preferably 1 or 2.

Specific examples of structural units represented by the general formulas (a2-1) to (a2-5) are shown below. In the formulas shown below, $R^\alpha$ represents a hydrogen atom, a methyl group or a trifluoromethyl group.

[Chemical Formula 39]

(a2-1-1)
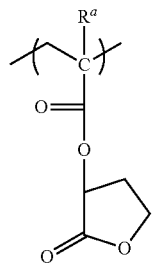

(a2-1-2)
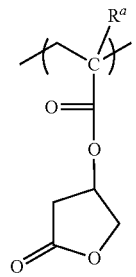

(a2-1-3)
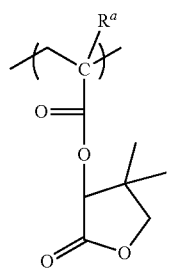

(a2-1-4)
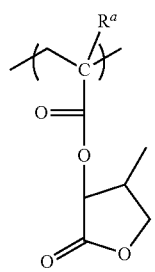

-continued (a2-1-5)
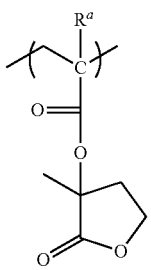

(a2-1-6)
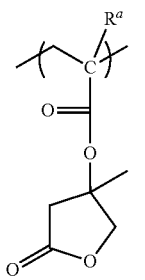

(a2-1-7)
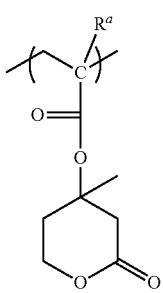

(a2-1-8)
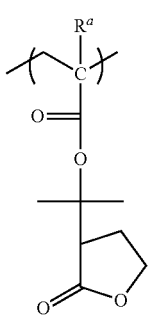

(a2-1-9)
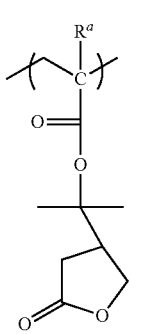

(a2-1-10)
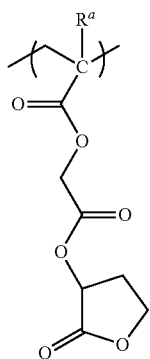
(a2-1-11)
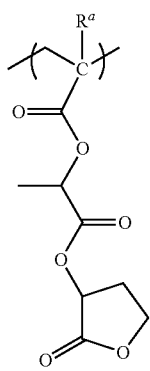
(a2-1-12)
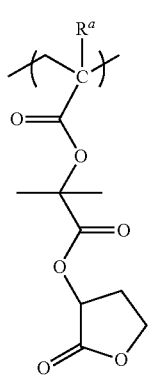
(a2-1-13)
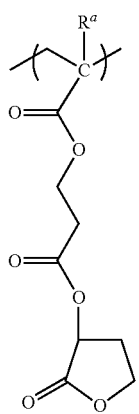
[Chemical Formula 40]
(a2-2-1)
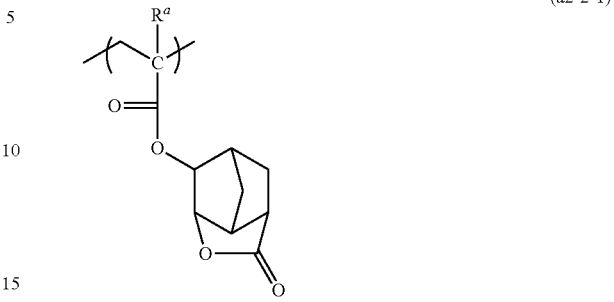
(a2-2-2)
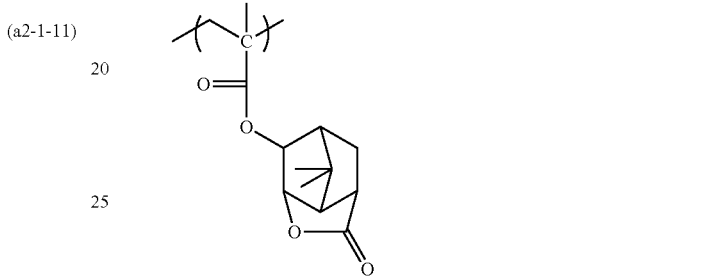
(a2-2-3)
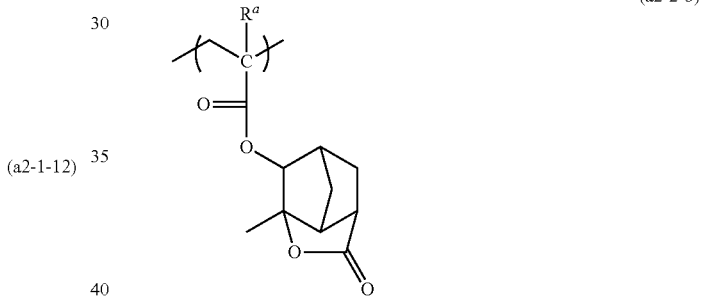
(a2-2-4)
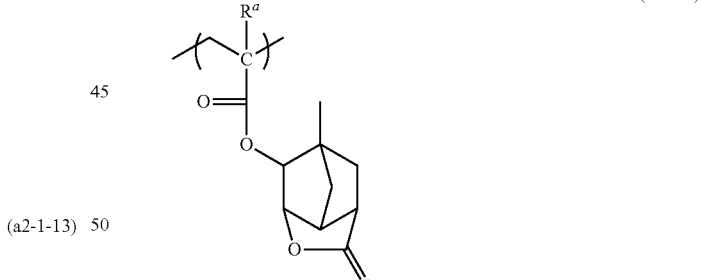
(a2-2-5)
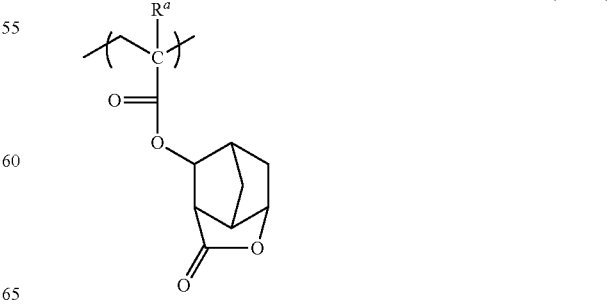

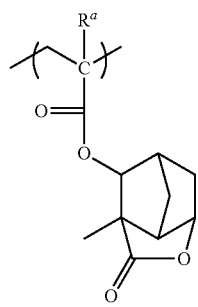 (a2-2-6)
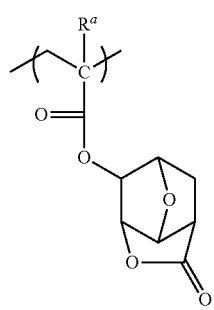 (a2-2-7)
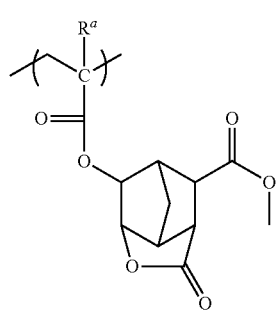 (a2-2-8)
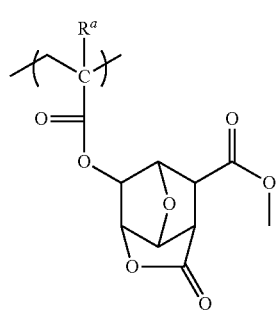 (a2-2-9)
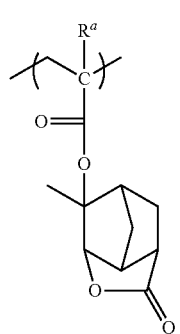 (a2-2-10)
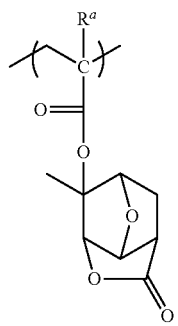 (a2-2-11)
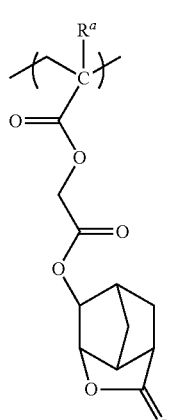 (a2-2-12)
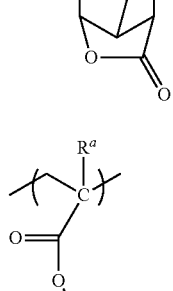 (a2-2-13)
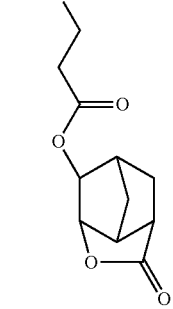 (a2-2-14)
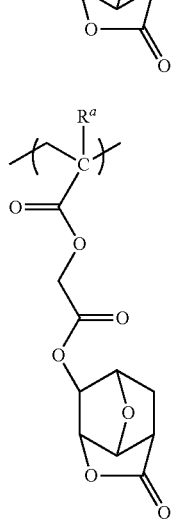

(a2-2-15)
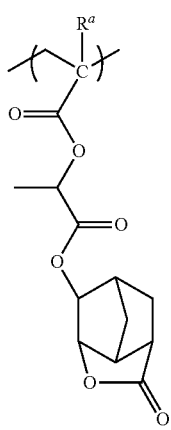
(a2-2-16)
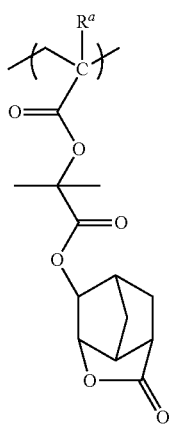
(a2-2-17)
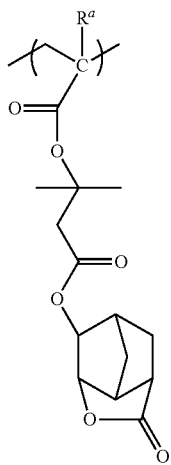
[Chemical Formula 41]
(a2-3-1)
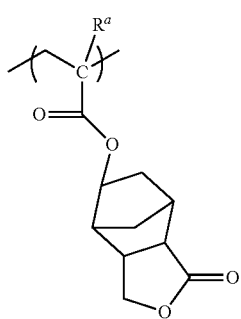
(a2-3-2)
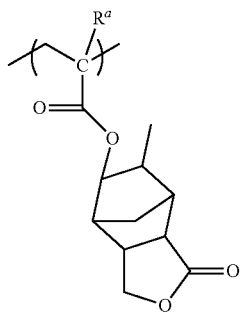
(a2-3-3)
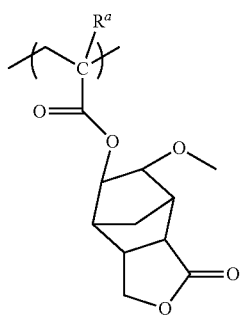
(a2-3-4)
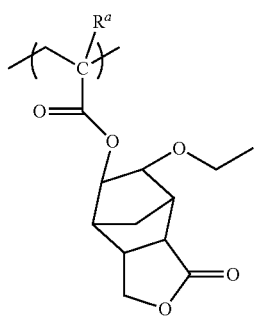
(a2-3-5)
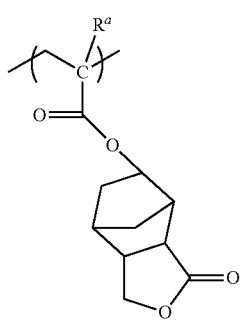
[Chemical Formula 42]
(a2-4-1)
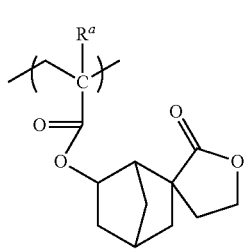

(a2-4-2)
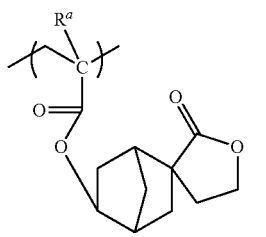
(a2-4-3)
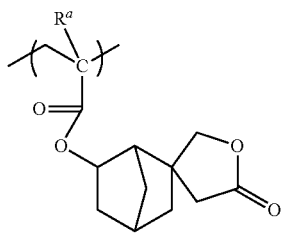
(a2-4-4)
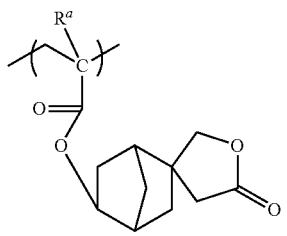
(a2-4-5)
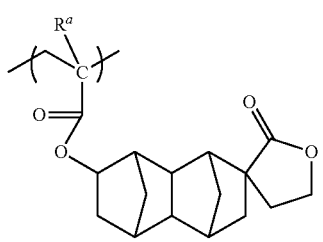
(a2-4-6)
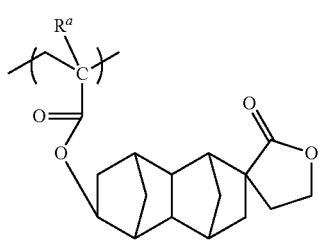
(a2-4-7)
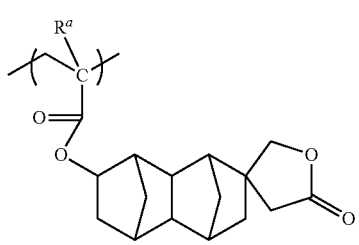
(a2-4-8)
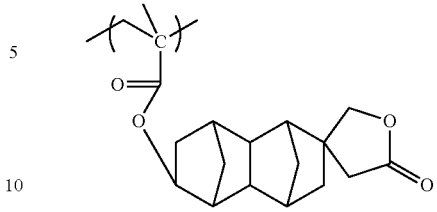
(a2-4-9)
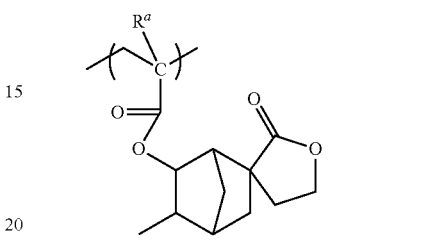
(a2-4-10)
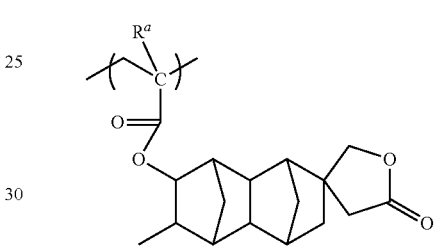
(a2-4-11)
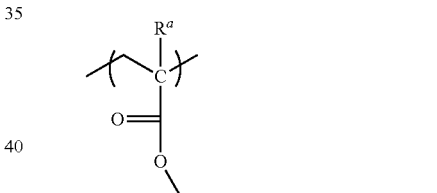
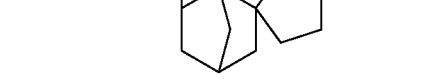
(a2-4-12)
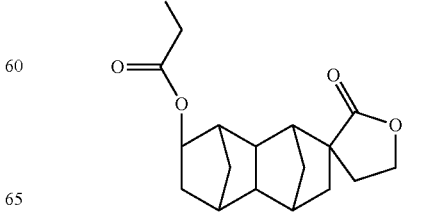

[Chemical Formula 43]

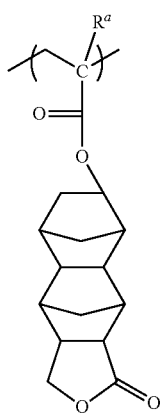 (a2-5-1)

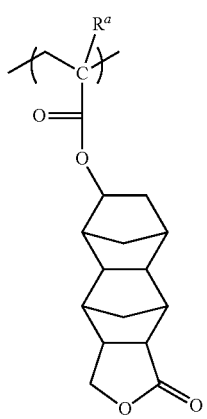 (a2-5-2)

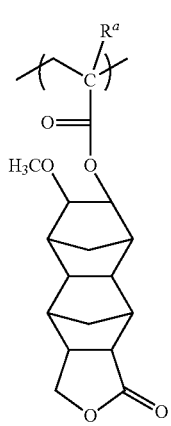 (a2-5-3)

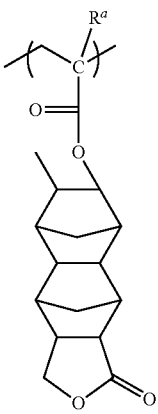 (a2-5-4)

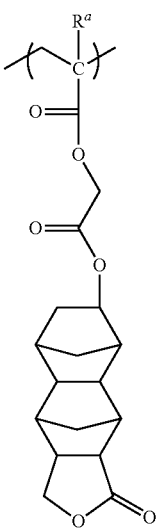 (a2-5-5)

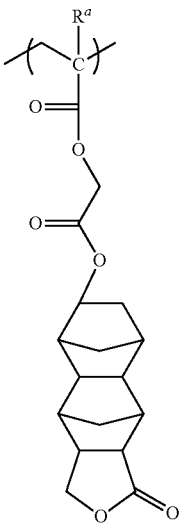 (a2-5-6)

The structural unit ($a2^L$) is preferably at least one structural unit selected from the group consisting of structural units represented by the general formulas (a2-1) to (a2-5), is more preferably at least one structural unit selected from the group consisting of structural units represented by the general formulas (a2-1) to (a2-3), and is still more preferably at least one structural unit selected from the group consisting of structural units represented by the general formulas (a2-1) and (a2-3).

Further, the structural unit (a2$^L$) is preferably at least one structural unit selected from the group consisting of structural units represented by the above chemical formulas (a2-1-1), (a2-1-2), (a2-2-1), (a2-2-7), (a2-2-12), (a2-2-14), (a2-3-1) and (a2-3-5), and more preferably at least one structural unit selected from the group consisting of structural units represented by the above chemical formulas (a2-1-1), (a2-1-2), (a2-3-1) and (a2-3-5).

In the component (A1), as the structural unit (a2), one type of structural unit may be used alone, or two or more types may be used in combination. For example, as the structural unit (a2), a structural unit (a2$^S$) may be used alone, a structural unit (a2$^L$) may be used alone, or a combination of these structural units may be used. Further, as the structural unit (a2$^S$) or the structural unit (a2$^L$), either a single type of structural unit may be used alone, or two or more types may be used in combination.

In those cases where the component (A1) includes the structural unit (a2), the amount of the structural unit (a2), based on the combined total of all the structural units that constitute the component (A1), is preferably within a range from 1 to 80 mol %, more preferably from 10 to 75 mol %, still more preferably from 10 to 70 mol %, and most preferably from 15 to 60 mol %. When the amount of the structural unit (a2) is at least as large as the lower limit of the above range, the effects achieved be including the structural unit (a2) can be satisfactorily realized. On the other hand, when the amount of the structural unit (a2) is not more than the upper limit of the above range, a good balance can be achieved with the other structural units, and various lithography properties such as DOF and CDU and the pattern shape can be improved.

(Structural Unit (a3))

The structural unit (a3) is a structural unit derived from an acrylate ester in which the hydrogen atom bonded to the carbon atom on the α-position may be substituted with a substituent and containing a polar group-containing aliphatic hydrocarbon group.

When the component (A1) includes the structural unit (a3), the hydrophilicity of the component (A1) is improved, which contributes to an improvement in the resolution.

Examples of the polar group include a hydroxyl group, cyano group, carboxyl group, or hydroxyalkyl group in which part of the hydrogen atoms of the alkyl group have each been substituted with a fluorine atom, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group containing a hydroxyl group, cyano group, carboxyl group or a hydroxyalkyl group in which part of the hydrogen atoms of the alkyl group have each been substituted with a fluorine atom are particularly desirable. Examples of the polycyclic group include groups in which two or more hydrogen atoms have been removed from a bicycloalkane, tricycloalkane, or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid, whereas when the hydrocarbon group is a polycyclic group, structural units represented by formulas (a3-1), (a3-2) and (a3-3) shown below are preferable.

[Chemical Formula 44]

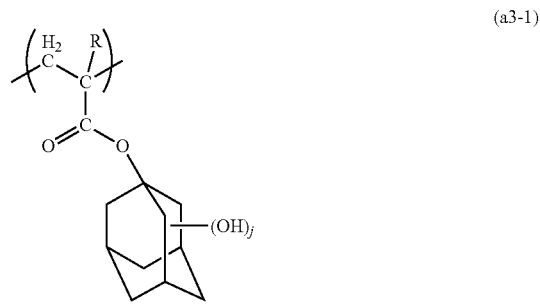
(a3-1)

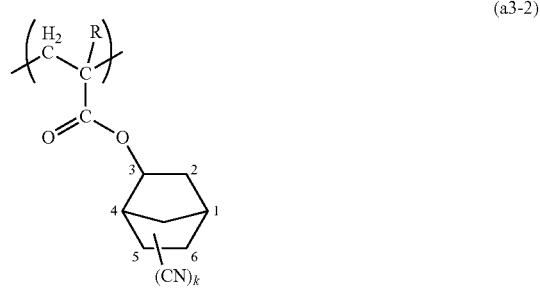
(a3-2)

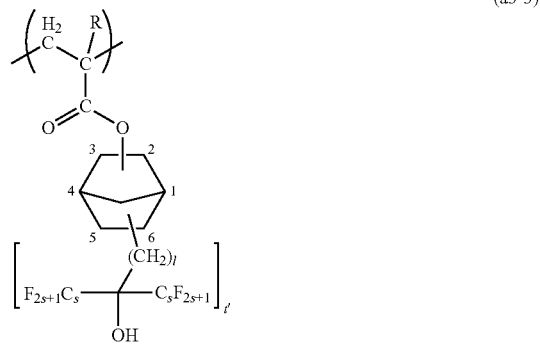
(a3-3)

In the formulas, R is the same as defined above, j represents an integer of 1 to 3, k represents an integer of 1 to 3, t' represents an integer of 1 to 3, 1 represents an integer of 1 to 5, and s represents an integer of 1 to 3.

In the formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In the formula (a3-2), k is preferably 1. The cyano group is preferably bonded to the 5th or 6th position of the norbornyl group.

In the formula (a3-3), t' is preferably 1. l is preferably 1. s is preferably 1. Further, in the formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types may be used in combination.

The amount of the structural unit (a3) within the component (A1), based on the combined total of all the structural units that constitute the component (A1), is preferably within a range from 1 to 50 mol %, more preferably from 3 to 45 mol %, and still more preferably from 5 to 40 mol %. When the amount of the structural unit (a3) is at least as large as the lower limit of the above range, the effects achieved be including the structural unit (a3) can be satisfactorily realized. On the other hand, when the amount of the structural unit (a3) is not more than the upper limit of the above range, a good balance can be achieved with the other structural units.

(Other Structural Units)

The component (A1) may also have a structural unit other than the above-mentioned structural units (a1) to (a3) (hereafter referred to as "structural unit (a4)"), as long as the effects of the present invention are not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Preferred examples of the structural unit (a4) include (1) a structural unit derived from an acrylate ester in which the hydrogen atom bonded to the carbon atom on the α-position may be substituted with a substituent and containing a non-acid-dissociable aliphatic polycyclic group, (2) a structural unit derived from acrylic acid in which the hydrogen atom bonded to the carbon atom on the α-position may be substituted with a substituent, (3) a structural unit derived from a styrene monomer or a vinylnaphthalene monomer, and (4) a structural unit derived from a hydroxystyrene monomer or a vinyl(hydroxynaphthalene) monomer. Examples of the above polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-6) shown below.

[Chemical Formula 45]

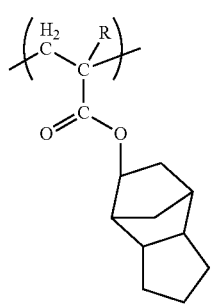

(a4-1)

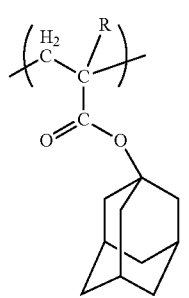

(a4-2)

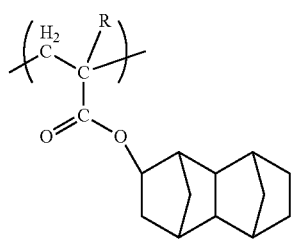

(a4-3)

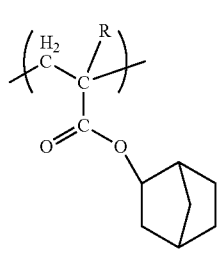

(a4-4)

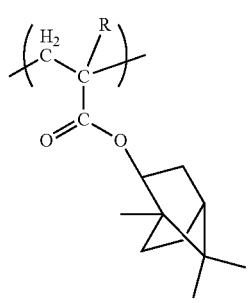

(a4-5)

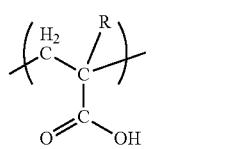

(a4-6)

In the formulas, R is the same as defined above.

As the structural unit (a4), one type of structural unit may be used alone, or two or more types may be used in combination.

When the structural unit (a4) is included in the component (A1), the amount of the structural unit (a4), based on the combined total of all the structural units that constitute the component (A1), is preferably within a range from 1 to 20 mol %, more preferably from 1 to 15 mol %, and still more preferably from 1 to 10 mol %. When the amount satisfies the above range, a combination of favorable lithography properties and a favorable dissolution rate can be achieved.

The component (A1) is a copolymer containing the structural unit (a1).

Examples of the copolymer include a copolymer consisting of the structural units (a1) and (a2), a copolymer consisting of the structural units (a1) and (a3), and a copolymer consisting of the structural units (a1), (a2) and (a3).

In the present invention, as the component (A1), a copolymer that includes a combination of structural units represented by one of formulas (A1-11) to (A1-14) shown below is particularly desirable. In the general formulas shown below, R, $R^{12}$, h, $R^{29}$, s", j, $R^{1'}$, $R^{2'}$, $R^{11}$, c', d', A', c, e and Z are each the same as defined above, and the plurality of R, groups in the formulas may be the same or different from each other.

[Chemical Formula 46]

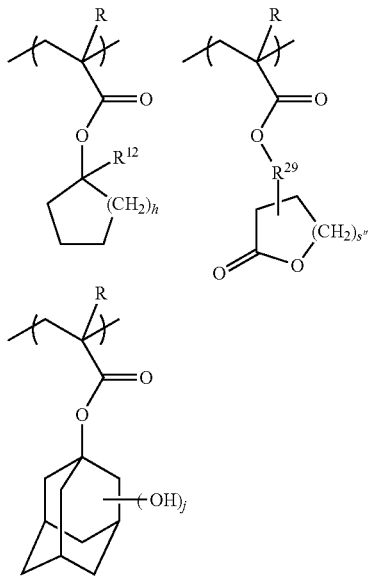

(A1-11)

(A1-12)

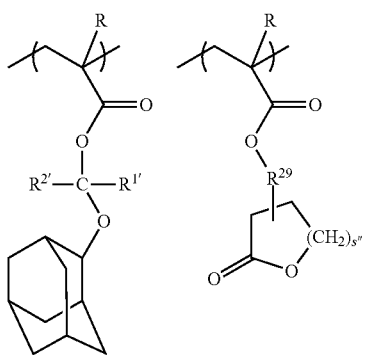

[Chemical Formula 47]

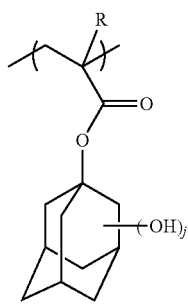

(A1-13)

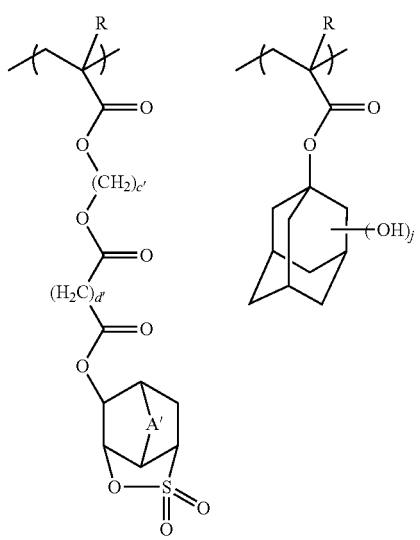

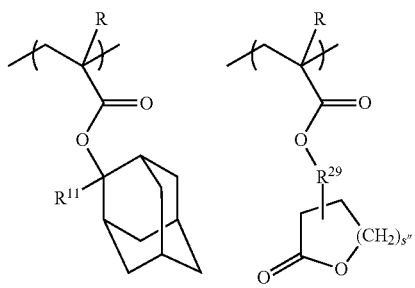

(A1-14)

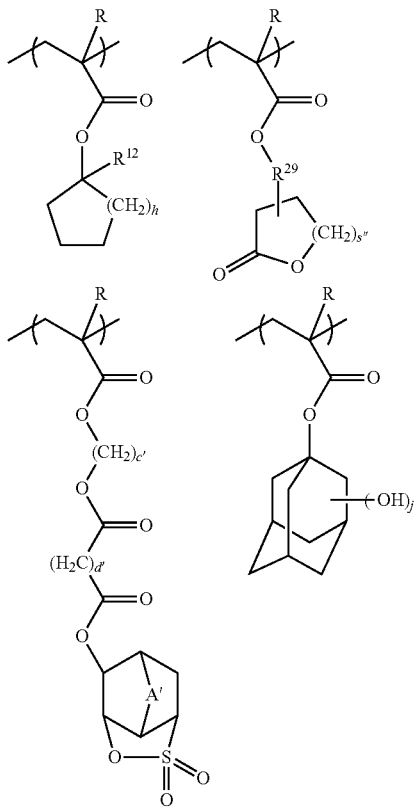

The weight average molecular weight (Mw) (the polystyrene-equivalent value determined by gel permeation chromatography) of the component (A1) is not particularly limited, but is preferably within a range from 1,000 to 50,000, more preferably from 1,500 to 30,000, still more preferably from 2,500 to 20,000, still more preferably from 6,000 to 15,000, and most preferably from 7,000 to 12,000. When the weight average molecular weight is not more than the upper limit of the above range, the component (A1) exhibits satisfactory solubility in a resist solvent when used in a resist composition. On the other hand, when the weight average molecular weight is at least as large as the lower limit of the above range, the dry etching resistance and the cross-sectional shape of the resist pattern are improved. Furthermore, in relation to the dissolution rate within the developing solution, a weight-average molecular weight of 6,000 to 15,000 is preferred in terms of achieving an appropriate dissolution rate for the component (A1).

Further, although there are no particular limitations on the dispersity (Mw/Mn) of the component (A1), the dispersity is preferably from 1.0 to 5.0, more preferably from 1.0 to 3.0, and most preferably from 1.2 to 2.5.

Here, Mn represents the number-average molecular weight.

In the component (A), as the component (A1), one type of compound may be used alone, or two or more types of compounds may be used in combination.

In the component (A), the amount of the component (A1), based on the total weight of the component (A), is preferably at least 25% by weight, more preferably at least 50% by weight, and still more preferably 75% by weight or more, and may even be 100% by weight. When the amount of the component (A1) is at least 25% by weight, the effects of the invention in improving various lithography properties are enhanced.

[Component (A2)]

In the resist composition of the present invention, the component (A) may also include another base component, besides the component (A1), which exhibits changed polarity under the action of acid (hereinafter referred to as "component (A2)").

The component (A2) is preferably a low molecular weight compound that has a molecular weight of at least 500 and less than 2,500, contains a hydrophilic group, and also contains an acid-dissociable group such as those described above in connection with the component (A1).

Specific examples of the component (A2) include compounds containing a plurality of phenol structures in which a part of the hydrogen atoms of the hydroxyl groups have each been substituted with an aforementioned acid-dissociable group.

Examples of the component (A2) include low molecular weight phenolic compounds in which a portion of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane structures is preferable in terms of resolution and LWR.

There are also no particular limitations on the acid-dissociable group, and suitable examples include the groups described above.

As the component (A2), one type of compound may be used alone, or two or more types of compounds may be used in combination.

In the resist composition of the present invention, as the component (A), one type of compound may be used alone, or two or more types of compounds may be used in combination.

Of the examples described above, the component (A) preferably contains the component (A1).

In the resist composition of the present invention, the amount of the component (A) may be adjusted appropriately in accordance with factors such as the thickness of the resist film that is to be formed.

<Component (B)>

There are no particular limitations on the component (B), and any of the known acid generators proposed for use in conventional chemically amplified resist compositions can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

Examples of compounds that can be used as the onium salt acid generator include compounds represented by a general formula (b-1) or (b-2) shown below.

[Chemical Formula 48]

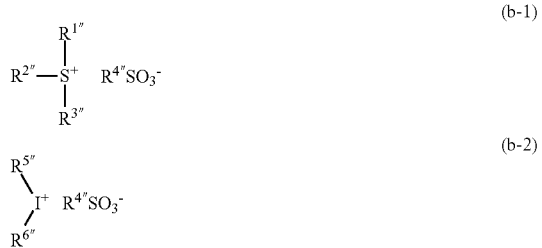

In the above formulas, each of $R^{1\prime\prime}$ to $R^{3\prime\prime}$, $R^{5\prime\prime}$ and $R^{6\prime\prime}$ independently represents an aryl group or alkyl group, wherein two of $R^{1\prime\prime}$ to $R^{3\prime\prime}$ in the formula (b-1) may be bonded to each other to form a ring with the sulfur atom, and $R^{4\prime\prime}$ represents an alkyl group, halogenated alkyl group, aryl group or alkenyl group which may have a substituent, provided that at least one of $R^{1\prime\prime}$ to $R^{3\prime\prime}$ represents an aryl group, and at least one of $R^{5\prime\prime}$ and $R^{6\prime\prime}$ represents an aryl group.

In the formula (b-1), each of $R^{1\prime\prime}$ to $R^{3\prime\prime}$ independently represents an aryl group or an alkyl group. Moreover, two of $R^{1\prime\prime}$ to $R^{3\prime\prime}$ in the formula (b-1) may be bonded to each other to form a ring together with the sulfur atom in the formula.

Furthermore, at least one of $R^{1\prime\prime}$ to $R^{3\prime\prime}$ represents an aryl group. It is preferable that at least two of $R^{1\prime\prime}$ to $R^{3\prime\prime}$ are aryl groups, and most preferably that all of $R^{1\prime\prime}$ to $R^{3\prime\prime}$ are aryl groups.

There are no particular limitations on the aryl group for $R^{1\prime\prime}$ to $R^{3\prime\prime}$, and examples include aryl groups having 6 to 20 carbon atoms in which part or all of the hydrogen atoms of the aryl group may or may not each be substituted with an alkyl group, alkoxy group, halogen atom or hydroxyl group or the like.

The aryl group is preferably an aryl group having 6 to 10 carbon atoms because such groups enable synthesis to be performed at low cost. Specific examples include a phenyl group and a naphthyl group.

The alkyl group with which a hydrogen atom of the aryl group may be substituted is preferably an alkyl group having 1 to 5 carbon atoms, and most preferably a methyl group, ethyl group, propyl group, n-butyl group or tert-butyl group.

The alkoxy group with which a hydrogen atom of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom with which a hydrogen atom of the aryl group may be substituted is preferably a fluorine atom.

There are no particular limitations on the alkyl group for $R^{1\prime\prime}$ to $R^{3\prime\prime}$, and examples includes linear, branched and cyclic alkyl groups having 1 to 10 carbon atoms. In terms of achieving excellent resolution, the alkyl group preferably has 1 to 5 carbon atoms. Specific examples include a methyl group, ethyl group, n-propyl group, isopropyl group, n-butyl group, isobutyl group, n-pentyl group, cyclopentyl group, hexyl group, cyclohexyl group, nonyl group and decyl group, and a methyl group is most preferable because it yields excellent resolution and enables synthesis to be performed at low cost.

When two of $R^{1\prime\prime}$ to $R^{3\prime\prime}$ in the formula (b-1) are bonded to each other to form a ring together with the sulfur atom in the formula, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in the formula (b-1) are bonded to each other to form a ring together with the sulfur atom in the formula, the remaining one of $R^{1\prime\prime}$ to $R^{3\prime\prime}$ is preferably an aryl group. Examples of this aryl group include the same aryl groups as those described above for $R^{1\prime\prime}$ to $R^{3\prime\prime}$.

Examples of preferred cation moieties for the compound represented by the general formula (b-1) include the cation moieties represented by formulas (I-1-1) to (I-1-11) shown below. Among these, a cation moiety having a triphenylmethane structure, such as a cation moiety represented by any one of the formulas (I-1-1) to (I-1-9) shown below, is particularly desirable.

In the formulas (I-1-10) and (I-1-11) shown below, each of $R^9$ and $R^{10}$ independently represents a phenyl group or naphthyl group which may have a substituent, or an alkyl group of 1 to 5 carbon atoms, an alkoxy group of 1 to 5 carbon atoms, or a hydroxyl group.

u is an integer of 1 to 3, and is most preferably 1 or 2.

[Chemical Formula 49]

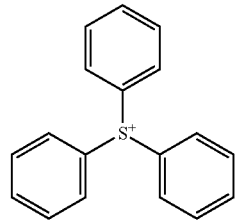

(I-1-1)

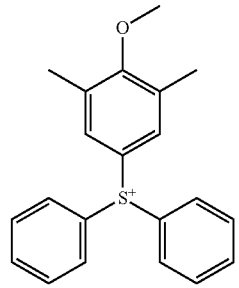

(I-1-2)

(I-1-3)
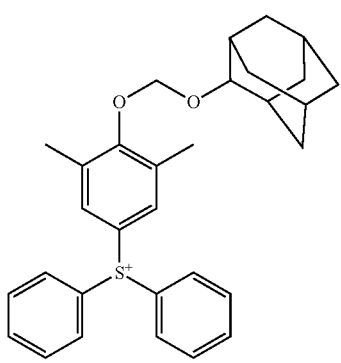

(I-1-4)
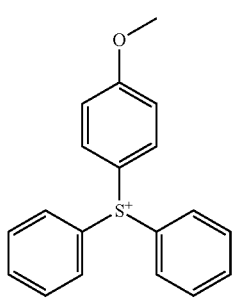

(I-1-5)
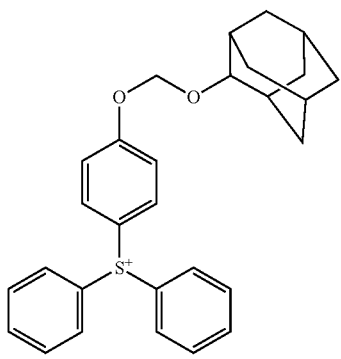

(I-1-6)
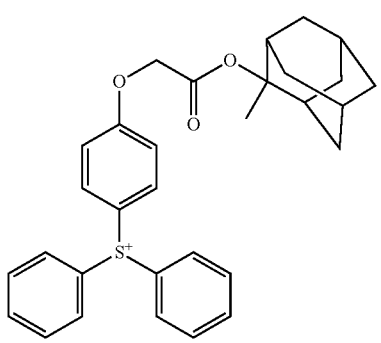

[Chemical Formula 50]

(I-1-7)
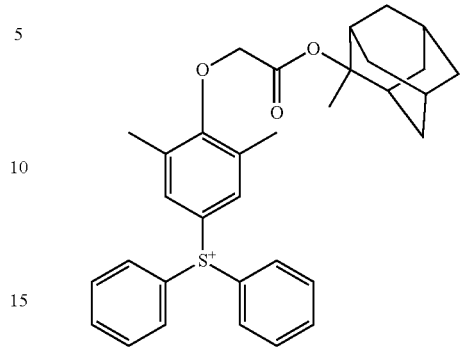

(I-1-8)
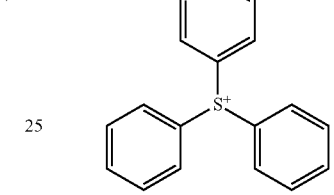

(I-1-9)
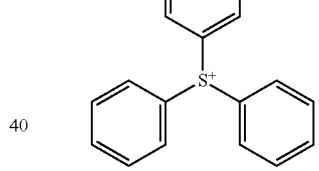

(I-1-10)
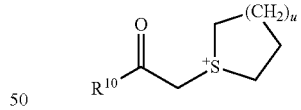

(I-1-11)

$R^{4\prime\prime}$ represents an alkyl group, halogenated alkyl group, aryl group or alkenyl group which may have a substituent.

The alkyl group for $R^{4\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4\prime\prime}$ include groups in which part or all of the hydrogen atoms of an aforementioned linear, branched or cyclic alkyl group have each been substituted with a halogen atom. Examples of the halogen atom include a fluorine atom, chlorine atom, bromine atom and iodine atom, and a fluorine atom is preferable.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the aforementioned linear, branched or cyclic alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by a formula $X-Q^1-$ (wherein $Q^1$ represents a divalent linking group containing an oxygen atom, and X represents a hydrocarbon group of 3 to 30 carbon atoms which may have a substituent).

Examples of the halogen atom and the alkyl group include the same halogen atoms and alkyl groups as those described above with respect to the halogenated alkyl group for $R^{4'''}$.

Examples of the hetero atom include an oxygen atom, a nitrogen atom and a sulfur atom.

In the group represented by formula $X-Q^1-$, $Q^1$ represents a divalent linking group containing an oxygen atom.

$Q^1$ may also contain atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (an ether linkage, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon, oxygen atom-containing linking groups with an alkylene group.

Specific examples of these combinations of a non-hydrocarbon, oxygen atom-containing linking group and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of the alkylene group include a methylene group [—$CH_2$—], alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, an ethylene group [—$CH_2CH_2$—], alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, a trimethylene group (n-propylene group) [—$CH_2CH_2CH_2$—], alkyltrimethylene groups such as —CH($CH_3$)$CH_2CH_2$— and —$CH_2$CH($CH_3$)$CH_2$—, a tetramethylene group [—$CH_2CH_2CH_2CH_2$—], alkyltetramethylene groups such as —CH($CH_3$)$CH_2CH_2CH_2$— and —$CH_2$CH($CH_3$)$CH_2CH_2$—, and a pentamethylene group [—$CH_2CH_2CH_2CH_2CH_2$—].

$Q^1$ is preferably a divalent linking group containing an ester linkage or ether linkage, and of such groups, is more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are groups in which one hydrogen atom has been removed from an aromatic hydrocarbon ring, such as a phenyl group, biphenylyl group, fluorenyl group, naphthyl group, anthryl group and phenanthryl group, and arylalkyl groups such as a benzyl group, phenethyl group, 1-naphthylmethyl group, 2-naphthylmethyl group, 1-naphthylethyl group and 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which part of the carbon atoms that constitute the ring within an aforementioned aryl group have been substituted with a hetero atom such as an oxygen atom, a sulfur atom or a nitrogen atom, and heteroarylalkyl groups in which part of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group and oxygen atom (=O) and the like.

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

The aliphatic hydrocarbon group for X may be either a saturated aliphatic hydrocarbon group or an unsaturated aliphatic hydrocarbon group. Further, the aliphatic hydrocarbon group may be linear, branched or cyclic.

In the aliphatic hydrocarbon group for X, part of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" within X, provided it is an atom other than carbon and hydrogen. Examples of the hetero atom include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituents in the ring structure.

Examples of the substituent for substituting part or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 51]

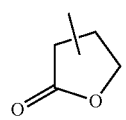

(L1)

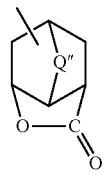

(L2)

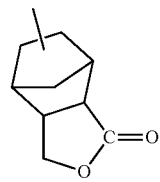

(L3)

(L4)

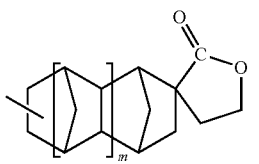

(L5)

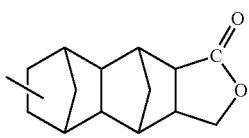

(L6)

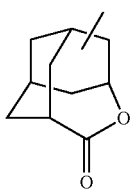

(S1)

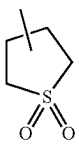

(S2)

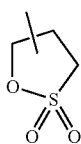

(S3)

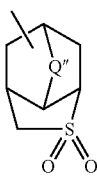

(S4)

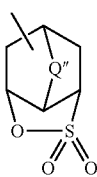

In the above formulas, Q″ represents an alkylene group of 1 to 5 carbon atoms, —O—, —S—, —O—$R^{94}$— or —S—$R^{95}$—, wherein each of $R^{94}$ and $R^{95}$ independently represents an alkylene group of 1 to 5 carbon atoms, and m represents an integer of 0 or 1.

Examples of the alkylene groups for Q″, $R^{94}$ and $R^{95}$ include the same alkylene groups as those described above for $R^{91}$ to $R^{93}$.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group and oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms of the aliphatic hydrocarbon group for X.

In the present invention, X is preferably a cyclic group which may have a substituent. This cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L6), and (S3) and (S4) are preferable.

In the present invention, $R^{4'''}$ preferably has X-$Q^1$- as a substituent. In such a case, $R^{4'''}$ is preferably a group represented by the formula X-$Q^1$-$Y^1$— (wherein $Q^1$ and X are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$—, examples of the alkylene group represented by $Y^1$ include those alkylene groups described above for $Q^1$ in which the number of carbon atoms is within a range from 1 to 4.

Examples of the fluorinated alkylene group for $Y^1$ include groups in which part or all of the hydrogen atoms of an above-mentioned alkylene group have each been substituted with a fluorine atom.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$— and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

In the formula (b-2), each of $R^{5\prime\prime\prime}$ and $R^{6\prime\prime\prime}$ independently represents an aryl group or an alkyl group. At least one of $R^{5\prime\prime\prime}$ and $R^{6\prime\prime\prime}$ preferably represents an aryl group, and it is more desirable that both of $R^{5\prime\prime\prime}$ and $R^{6\prime\prime\prime}$ are aryl groups.

Examples of the aryl group for $R^{5\prime\prime\prime}$ and $R^{6\prime\prime\prime}$ include the same aryl groups as those described above for $R^{1\prime\prime\prime}$ to $R^{3\prime\prime\prime}$.

Examples of the alkyl group for $R^{5\prime\prime\prime}$ and $R^{6\prime\prime\prime}$ include the same alkyl groups as those described above for $R^{1\prime\prime\prime}$ to $R^{3\prime\prime\prime}$.

Among the various possibilities, the case in which $R^{5\prime\prime\prime}$ and $R^{6\prime\prime\prime}$ are both phenyl groups is the most desirable.

Examples of $R^{4\prime\prime\prime}$ within the formula (b-2) include the same groups as those described above for $R^{4\prime\prime\prime}$ in the formula (b-1).

Specific examples of the onium salt acid generators represented by the formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has either been replaced by an alkyl sulfonate such as methanesulfonate, n-propanesulfonate, n-butanesulfonate, n-octanesulfonate, 1-adamantanesulfonate, 2-norbornanesulfonate or d-camphor-10-sulfonate, or been replaced by an aromatic sulfonate such as benzenesulfonate, perfluorobenzenesulfonate or p-toluenesulfonate.

Furthermore, onium salts in which the anion moiety of these onium salts has been replaced by an anion moiety represented by any one of formulas (b1) to (b8) shown below can also be used.

[Chemical Formula 52]

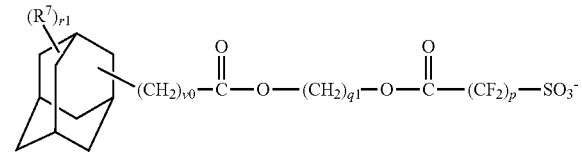

(b1)

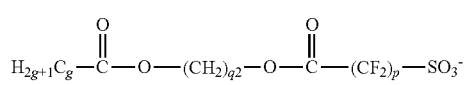

(b2)

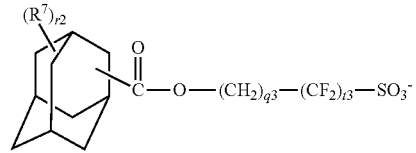

(b3)

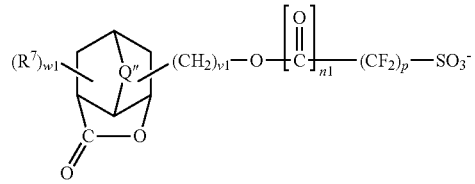

(b4)

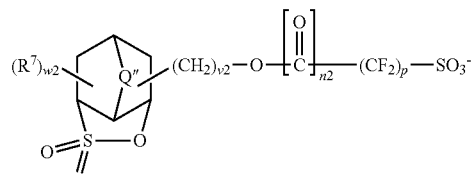

(b5)

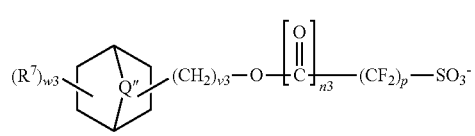

(b6)

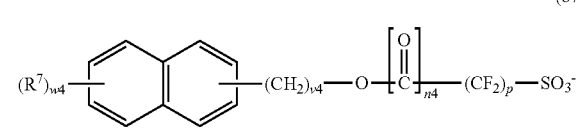

(b7)

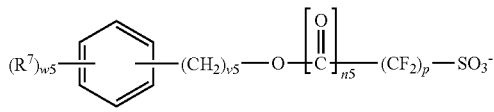

In the above formulas, p represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3 g represents an integer of 1 to 20, $R^7$ represents a substituent, each of n1 to n5 independently represents 0 or 1, each of v0 to v5 independently represents an integer of 0 to 3, each of w1 to w5 independently represents an integer of 0 to 3, and Q" is the same as defined above.

Examples of the substituent for $R^7$ include the same groups as those which the aforementioned aliphatic hydrocarbon group or aromatic hydrocarbon group for X may have as a substituent.

When the subscript r1, r2 or w1 to w5 appended to $R^7$ represents an integer of 2 or more, the corresponding plurality of $R^7$ groups within the compound may be the same or different from each other.

Further, onium salt acid generators in which the anion moiety in the general formula (b-1) or (b-2) has been replaced by an anion moiety represented by a general formula (b-3) or (b-4) shown below (but in which the cation moiety is the same as the cation shown in the formula (b-1) or (b-2)) may also be used as the onium salt acid generator.

[Chemical Formula 53]

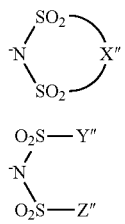

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

Furthermore, a sulfonium salt having a cation moiety represented by a general formula (b-5) or (b-6) shown below may also be used as an onium salt acid generator.

[Chemical Formula 54]

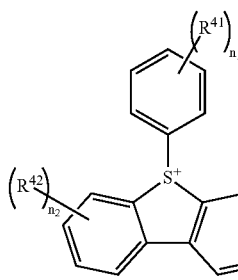

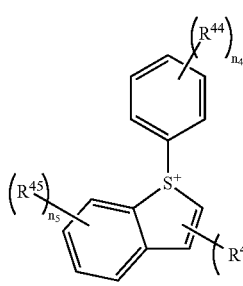

In the above formulas, each of $R^{41}$ to $R^{46}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{41}$ to $R^{46}$ is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group for $R^{41}$ to $R^{46}$ is preferably an alkoxy group of 1 to 5 carbon atoms, more preferably a linear or branched alkoxy group, and most preferably a methoxy group or ethoxy group.

The hydroxyalkyl group for $R^{41}$ to $R^{46}$ is preferably an aforementioned alkyl group in which one or more hydrogen atoms have each been substituted with a hydroxyl group, and specific examples include a hydroxymethyl group, hydroxyethyl group and hydroxypropyl group.

If there are two or more of an individual $R^{41}$ to $R^{46}$ group, as indicated by the corresponding value of the appended subscript $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

There are no particular limitations on the anion moiety of the sulfonium salt having a cation moiety represented by the formula (b-5) or (b-6), and the same anion moieties as those used for conventional onium salt-based acid generators that have been proposed may be used. Examples of such anion moieties include fluorinated alkylsulfonate ions such as the anion moiety ($R^{4"}SO_3^-$) illustrated for the onium salt-based acid generators represented by the general formulas (b-1) and (b-2) shown above, and anion moieties represented by the general formulas (b-3) and (b-4) shown above.

In the present description, an oxime sulfonate acid generator is a compound having at least one group represented by a general formula (B-1) shown below, and has a feature of generating acid upon irradiation. Such oxime sulfonate acid generators are widely used for chemically amplified resist compositions, and any of these known compounds may be selected as appropriate.

[Chemical Formula 55]

(B-1)

In the formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereafter sometimes referred to as a "halogenated alkyl group") is particularly desirable. A "partially halogenated alkyl group" refers to an alkyl group in which part of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 56]

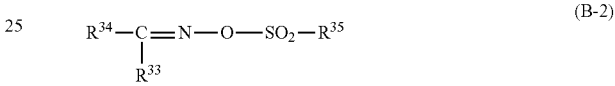

(B-2)

In the formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 57]

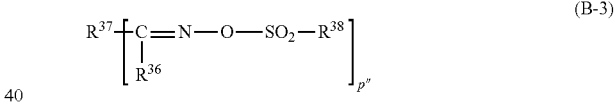

(B-3)

In the formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In the general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the alkyl group hydrogen atoms fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms that constitute the ring(s) of these groups are substituted with a hetero atom such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In the general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 86) may also be used favorably.

Furthermore, the following compounds may also be used as preferred examples.

[Chemical Formula 58]

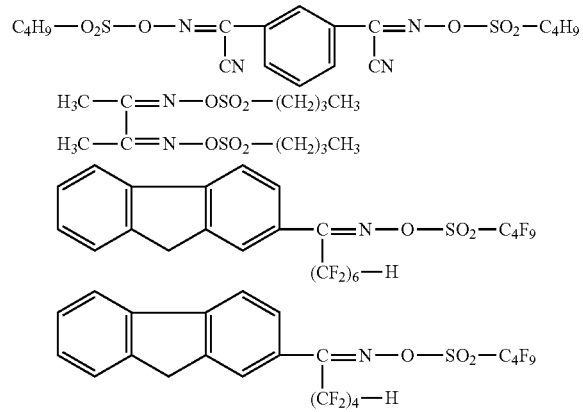

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one of the above types of acid generator may be used alone, or two or more types of acid generators may be used in combination.

In the present invention, as the component (B), the use of an onium salt acid generator having a fluorinated alkylsulfonate ion as the anion moiety is preferable, and the use of a combination of an onium salt acid generator having an anion moiety represented by one of the above formulas (b1) to (b8), and an onium salt acid generator having an anion moiety represented by the above formula (b-3) is particularly desirable.

The amount of the component (B) within a resist composition of the present invention is preferably within a range from 0.5 to 50 parts by weight, and more preferably from 1 to 40 parts by weight, relative to 100 parts by weight of the component (A). When the amount of the component (B) is within the above range, formation of a resist pattern can be performed satisfactorily. Further, a uniform solution can be obtained, and the storage stability of the solution tends to improve.

<Optional Component—Component (C)>

The resist composition of the present invention may also include a basic compound component (C) (hereafter referred to as "component (C)") as an optional component. In the present invention, the component (C) functions as an acid diffusion control agent, namely, a quencher that traps the acid generated from the component (B) or the like upon exposure. Further, in the present invention, the term "basic compound" describes a compound that is relatively basic compared with the component (B).

The component (C) in the present invention may be a basic compound (C1) composed of a cation moiety and an anion moiety (hereafter referred to as "component (C1)"), or a basic compound (C2) that does not correspond with the definition for the component (C1) (hereafter referred to as "component (C2)").

[Component (C1)]

In the present invention, the component (C1) preferably contains at least one compound selected from the group consisting of compounds (c1-1) represented by a general formula (c1-1) shown below (hereafter referred to as "component (c1-1)"), compounds (c1-2) represented by a general formula (c1-2) shown below (hereafter referred to as "component (c1-2)"), and compounds (c1-3) represented by a general formula (c1-3) shown below (hereafter referred to as "component (c1-3)").

[Chemical Formula 59]

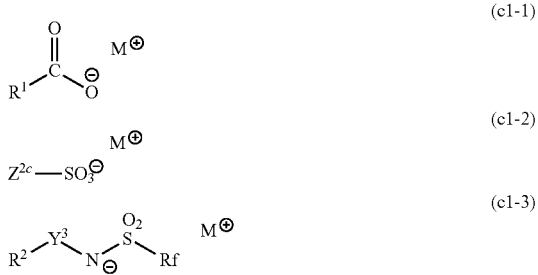

In the above formulas, $R^1$ represents a hydrocarbon group which may have a substituent, $Z^{2c}$ represents a hydrocarbon group of 1 to 30 carbon atoms which may have a substituent (provided that the carbon atom adjacent to the sulfur atom does not have a fluorine atom as a substituent), $R^2$ represents an organic group, $Y^3$ represents a linear, branched or cyclic alkylene group or an arylene group, Rf represents a hydrocarbon group containing a fluorine atom, and each $M^+$ independently represents a sulfonium or iodonium cation having no aromaticity.

[Component (c1-1)]

Anion Moiety

In the formula (c1-1), $R^1$ represents a hydrocarbon group which may have a substituent.

The hydrocarbon group which may have a substituent for $R^1$ may be an aliphatic hydrocarbon group or an aromatic hydrocarbon group, and examples include the same aliphatic hydrocarbon groups and aromatic hydrocarbon groups as those described above for X in the component (B).

Among the various possibilities, the hydrocarbon group which may have a substituent for $R^1$ is preferably an aromatic hydrocarbon group which may have a substituent or an aliphatic cyclic group which may have a substituent, and is more preferably a phenyl group or naphthyl group which may have a substituent, or a group in which one or more hydrogen atoms have been removed from a polycycloalkane such as adamantane, norbornane, isobornane, tricyclodecane or tetracyclododecane.

Further, a linear, branched or cyclic alkyl group or a fluorinated alkyl group is also preferred as the hydrocarbon group which may have a substituent for $R^1$.

The linear or branched alkyl group for $R^1$ preferably contains 1 to 10 carbon atoms, and specific examples include linear alkyl groups such as a methyl group, ethyl group, propyl group, butyl group, pentyl group, hexyl group, heptyl group, octyl group, nonyl group and decyl group, and branched alkyl groups such as a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The fluorinated alkyl group for $R^1$ may be a chain-like group or a cyclic group, but is preferably a linear or branched group.

The fluorinated alkyl group preferably contains 1 to 11 carbon atoms, more preferably 1 to 8 carbon atoms, and still more preferably 1 to 4 carbon atoms. Specific examples include groups in which part or all of the hydrogen atoms of a linear alkyl group (such as a methyl group, ethyl group, propyl group, butyl group, pentyl group, hexyl group, heptyl group, octyl group, nonyl group or decyl group) have each been substituted with a fluorine atom, and groups in which part or all of the hydrogen atoms of a branched alkyl group (such as a 1-methylethyl group, 1-methylpropyl group, 2-methylpropyl group, 1-methylbutyl group, 2-methylbutyl group or 3-methylbutyl group) have each been substituted with a fluorine atom.

Further, the fluorinated alkyl group for $R^1$ may also include atoms other than the fluorine atom(s). Examples of these atoms other than the fluorine atom(s) include an oxygen atom, carbon atom, hydrogen atom, sulfur atom and nitrogen atom.

Among the above possibilities, the fluorinated alkyl group for $R^1$ is preferably a group in which part or all of the hydrogen atoms of a linear alkyl group have each been substituted with a fluorine atom, and is more preferably a group in all of the hydrogen atoms of a linear alkyl group have been substituted with fluorine atoms (a perfluoroalkyl group).

Specific examples of preferred anion moieties for the component (c1-1) are shown below.

[Chemical Formula 60]

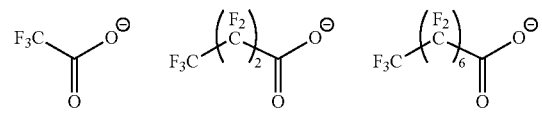

-continued

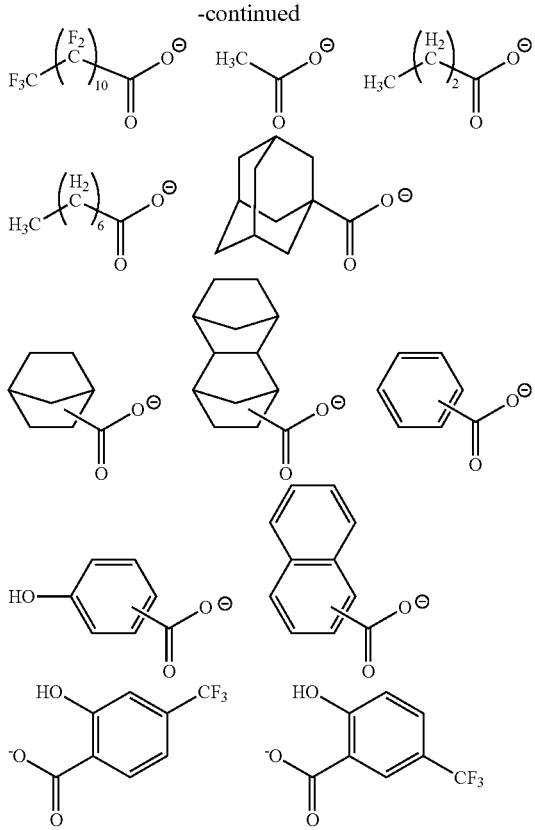

Cation Moiety

In the formula (c1-1), $M^+$ represents an organic cation.

There are no particular limitations on the organic cation for $M^+$, and for example, the same cation moieties as those described above for the compounds represented by the formulas (b-1) and (b-2) can be used.

As the component (c1-1), one type of compound may be used alone, or two or more types of compounds may be used in combination.

[Component (c1-2)]

Anion Moiety

In the formula (c1-2), $Z^{2c}$ represents a hydrocarbon group of 1 to 30 carbon atoms which may have a substituent.

The hydrocarbon group of 1 to 30 carbon atoms which may have a substituent for $Z^{2c}$ may be either an aliphatic hydrocarbon group or an aromatic hydrocarbon group, and examples include the same aliphatic hydrocarbon groups and aromatic hydrocarbon groups as those described above for X within the substituent for $R^{4'''}$ in the component (B).

Among the various possibilities, the hydrocarbon group which may have a substituent for $Z^{2c}$ is preferably an aliphatic cyclic group which may have a substituent, and is more preferably a group in which one or more hydrogen atoms have been removed from adamantane, norbornane, isobornane, tricyclodecane, tetracyclododecane or camphor (which may have a substituent).

The hydrocarbon group for $Z^{2c}$ may have a substituent, and examples of the substituent include the same substituents as those mentioned above for X within the description relating to the component (B). In $Z^{2c}$, the carbon atom adjacent to the sulfur atom of the $SO_3^-$ moiety should not be substituted with a fluorine atom. When the $SO_3^-$ moiety is not adjacent to a fluorine atom, the anion moiety of the component (c1-2) becomes an anion that exhibits an appropriate level of weak acidity, and the quenching action of the component (C) improves.

Specific examples of preferred anion moieties for the component (c1-2) are shown below.

[Chemical Formula 61]

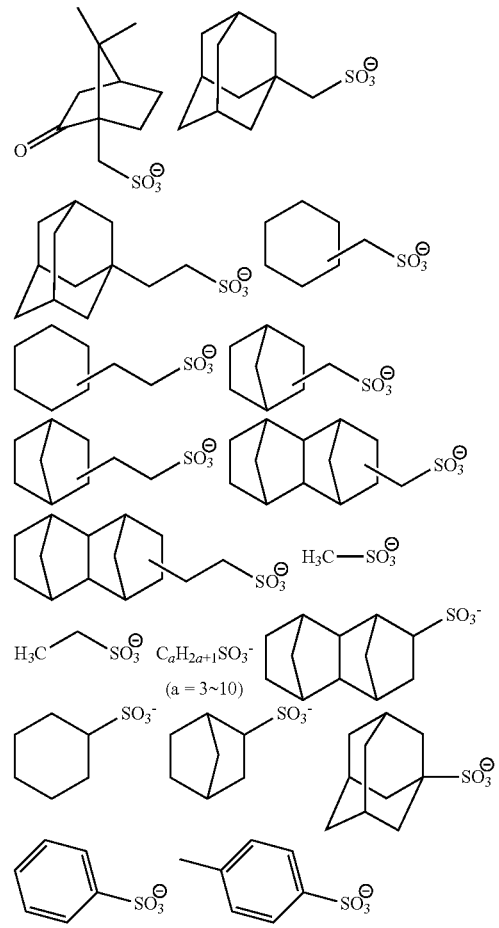

Cation Moiety

In the formula (c1-2), $M^+$ is the same as defined above for $M^+$ in the aforementioned formula (c1-1).

As the component (c1-2), one type of compound may be used alone, or two or more types of compounds may be used in combination.

[Component (c1-3)]

Anion Moiety

In the formula (c1-3), $R^2$ represents an organic group

There are no particular limitations on the organic group for $R^2$, and examples include alkyl groups, alkoxy groups, —O—C(=O)—C($R^{C2}$)=$CH_2$ (wherein $R^{C2}$ represents a hydrogen atom, an alkyl group of 1 to 5 carbon atoms or a halogenated alkyl group of 1 to 5 carbon atoms) and —O—C(=O)—$R^{C3}$ (wherein $R^{C3}$ represents a hydrocarbon group).

The alkyl group for $R^2$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. Part of the hydrogen atoms within the alkyl group for $R^2$ may each be substituted with a hydroxyl group or a cyano group or the like.

The alkoxy group for $R^2$ is preferably an alkoxy group of 1 to 5 carbon atoms, and specific examples include a methoxy group, ethoxy group, n-propoxy group, iso-propoxy group, n-butoxy group and tert-butoxy group. Among these, a methoxy group or an ethoxy group is particularly desirable.

When $R^2$ is —O—C(=O)—C($R^{C2}$)=CH$_2$, $R^{C2}$ represents a hydrogen atom, an alkyl group of 1 to 5 carbon atoms or a halogenated alkyl group of 1 to 5 carbon atoms.

The alkyl group of 1 to 5 carbon atoms for $R^{C2}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $R^{C2}$ is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

As $R^{C2}$, a hydrogen atom, an alkyl group of 1 to 3 carbon atoms or a fluorinated alkyl group of 1 to 3 carbon atoms is preferable, and a hydrogen atom or a methyl group is the most desirable in terms of industrial availability.

When $R^2$ is —O—C(=O)—$R^{C3}$, $R^{C3}$ represents a hydrocarbon group.

The hydrocarbon group for $R^{C3}$ may be either an aromatic hydrocarbon group or an aliphatic hydrocarbon group. Specific examples of the hydrocarbon group for $R^{C3}$ include the same hydrocarbon groups as those described for X in relation to the component (B).

Among these, as the hydrocarbon group for $R^{C3}$, an alicyclic group (namely, a group in which one or more hydrogen atoms have been removed from a cycloalkane such as cyclopentane, cyclohexane, adamantane, norbornane, isobornane, tricyclodecane or tetracyclododecane) or an aromatic group (such as a phenyl group or a naphthyl group) is preferable. When $R^{C3}$ is an alicyclic group, the resist composition can be satisfactorily dissolved in an organic solvent, thereby improving the lithography properties. Alternatively, when $R^{C3}$ is an aromatic group, the resist composition exhibits an excellent photoabsorption efficiency in a lithography process using EUV or the like as the exposure source, resulting in improvements in the sensitivity and the lithography properties.

Among the above possibilities, $R^2$ is preferably a group represented by —O—C(=O)—C($R^{C2'}$)=CH$_2$ (wherein $R^{C2'}$ represents a hydrogen atom or a methyl group) or —O—C(=O)—$R^{C3'}$ (wherein $R^{C3'}$ represents an aliphatic cyclic group).

In the formula (c1-3), $Y^3$ represents a linear, branched or cyclic alkylene group or an arylene group.

Examples of the linear, branched or cyclic alkylene group or the arylene group for $Y^3$ include the same groups as the "linear or branched aliphatic hydrocarbon group", "cyclic aliphatic hydrocarbon group" and "aromatic hydrocarbon group" described above as the divalent linking group for $Y^{22}$ in the aforementioned formula (a1-0-2).

Among these, $Y^3$ is preferably an alkylene group, more preferably a linear or branched alkylene group, and most preferably a methylene group or an ethylene group.

In the formula (c1-3), Rf represents a hydrocarbon group containing a fluorine atom.

The hydrocarbon group containing a fluorine atom for Rf is preferably a fluorinated alkyl group, and the same groups as those described above for the fluorinated alkyl group for $R^1$ are particularly desirable.

Specific examples of preferred anion moieties for the component (c1-3) are shown below.

[Chemical Formula 62]

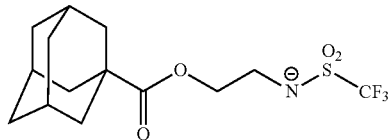

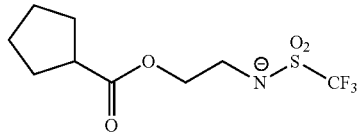

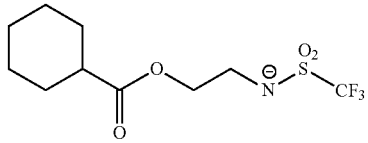

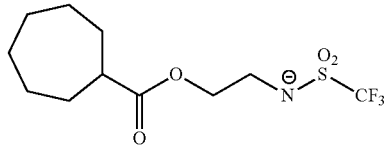

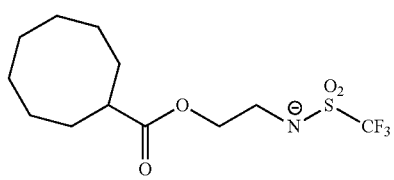

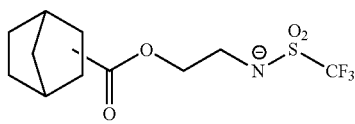

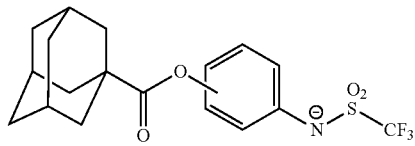

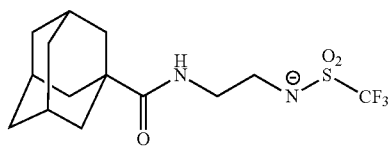

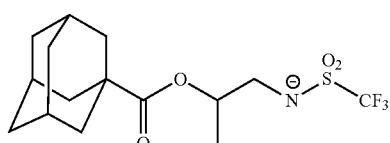

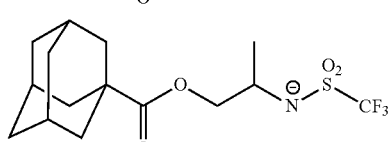

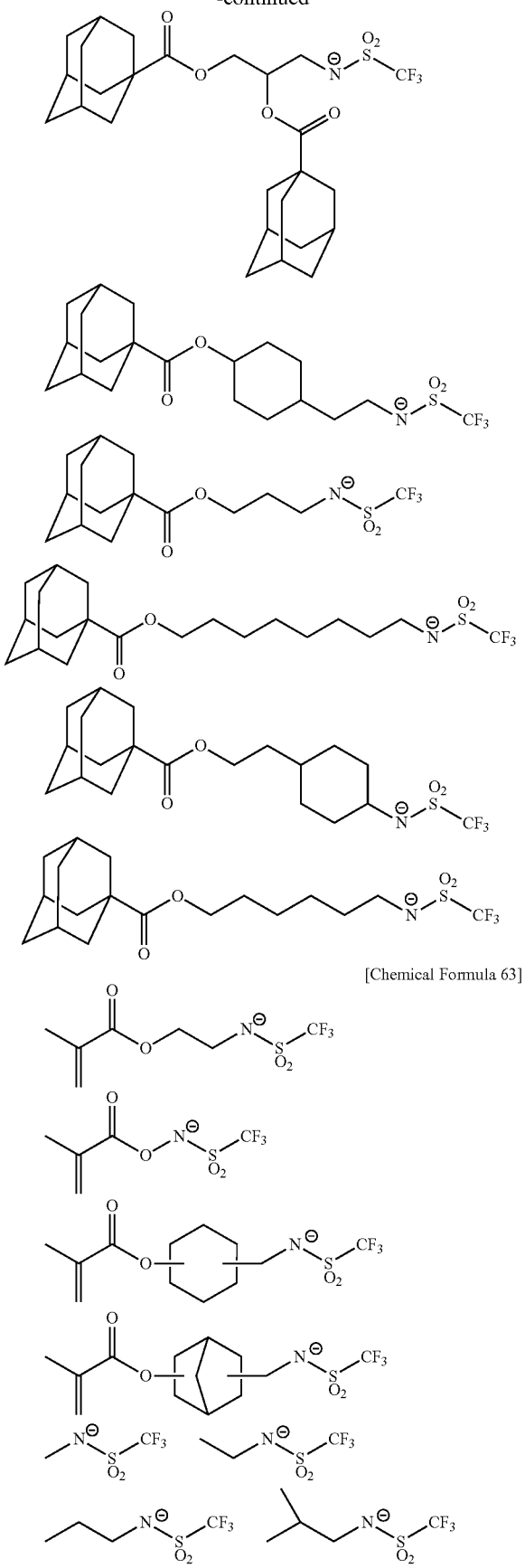

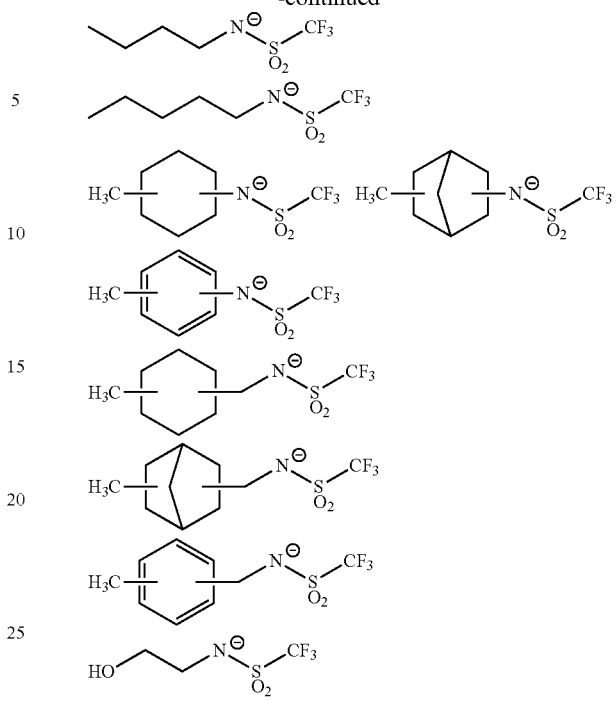

Cation Moiety

In the formula (c1-3), $M^+$ is the same as defined above for $M^+$ in the aforementioned formula (c1-1).

As the component (c1-3), one type of compound may be used alone, or two or more types of compounds may be used in combination.

In the present invention, the component (C1) may contain any one of the aforementioned components (c1-1) to (c1-3), or may contain a combination of two or more of the components (c1-1) to (c1-3).

The total amount of the components (c1-1) to (c1-3), relative to 100 parts by weight of the component (A), is preferably within a range from 0.5 to 10.0 parts by weight, more preferably from 0.5 to 8.0 parts by weight, and still more preferably from 1.0 to 8.0 parts by weight. When this total amount is at least as large as the lower limit of the above range, excellent lithography properties and excellent resist pattern shape can be obtained. On the other hand, when the total amount is not more than the upper limit of the above range, sensitivity can be maintained at a satisfactory level, and throughput can be improved.

(Method of Producing Component (C))

In the present invention, there are no particular limitations on the methods used for producing the components (c1-1) and (c1-2), and conventional methods can be used.

Further, there are no particular limitations on the production method for the component (c1-3). For example, in the case where $R^2$ in the formula (c1-3) is a group having an oxygen atom at the terminal bonded to $Y^3$, a compound (i-1) represented by a general formula (i-1) shown below can be reacted with a compound (i-2) represented by a general formula (i-2) shown below to obtain a compound (i-3) represented by a general formula (i-3) shown below, and the compound (i-3) can then be reacted with a compound $Z^-M^+$ (i-4) having the desired cation $M^+$, thereby producing a compound (c1-3) represented by the general formula (c1-3).

[Chemical Formula 64]

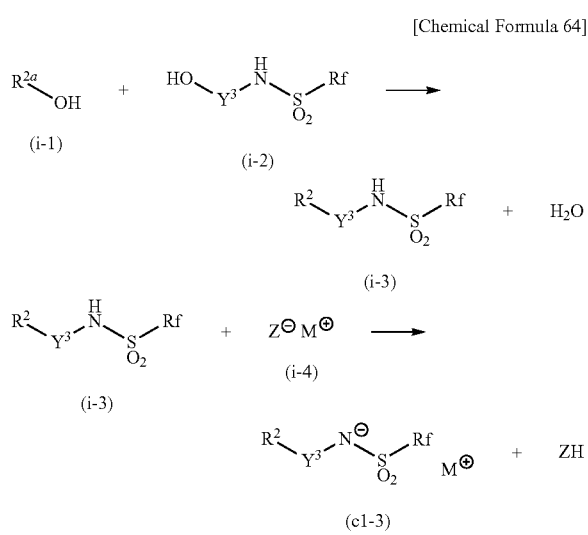

In the above formulas, $R^2$, $Y^3$, Rf and $M^+$ are the same as defined above for $R^2$, $Y^3$, Rf and $M^+$ respectively in the general formula (c1-3), $R^{2a}$ represents a group in which the terminal oxygen atom has been removed from $R^2$, and $Z^-$ represents a counter anion.

First, the compound (i-1) is reacted with the compound (i-2) to obtain the compound (i-3).

In the formula (i-1), $R^2$ is the same as defined above, and $R^{2a}$ represents a group in which the terminal oxygen atom has been removed from $R^2$. In the formula (i-2), $Y^3$ and Rf are the same as defined above.

As the compound (i-1) and the compound (i-2), commercially available compounds may be used, or the compounds may be synthesized.

The method for reacting the compound (i-1) with the compound (i-2) to obtain the compound (i-3) is not particularly limited, and can be performed, for example, by reacting the compound (i-1) with the compound (i-2) in an organic solvent in the presence of an appropriate acid catalyst, and then washing the reaction mixture and recovering the reaction product.

There are no particular limitations on the acid catalyst used in the above reaction, and examples include toluenesulfonic acid and the like. The amount used of the acid catalyst is preferably within a range from approximately 0.05 to 5 mols, per 1 mol of the compound (i-2).

As the organic solvent used in the above reaction, any organic solvent which is capable of dissolving the raw materials, namely the compound (i-1) and the compound (i-2), can be used, and specific examples include toluene and the like. The amount of the organic solvent is preferably within a range from 0.5 to 100 parts by weight, and more preferably from 0.5 to 20 parts by weight, relative to 1 part by weight of the compound (i-1). As the organic solvent, one type of solvent may be used alone, or two or more types of solvents may be used in combination.

In general, the amount of the compound (i-2) used in the above reaction is preferably within a range from approximately 0.5 to 5 mols, and more preferably from 0.8 to 4 mols, per 1 mol of the compound (i-1).

The reaction time for the above reaction varies depending on the reactivity between the compound (i-1) and the compound (i-2), and the reaction temperature and the like, but in most cases, is preferably within a range from 1 to 80 hours, and more preferably from 3 to 60 hours.

The reaction temperature of the above reaction is preferably within a range from 20° C. to 200° C., and more preferably from approximately 20° C. to 150° C.

Next, the obtained compound (i-3) is reacted with the compound (i-4), thereby obtaining the compound (c1-3).

In the formula (i-4), $M^+$ is the same as defined above, and $Z^-$ represents a counter anion.

The method for reacting the compound (i-3) with the compound (i-4) to obtain the compound (c1-3) is not particularly limited, and can be performed, for example, by dissolving the compound (i-3) in an appropriate organic solvent and water in the presence of an appropriate alkali metal hydroxide, and then adding the compound (i-4) and stirring.

There are no particular limitations on the alkali metal hydroxide used in the above reaction, and examples include sodium hydroxide and potassium hydroxide and the like. The amount used of the alkali metal hydroxide is preferably within a range from approximately 0.3 to 3 mols, per 1 mol of the compound (i-3).

Examples of the organic solvent used in the above reaction include dichloromethane, chloroform and ethyl acetate. The amount used of the organic solvent is preferably within a range from 0.5 to 100 parts by weight, and more preferably from 0.5 to 20 parts by weight, relative to 1 part by weight of the compound (i-3). As the solvent, one type of solvent may be used alone, or two or more types of solvents may be used in combination.

In general, the amount of the compound (i-4) used in the above reaction is preferably within a range from approximately 0.5 to 5 mols, and more preferably from approximately 0.8 to 4 mols, per 1 mol of the compound (i-3).

The reaction time for the above reaction varies depending on the reactivity between the compound (i-3) and the compound (i-4), and the reaction temperature and the like, but in most cases, is preferably within a range from 1 to 80 hours, and more preferably from 3 to 60 hours.

The reaction temperature of the above reaction is preferably within a range from 20° C. to 200° C., and more preferably from approximately 20° C. to 150° C.

Following completion of the reaction, the compound (c1-3) contained in the reaction mixture may be separated and purified. Conventional methods may be used to separate and purify the product, including concentration, solvent extraction, distillation, crystallization, recrystallization and chromatography, which may be used individually or in combinations of two or more different methods.

The structure of the compound (c1-3) obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elemental analysis and X-ray crystal diffraction methods.

[Component (C2)]

The component (C2) is not particularly limited, as long as it is a compound which is basic relative to the component (B), so as to function as an acid diffusion inhibitor, and does not fall under the definition of the component (C1). As the component (C2), any of the conventionally known compounds may be selected for use. Among these, an aliphatic amine, and particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines and alkyl alcohol amines), and cyclic amines.

Specific examples of alkylamines and alkyl alcohol amines include monoalkylamines such as n-hexylamine, n-heptylamine, n-octylamine, n-nonylamine and n-decylamine; dialkylamines such as diethylamine, di-n-propylamine, di-n-heptylamine, di-n-octylamine and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine; and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (C2), an aromatic amine may be used.

Examples of the aromatic amine include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (C2), one type of compound may be used alone, or two or more types of compounds may be used in combination.

The component (C2) is typically used in an amount within a range from 0.01 to 5.0 parts by weight, relative to 100 parts by weight of the component (A). When the amount of the component (C2) is within the above range, the shape of the resist pattern and the post exposure stability of the latent image formed by the pattern-wise exposure of the resist layer are improved.

As the component (C), one type of compound may be used alone, or two or more types of compounds may be used in combination.

In those cases where the resist composition of the present invention includes the component (C), the amount of the component (C) is preferably within a range from 0.05 to 15 parts by weight, more preferably from 0.1 to 15 parts by weight, and still more preferably from 0.1 to 12 parts by weight, relative to 100 parts by weight of the component (A). When the amount of the component (C) is at least as large as the lower limit of the above range, lithography properties such as the roughness can be improved when a resist composition is prepared using the component (C). Furthermore, a favorable resist pattern shape can be obtained. On the other hand, when the amount of the component (C) is not more than the upper limit of the above range, sensitivity can be maintained at a satisfactory level, and throughput can be improved.

<Component (E)>

In order to prevent any deterioration in sensitivity and improve the resist pattern shape and the post exposure stability of the latent image formed by the pattern-wise exposure of the resist layer, at least one compound (E) (hereafter referred to as "component (E)") selected from the group consisting of organic carboxylic acids, and phosphorus oxo acids and derivatives thereof may be added to the resist composition as an optional component.

Examples of the organic carboxylic acids include acetic acid, malonic acid, citric acid, malic acid, succinic acid, benzoic acid, and salicylic acid.

Examples of the phosphorus oxo acids include phosphoric acid, phosphonic acid and phosphinic acid. Among these, phosphonic acid is particularly desirable.

Examples of the oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phosphinate esters and phenylphosphinic acid.

As the component (E), one type of compound may be used alone, or two or more types of compounds may be used in combination.

As the component (E), an organic carboxylic acid is preferred, and salicylic acid is particularly desirable.

In those cases where the resist composition of the present invention includes the component (E), the component (E) is typically used in an amount within a range from 0.01 to 5.0 parts by weight, relative to 100 parts by weight of the component (A).

<Component (F)>

In the present invention, the component (F) is a fluorine-containing polymeric compound.

In the present invention, the dissolution rate of the component (F) in the developing solution containing the aforementioned organic solvent is at least 10 nm/s, and is preferably within a range from 10 to 280 nm/s, more preferably from 10 to 265 nm/s, and still more preferably from 10 to 220 nm/s.

When the dissolution rate of the component (F) in the developing solution is at least 10 nm/s, the unexposed portions of the resist film dissolve readily in the developing solution, resulting in more favorable lithography properties such as CDU.

Further, as described above, the absolute value of the difference in the dissolution rates of the resin component (A1) and the fluorine-containing polymeric compound (F) in the developing solution is not more than 80 nm/s, and is preferably within a range from 0 to 70 nm/s, more preferably from 0 to 65 nm/s, still more preferably from 0 to 60 nm/s, still more preferably from 0 to 30 nm/s, and most preferably from 0 to 10 nm/s.

There are no particular limitations on the component (F) in the present invention, provided it has the type of dissolution rate described above, and any of the conventional fluorine-based additives proposed for use with chemically amplified resist compositions may be selected as appropriate.

Of the various possibilities, the component (F) of the present invention preferably contains a structural unit represented by a general formula (f1) shown below.

[Chemical Formula 65]

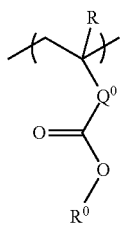
(f1)

In the above formula, R represents a hydrogen atom, an alkyl group of 1 to 5 carbon atoms or a halogenated alkyl group of 1 to 5 carbon atoms, $Q^0$ represents a single bond or a divalent linking group, and $R^0$ represents an organic group which may contain a fluorine atom, provided that when $R^0$ does not contain a fluorine atom, $Q^0$ contains a fluorine atom.

(Structural Unit (f1))

In the formula (f1), R is the same as defined above, and is preferably a hydrogen atom or a methyl group.

In the formula (f1), $Q^0$ represents a single bond or a divalent linking group.

Examples of preferred divalent linking groups for $Q^0$ include a divalent hydrocarbon group which may have a substituent, and a divalent linking group containing a hetero atom. The divalent linking group for $Q^0$ is preferably a divalent organic group that does not contain an acid-dissociable portion. Examples of the divalent hydrocarbon group which may have a substituent and the divalent linking group containing a hetero atom include the same divalent hydrocarbon groups which may have a substituent and the divalent linking groups containing a hetero atom described above for $Y^{22}$. Among these groups, $Q^0$ is preferably a single bond or a divalent linking group containing a hetero atom, and is more preferably a single bond or an aforementioned "combination of a divalent hydrocarbon group which may have a substituent with a divalent linking group containing a hetero atom".

In the above general formula (f1), $R^0$ represents an organic group which may contain a fluorine atom, provided that when $R^0$ does not contain a fluorine atom, $Q^0$ contains a fluorine atom.

Here, an "organic group that contains a fluorine atom" describes a group in which part or all of the hydrogen atoms of an organic group have each been substituted with a fluorine atom.

Preferred examples of the organic group which may contain a fluorine atom for $R^0$ include hydrocarbon groups which may contain a fluorine atom.

The hydrocarbon group which may contain a fluorine atom may be linear, branched or cyclic.

$R^0$ preferably contains 1 to 20 carbon atoms, more preferably 1 to 15 carbon atoms, and still more preferably 1 to 10 carbon atoms.

Further, when $R^0$ is an organic group containing a fluorine atom, it is preferable that at least 25% of the hydrogen atoms in the organic group are fluorinated, more preferable that at least 50% of the hydrogen atoms are fluorinated, and still more preferable that at least 60% of the hydrogen atoms are fluorinated, as this enhances the hydrophobicity of the resist film during liquid immersion lithography.

Specific examples of the structural unit (f1) include structural units represented by general formulas (f1-1) and (f1-2) shown below.

[Chemical Formula 66]

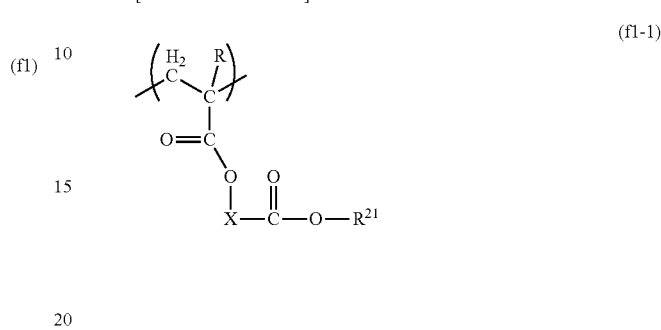

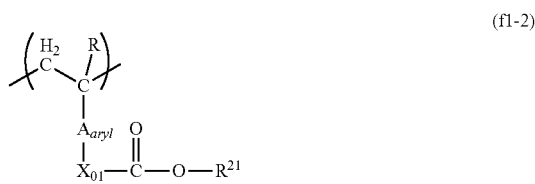

In the above formulas, each R independently represents a hydrogen atom, an alkyl group of 1 to 5 carbon atoms or a halogenated alkyl group of 1 to 5 carbon atoms, X represents a divalent organic group, $A_{aryl}$ represents an aromatic cyclic group which may have a substituent, $X_{01}$ represents a single bond or a divalent linking group, and each $R^{21}$ independently represents an organic group which may contain a fluorine atom, provided that when $R^{21}$ does not contain a fluorine atom, either X in the formula (f1-1), or $A_{aryl}$ or $X_{01}$ in the formula (f1-2), contains a fluorine atom.

In the formulas (f1-1) and (f1-2), R is the same as defined above.

In the formula (f1-1), the divalent linking group for X is the same as defined above for the divalent linking group for $Q^0$ in the formula (f1).

In the general formula (f1-2), $A_{aryl}$ represents an aromatic cyclic group which may have a substituent. Specific examples of $A_{aryl}$ include groups in which two hydrogen atoms have been removed from an aromatic hydrocarbon ring which may have a substituent.

The cyclic structure of the aromatic cyclic group for $A_{aryl}$ preferably contains 6 to 15 carbon atoms, and examples of the cyclic structure include a benzene ring, naphthalene ring, phenanthrene ring and anthracene ring. Of these, a benzene ring or a naphthalene ring is particularly preferred.

In $A_{aryl}$, examples of the substituent with which the aromatic cyclic group may be substituted include a halogen atom, alkyl group, alkoxy group, halogenated alkyl group of 1 to 5 carbon atoms, and an oxygen atom (=O). Examples of the halogen atom include a fluorine atom, chlorine atom, iodine atom and bromine atom. The substituent with which the aromatic cyclic group of $A_{aryl}$ may be substituted is preferably a fluorine atom.

The aromatic cyclic group for $A_{aryl}$ may or may not have a substituent, and aromatic cyclic groups that do not have a substituent are preferred.

In those cases where the aromatic cyclic group for $A_{aryl}$ does have a substituent, the number of substituents may be 1, or 2 or greater, but is preferably either 1 or 2, and is most preferably 1.

In the formula (f1-2), the divalent linking group for $X_{01}$ is the same as defined above for the divalent linking group for $Q^0$ in the formula (f1).

In the formulas (f1-1) and (f1-2), the organic group which may contain a fluorine atom for $R^{21}$ is the same as defined above for the organic group which may contain a fluorine atom for $R^0$ in the formula (f1), is preferably an alkyl group of 1 or 2 carbon atoms, or a fluorinated hydrocarbon group of 1 to 5 carbon atoms, and is most preferably a methyl group, —$CH_2$—$CF_3$, —$CH_2$—$CF_2$—$CF_3$, —$CH(CF_3)_2$, or —$CH_2$—$CH_2$—$CF_2$—$CF_2$—$CF_2$—$CF_3$.

Specific examples of the structural units represented by the formulas (f1-1) and (f1-2) include the structural units represented by general formulas (f1-1-1) to (f1-1-5) and general formulas (f1-2-1) to (f1-2-4) shown below.

[Chemical Formula 67]

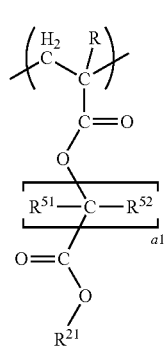

(f1-1-1)

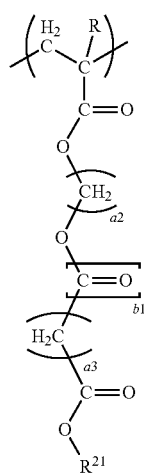

(f1-1-2)

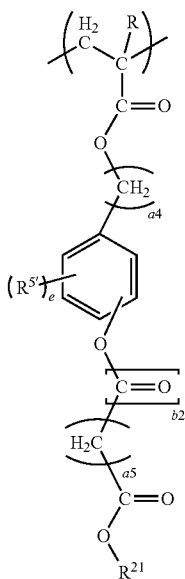

(f1-1-3)

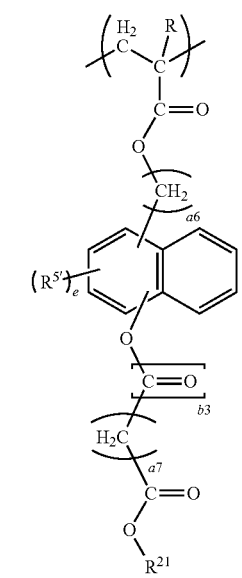

(f1-1-4)

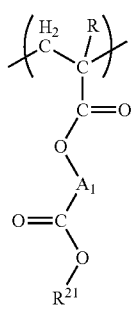

(f1-1-5)

[Chemical Formula 68]

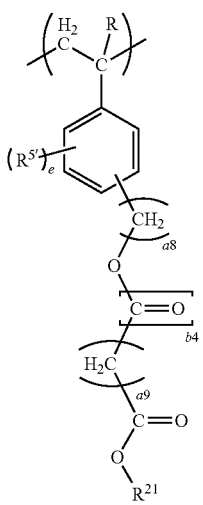

(f1-2-1)

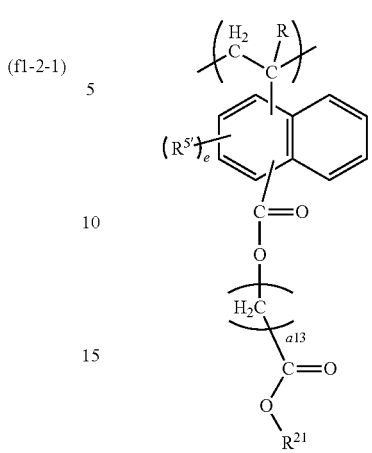

(f1-2-4)

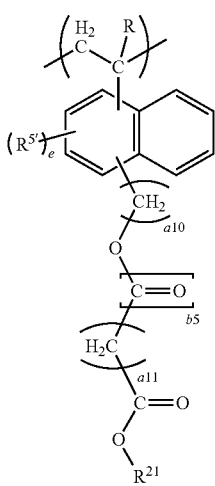

(f1-2-2)

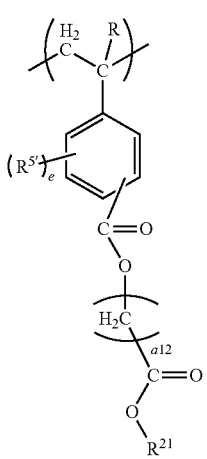

(f1-2-3)

In the formulas (f1-1-1) to (f1-1-5) and the formulas (f1-2-1) to (f1-2-4), R and $R^{21}$ are each the same as defined above; each of $R^{51}$ and $R^{52}$ independently represents a hydrogen atom, halogen atom, alkyl group of 1 to 5 carbon atoms, or halogenated alkyl group of 1 to 5 carbon atoms, wherein the plurality of $R^{51}$ or $R^{52}$ groups may be the same or different from each other; each of a1, a2, a5, a7, a9 and a11 to a13 independently represents an integer of 1 to 5; each of a4, a6, a8 and a10 independently represents an integer of 0 to 5; each of b1 to b5 independently represents 0 or 1; $R^{5\prime}$ represents a substituent, e represents an integer of 0 to 2; and $A_1$ represents a cyclic alkylene group of 4 to 20 carbon atoms.

In the formula (f1-1-1), examples of the halogen atom for $R^{51}$ and $R^{52}$ include a fluorine atom, chlorine atom, bromine atom and iodine atom, and a fluorine atom is particularly desirable. Examples of the alkyl group of 1 to 5 carbon atoms for $R^{51}$ and $R^{52}$ include the same alkyl groups of 1 to 5 carbon atoms described above for R, and a methyl group or ethyl group is particularly desirable. Examples of the halogenated alkyl group of 1 to 5 carbon atoms for $R^{51}$ and $R^{52}$ include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

In the present invention, each of $R^{51}$ and $R^{52}$ is preferably a hydrogen atom, a fluorine atom or an alkyl group of 1 to 5 carbon atoms, and is more preferably a hydrogen atom, a fluorine atom, a methyl group or an ethyl group.

In the formula (f1-1-1), a1 is preferably an integer of 1 to 3, and more preferably 1 or 2.

In the formula (f1-1-2), each of a2 and a3 preferably independently represents an integer of 1 to 3, and is more preferably 1 or 2. b1 is 0 or 1.

In the formula (f1-1-3), a4 is preferably an integer of 0 to 3, more preferably an integer of 0 to 2, and most preferably 0 or 1. a5 is preferably an integer of 1 to 3, and is more preferably 1 or 2. Examples of the substituent for $R^{5\prime}$ include a halogen atom, an alkyl group of 1 to 5 carbon atoms, an alkoxy group of 1 to 5 carbon atoms, a halogenated alkyl group of 1 to 5 carbon atoms, and an oxygen atom (=O). Examples of the halogen atom include a fluorine atom, chlorine atom, iodine atom and bromine atom. e is preferably 0 or 1, and from an industrial viewpoint, is most preferably 0. b2 is preferably 0.

In the formula (f1-1-4), a6 is preferably an integer of 0 to 3, more preferably an integer of 0 to 2, and most preferably 0 or 1. a7 is preferably an integer of 1 to 3, and more preferably 1 or 2. b3 is preferably 0. $R^{5'}$ and e are the same as defined above.

In the formula (f1-1-5), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples include the "cyclic aliphatic hydrocarbon groups" described above in relation to the hydrocarbon group which may have a substituent.

In the formula (f1-2-1), a8 is preferably an integer of 0 to 3, more preferably an integer of 0 to 2, and most preferably 0 or 1. a9 is preferably an integer of 1 to 3, and more preferably 1 or 2. b4 is preferably 0. $R^{5'}$ and e are each the same as defined above.

In the formula (f1-2-2), a10 is preferably an integer of 0 to 3, more preferably an integer of 0 to 2, and most preferably 0 or 1. a11 is preferably an integer of 1 to 3, and more preferably 1 or 2. b5 is preferably 0. $R^{5'}$ and e are each the same as defined above.

In the formula (f1-2-3), a12 is preferably an integer of 1 to 3, and is more preferably 1 or 2. $R^{5'}$ and e are each the same as defined above.

In the formula (f1-2-4), a13 is preferably an integer of 1 to 3, and is more preferably 1 or 2. $R^{5'}$ and e are each the same as defined above.

Specific examples of the structural units represented by the above formulas (f1-1-1) to (f1-1-5) and (f1-2-1) to (f1-2-4) are shown below.

[Chemical Formula 69]

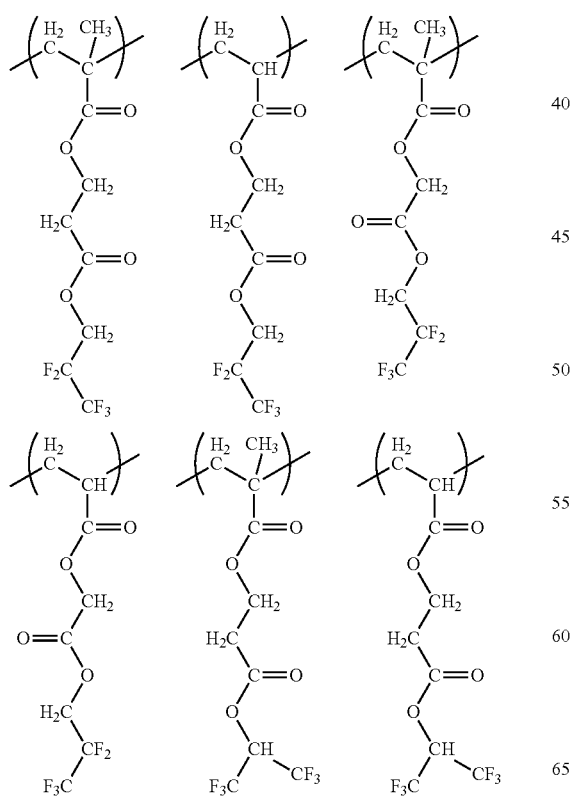
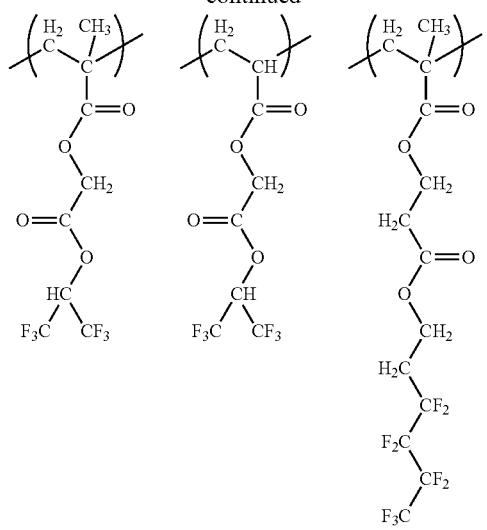
-continued
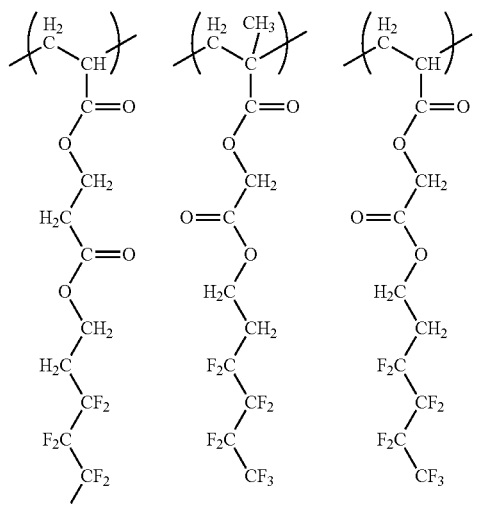
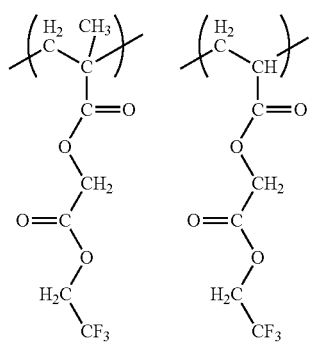

[Chemical Formula 70]
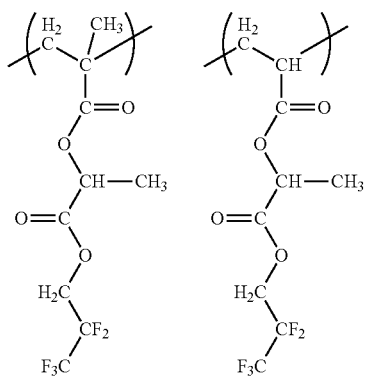
[Chemical Formula 71]
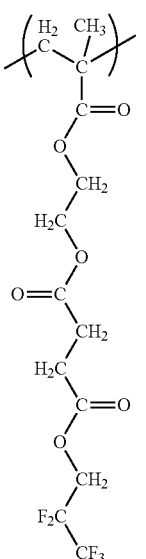 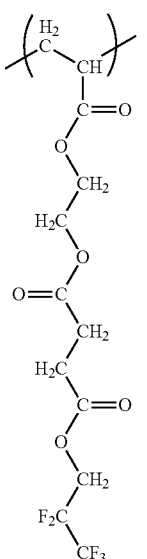 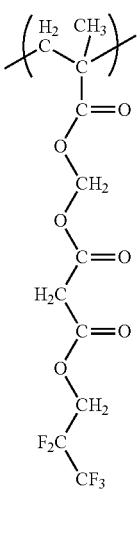

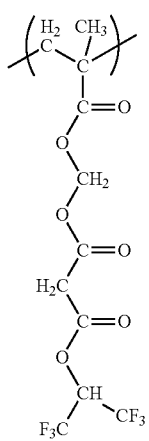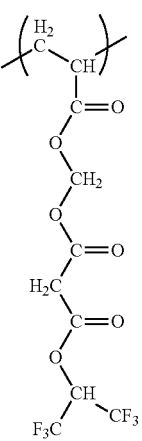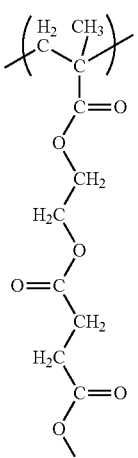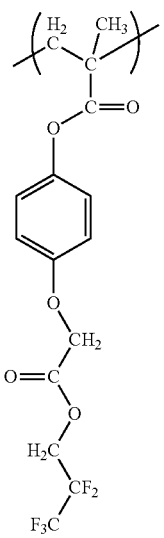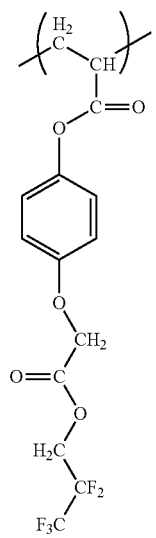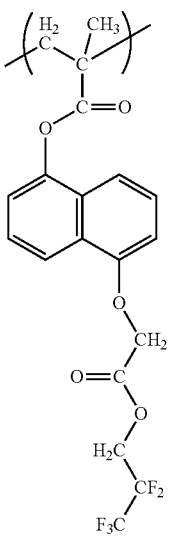
[Chemical Formula 72]
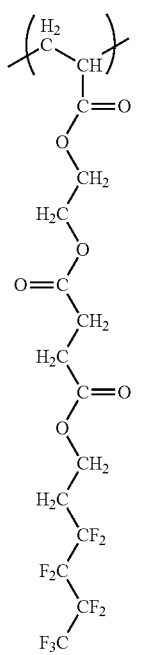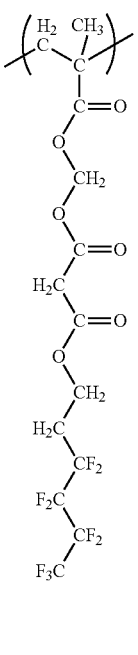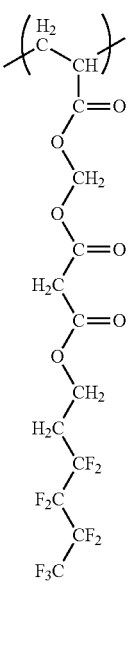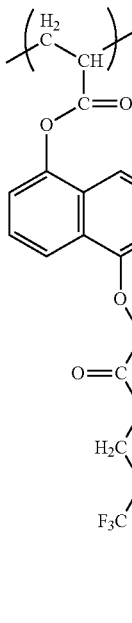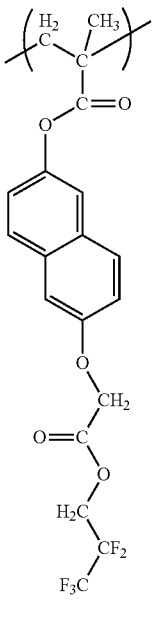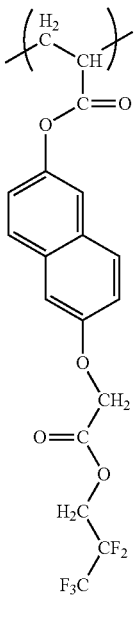

135
-continued
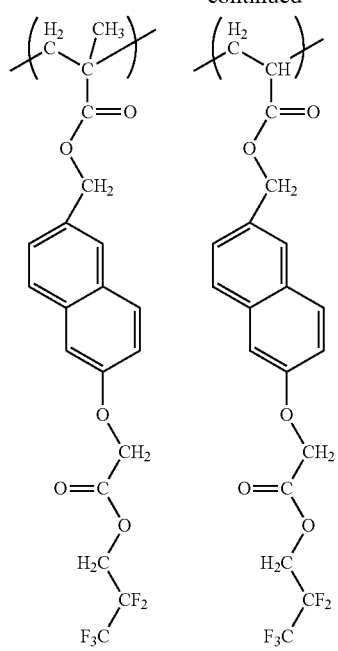
136
-continued
[Chemical Formula 73]
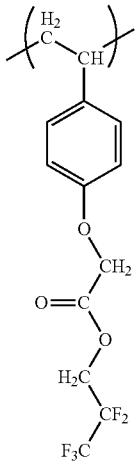
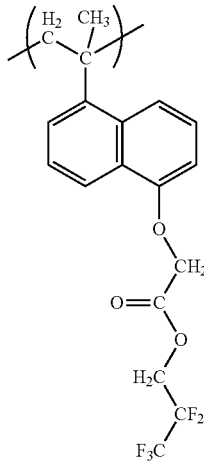
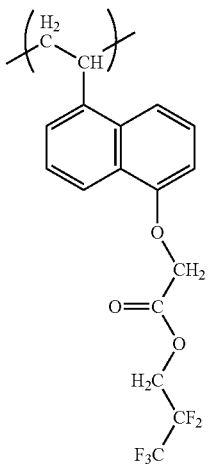
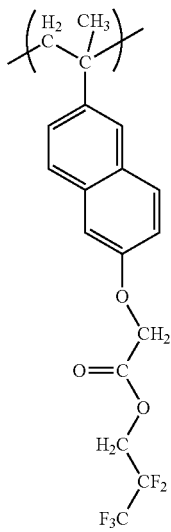
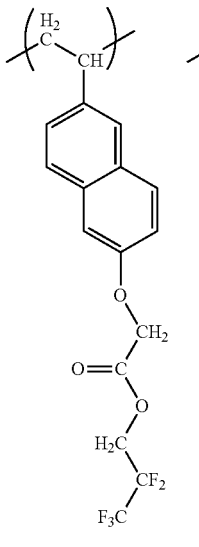
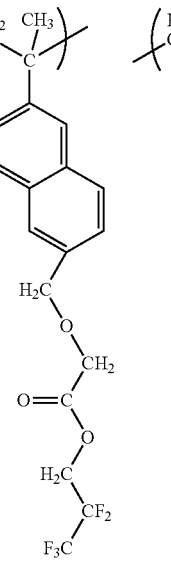

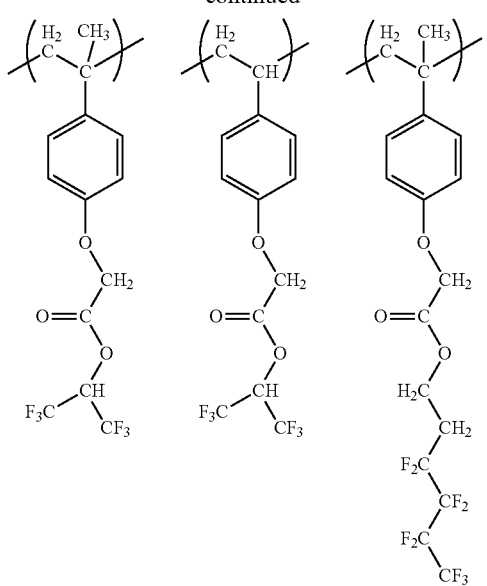
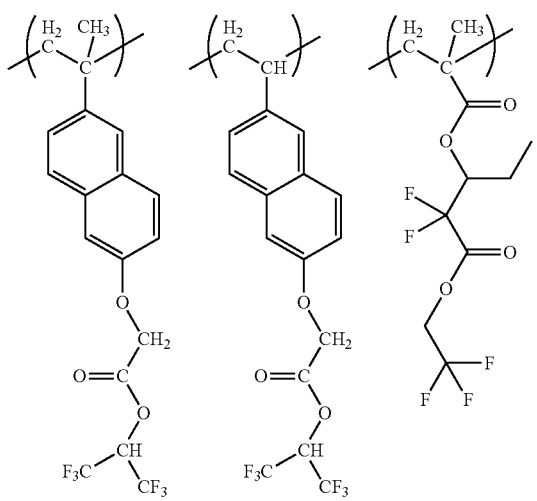
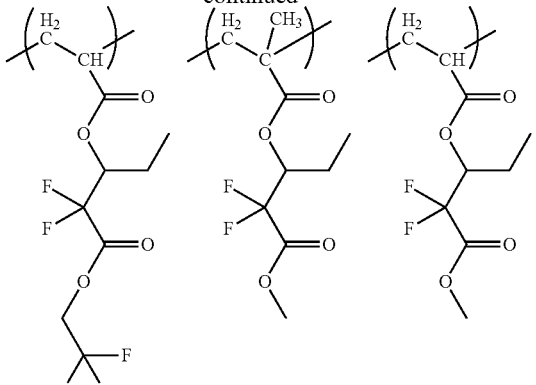
Further, as the structural unit (f1), a structural unit in which $R^o$ is an acid-dissociable group that dissociates under the action of acid is preferable. Specific examples include the structural units shown below. In the following formulas, R is the same as defined above.
[Chemical Formula 74]
[Chemical Formula 75]
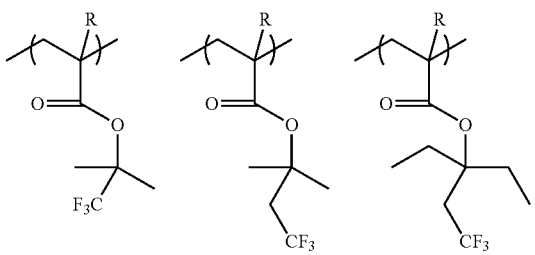
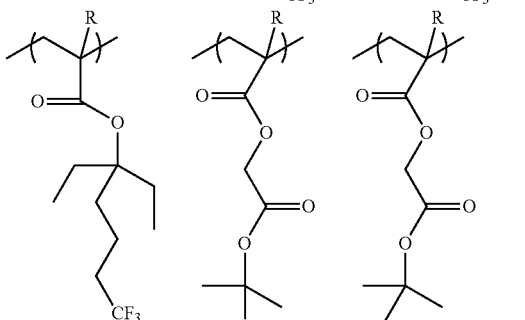
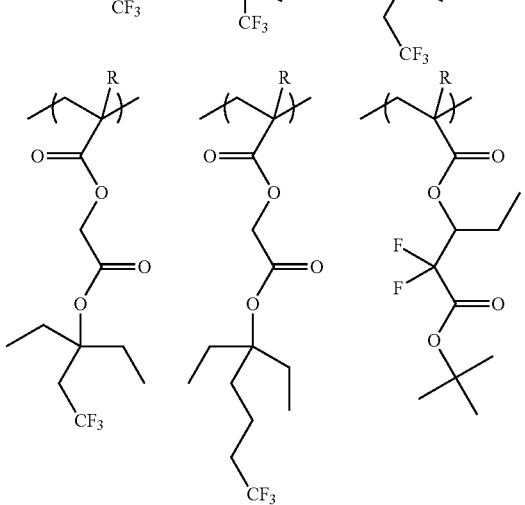

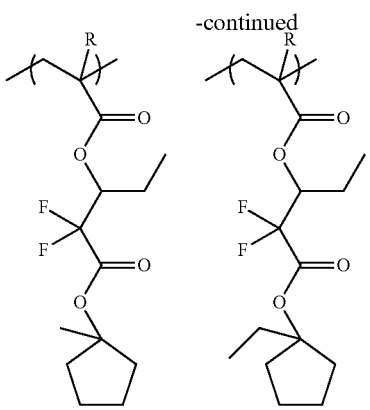

As the structural unit (f1), at least one structural unit selected from the group consisting of structural units represented by the above formulas (f1-1-1) to (f1-1-5) and (f1-2-1) to (f1-2-4) is preferred, at least one structural unit selected from the group consisting of structural units represented by the above formulas (f1-1-1) to (f1-1-5) and (f1-2-1) to (f1-2-2) is more preferred, and a structural unit represented by the formula (f1-1-1) is particularly desirable.

As the structural unit (f1), a single type of structural unit may be used alone, or two or more types may be used in combination.

When the component (F) contains the structural unit (f1), the amount of the structural unit (f1) within the component (F), based on the combined total of all the structural units that constitute the component (F), may be 100 mol %. When the component (F) also contains other structural units besides the structural unit (f1), the amount of the structural unit (f1) is preferably within a range from 1 to 80 mol %, more preferably from 10 to 70 mol %, and still more preferably from 20 to 60 mol %.

When the amount of the structural unit (f1) is at least as large as the lower limit of the above range, the scan tracking ability (water tracking ability during immersion exposure using a scanning-type immersion exposure apparatus) is improved. On the other hand, when the amount of the structural unit (f1) is not more than the upper limit of the above range, a good balance can be achieved with the other structural units. Further, when the amount of the structural unit (f1) is not more than the upper limit of the above range, a good balance of the dissolution rate of the component (F) can be achieved.

The component (F) of the present invention may also include, in addition to the structural unit (f1) described above, a structural unit other than the structural unit (f1) (hereafter referred to as "structural unit (f2)"), provided the effects of the present invention are not impaired.

There are no particular limitations on the structural unit (f2), and any structural unit that is derived from a compound capable of undergoing copolymerization with the compound that yields the structural unit (f1) can be used. Examples of such structural units include the numerous structural units of base resins that have been proposed for use within chemically amplified resists. Specific examples include those structural units among the aforementioned structural units (a1) to (a4) that do not correspond with the structural unit (f1), and the structural unit (a1) or the structural unit (a4) is preferable. In the case of the structural unit (a4), a structural unit of the type (a4) (2) described above (namely, a structural unit represented by the above formula (a4-6)) may be included for the purposes of adjusting the dissolution rate (namely, for the purpose of slowing the dissolution rate). In terms of improving the water repellency of the resist film in a liquid immersion lithography process and the scan tracking ability, a structural unit represented by one of the aforementioned formulas (a1-1), (a1-5) or (a4-1) to (a4-5) is preferred, and a structural unit represented by the formula (a1-1-1), (a1-1-32) or (a11-1-1) is particularly desirable.

In the component (F), as the structural unit (f2), a single type of structural unit may be used alone, or two or more types may be used in combination.

In those cases where the component (F) contains the structural unit (f2), the amount of the structural unit (f2), based on the combined total of all the structural units that constitute the component (F), is preferably within a range from 1 to 90 mol %, more preferably from 5 to 85 mol %, and still more preferably from 10 to 80 mol %.

In the present invention, the component (F) is preferably a polymer containing the structural unit (f1), and is more preferably a copolymer containing the structural unit (f1) and the structural unit (f2).

In the present invention, the component (F) is preferably a copolymer containing a structural unit combination shown in one of general formulas (F-1) to (F-4) shown below. In the following formulas, R, $R^{51}$, $R^{52}$, a1, $R^{21}$, $R^{12}$, h, $R^{11}$, c, e and Z are each the same as defined above, and the plurality of R groups in each formula may be the same or different from each other.

[Chemical Formula 76]

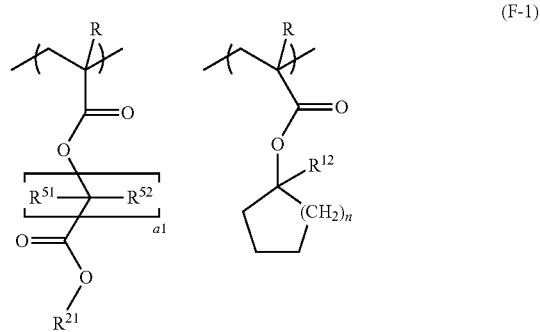

(F-1)

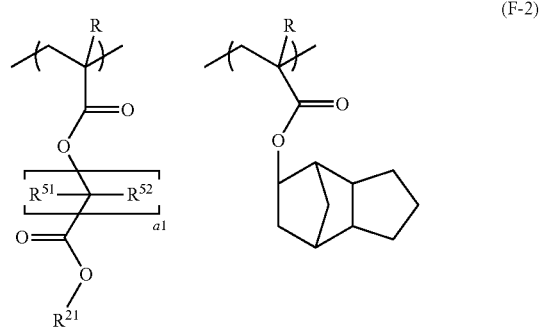

(F-2)

[Chemical Formula 77]

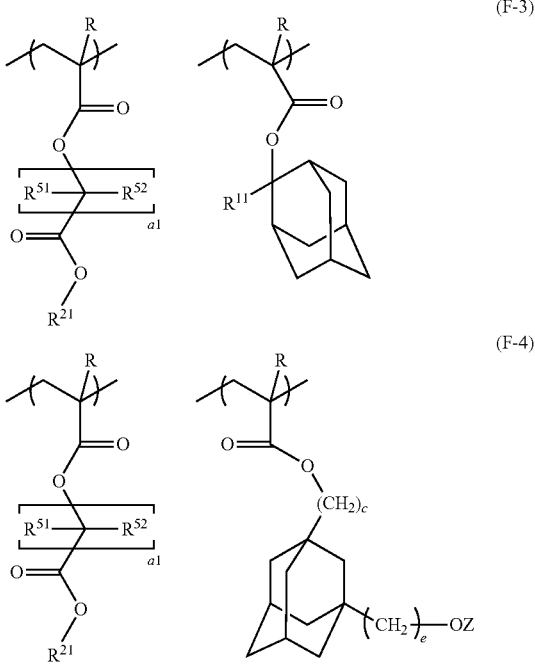

Although there are no particular limitations on the weight-average molecular weight (Mw) (the polystyrene equivalent value determined by gel permeation chromatography) of the component (F), the molecular weight is preferably within a range from 7,000 to 70,000, more preferably from 10,000 to 60,000, and most preferably from 12,000 to 55,000. When the molecular weight is not more than the upper limit of the above-mentioned range, the component (F) exhibits satisfactory solubility in the resist solvent when used within a resist. On the other hand, when the weight average molecular weight is at least as large as the lower limit of the above range, more favorable dry etching resistance and a better cross-sectional shape for the resist pattern are obtained. Furthermore, because the weight-average molecular weight has an effect on the dissolution rate within the developing solution, ensuring a comparatively large molecular weight of 7,000 to 70,000 prevents the dissolution rate of the component (F) from becoming too fast, enabling the dissolution rate of the component (F) to be set at an appropriate level.

Although there are no particular limitations on the dispersity (Mw/Mn) of the component (F), the dispersity is preferably within a range from 1.0 to 5.0, more preferably from 1.0 to 3.0, and most preferably from 1.2 to 2.5.

Mn is the number average molecular weight.

The component (F) described above can also be used favorably as an additive for a resist composition used in liquid immersion lithography.

In the resist composition of the present invention, one type of the component (F) may be used alone, or two or more types may be used in combination.

The amount of the component (F) in the resist composition of the present invention is preferably within a range from 0.1 to 50 parts by weight, more preferably from 0.1 to 40 parts by weight, still more preferably from 0.5 to 30 parts by weight, and most preferably from 0.5 to 15 parts by weight, relative to 100 parts by weight of the component (A).

When the amount of the component (F) is at least as large as the lower limit of the above range, the hydrophobicity of a resist film formed using the resist composition is improved, yielding a resist film having appropriate hydrophobicity for use in liquid immersion lithography, and the hydrophilicity of the resist film generated upon contact with an alkali developing solution is also increased. When the amount of the component (F) is not more than the upper limit of the above range, the lithography properties improve.

If desired, appropriate amounts of other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, and dyes.

<Component (S)>

The resist composition can be produced by dissolving the materials for the resist composition in an organic solvent (hereafter referred to as "component (S)").

The component (S) may be any organic solvent which can dissolve the respective components to give a uniform solution, and one or more kinds of any organic solvent can be appropriately selected from those which have been conventionally known as organic solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

The component (S) may be a single solvent, or a mixed solvent containing a combination of two or more solvents.

Among the various possibilities, γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent may be determined as appropriate, taking into consideration the compatibility of the PGMEA with the polar solvent, but is preferably within a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably within a range from 70:30 to 95:5.

Furthermore, as the component (S), a mixed solvent of PGMEA and cyclohexanone is also preferable. The mixing ratio of such a mixed solvent is preferably PGMEA:cyclohexanone=95 to 5:10 to 90.

According to the present invention, a resist pattern having excellent lithography properties such as CDU can be formed. Although the reasons that this effect is obtained are not entirely clear, they are thought to include the following.

In the present invention, it is thought that by ensuring that the dissolution rates of the component (A1) and the component (F) in the developing solution are at least 10 nm/s, the unexposed portions of the resist film can be dissolved favorably in the developing solution, thereby achieving the effect described above.

Generally, a structural unit having a polar group is included in the base component of the resist composition for the purpose of improving the adhesion of the resist composition with the substrate. As a result, the dissolution rate of this type of base component in organic solvent-based developing solutions is reduced.

Moreover, in liquid immersion lithography and the like, a fluorine-containing polymeric compound is generally used for imparting the resist composition with water repellency, but because most fluorine-containing polymeric compounds do not contain polar groups, these types of fluorine-containing polymeric compounds tend to increase the dissolution rate within organic solvent-based developing solutions.

When these types of base components and fluorine-containing polymeric compounds are combined within a resist composition, it is thought that because a large difference exists in the dissolution rates of the components, dissolution of the resist film tends not to proceed uniformly, resulting in a non-uniform pattern and inferior lithography properties.

In the resist composition of the present invention, it is surmised that because the absolute value of the difference in the dissolution rates of the component (A1) and the component (F) in the developing solution is not more than 80 nm/s, the resin that constitutes the unexposed portions of the resist film dissolves uniformly in the developing solution, yielding a pattern having excellent lithography properties.

EXAMPLES

A more detailed description of the present invention is presented below based on a series of examples, although the present invention is in no way limited by these examples.

Examples 1 to 17, Comparative Examples 1 to 18

The components shown in Tables 1 and 2 were mixed together to prepare a series of resist compositions for negative tone development.

TABLE 1

| | Component (A1) | Component (B) | | Component (C) | Component (F) | Component (S) | CDU 3σ | CDU −1 nm |
|---|---|---|---|---|---|---|---|---|
| Example 1 | (A)-1 [100] | (B)-1 [5.0] | (B)-2 [2.0] | (C)-1 [3.5] | (F)-4 [4.0] | (S)-1 [3300] | 7.89 | 9.69 |
| Example 2 | (A)-1 [100] | (B)-1 [5.0] | (B)-2 [2.0] | (C)-1 [3.5] | (F)-5 [4.0] | (S)-1 [3300] | 7.78 | 9.65 |
| Example 3 | (A)-1 [100] | (B)-1 [5.0] | (B)-2 [2.0] | (C)-1 [3.5] | (F)-6 [4.0] | (S)-1 [3300] | 7.82 | 9.66 |
| Example 4 | (A)-2 [100] | (B)-1 [5.0] | (B)-2 [2.0] | (C)-1 [3.5] | (F)-6 [4.0] | (S)-1 [3300] | 7.81 | 9.61 |
| Example 5 | (A)-2 [100] | (B)-1 [5.0] | (B)-2 [2.0] | (C)-1 [3.5] | (F)-7 [4.0] | (S)-1 [3300] | 7.83 | 9.77 |
| Example 6 | (A)-2 [100] | (B)-1 [5.0] | (B)-2 [2.0] | (C)-1 [3.5] | (F)-8 [4.0] | (S)-1 [3300] | 7.76 | 9.56 |
| Example 7 | (A)-2 [100] | (B)-1 [5.0] | (B)-2 [2.0] | (C)-1 [3.5] | (F)-9 [4.0] | (S)-1 [3300] | 7.36 | 9.46 |
| Example 8 | (A)-3 [100] | (B)-1 [5.0] | (B)-2 [2.0] | (C)-1 [3.5] | (F)-6 [4.0] | (S)-1 [3300] | 7.69 | 9.56 |
| Example 9 | (A)-3 [100] | (B)-1 [5.0] | (B)-2 [2.0] | (C)-1 [3.5] | (F)-7 [4.0] | (S)-1 [3300] | 7.57 | 9.39 |
| Example 10 | (A)-3 [100] | (B)-1 [5.0] | (B)-2 [2.0] | (C)-1 [3.5] | (F)-8 [4.0] | (S)-1 [3300] | 7.36 | 9.28 |
| Example 11 | (A)-3 [100] | (B)-1 [5.0] | (B)-2 [2.0] | (C)-1 [3.5] | (F)-9 [4.0] | (S)-1 [3300] | 7.09 | 9.21 |
| Example 12 | (A)-4 [100] | (B)-1 [5.0] | (B)-2 [2.0] | (C)-1 [3.5] | (F)-7 [4.0] | (S)-1 [3300] | 6.34 | 9.18 |
| Example 13 | (A)-4 [100] | (B)-1 [5.0] | (B)-2 [2.0] | (C)-1 [3.5] | (F)-8 [4.0] | (S)-1 [3300] | 6.81 | 8.05 |
| Example 14 | (A)-4 [100] | (B)-1 [5.0] | (B)-2 [2.0] | (C)-1 [3.5] | (F)-9 [4.0] | (S)-1 [3300] | 6.68 | 8.33 |
| Example 15 | (A)-5 [100] | (B)-1 [5.0] | (B)-2 [2.0] | (C)-1 [3.5] | (F)-7 [4.0] | (S)-1 [3300] | 7.78 | 9.55 |
| Example 16 | (A)-5 [100] | (B)-1 [5.0] | (B)-2 [2.0] | (C)-1 [3.5] | (F)-8 [4.0] | (S)-1 [3300] | 7.65 | 9.52 |
| Example 17 | (A)-5 [100] | (B)-1 [5.0] | (B)-2 [2.0] | (C)-1 [3.5] | (F)-9 [4.0] | (S)-1 [3300] | 7.18 | 9.22 |

TABLE 2

| | Component (A1) | Component (B) | | Component (C) | Component (F) | Component (S) | CDU 3σ | CDU −1 nm |
|---|---|---|---|---|---|---|---|---|
| Comparative example 1 | (A)-1 [100] | (B)-1 [5.0] | (B)-2 [2.0] | (C)-1 [3.5] | (F)-3 [4.0] | (S)-1 [3300] | 8.92 | 10.95 |
| Comparative example 2 | (A)-1 [100] | (B)-1 [5.0] | (B)-2 [2.0] | (C)-1 [3.5] | (F)-7 [4.0] | (S)-1 [3300] | 8.38 | 10.22 |
| Comparative example 3 | (A)-2 [100] | (B)-1 [5.0] | (B)-2 [2.0] | (C)-1 [3.5] | (F)-5 [4.0] | (S)-1 [3300] | 8.53 | 10.74 |
| Comparative example 4 | (A)-2 [100] | (B)-1 [5.0] | (B)-2 [2.0] | (C)-1 [3.5] | (F)-10 [4.0] | (S)-1 [3300] | x | x |
| Comparative example 5 | (A)-3 [100] | (B)-1 [5.0] | (B)-2 [2.0] | (C)-1 [3.5] | (F)-5 [4.0] | (S)-1 [3300] | 8.41 | 10.29 |
| Comparative example 6 | (A)-3 [100] | (B)-1 [5.0] | (B)-2 [2.0] | (C)-1 [3.5] | (F)-10 [4.0] | (S)-1 [3300] | x | x |
| Comparative example 7 | (A)-4 [100] | (B)-1 [5.0] | (B)-2 [2.0] | (C)-1 [3.5] | (F)-1 [4.0] | (S)-1 [3300] | 9.67 | 11.81 |
| Comparative example 8 | (A)-4 [100] | (B)-1 [5.0] | (B)-2 [2.0] | (C)-1 [3.5] | (F)-2 [4.0] | (S)-1 [3300] | 9.58 | 11.02 |
| Comparative example 9 | (A)-4 [100] | (B)-1 [5.0] | (B)-2 [2.0] | (C)-1 [3.5] | (F)-3 [4.0] | (S)-1 [3300] | 8.77 | 10.83 |
| Comparative example 10 | (A)-4 [100] | (B)-1 [5.0] | (B)-2 [2.0] | (C)-1 [3.5] | (F)-4 [4.0] | (S)-1 [3300] | 8.67 | 10.68 |
| Comparative example 11 | (A)-4 [100] | (B)-1 [5.0] | (B)-2 [2.0] | (C)-1 [3.5] | (F)-5 [4.0] | (S)-1 [3300] | 8.21 | 10.39 |
| Comparative example 12 | (A)-4 [100] | (B)-1 [5.0] | (B)-2 [2.0] | (C)-1 [3.5] | (F)-6 [4.0] | (S)-1 [3300] | 8.33 | 9.58 |
| Comparative example 13 | (A)-4 [100] | (B)-1 [5.0] | (B)-2 [2.0] | (C)-1 [3.5] | (F)-10 [4.0] | (S)-1 [3300] | x | x |
| Comparative example 14 | (A)-5 [100] | (B)-1 [5.0] | (B)-2 [2.0] | (C)-1 [3.5] | (F)-6 [4.0] | (S)-1 [3300] | 8.19 | 9.71 |
| Comparative example 15 | (A)-5 [100] | (B)-1 [5.0] | (B)-2 [2.0] | (C)-1 [3.5] | (F)-10 [4.0] | (S)-1 [3300] | x | x |
| Comparative example 16 | (A)-7 [100] | (B)-1 [5.0] | (B)-2 [2.0] | (C)-1 [3.5] | (F)-8 [4.0] | (S)-1 [3300] | x | x |
| Comparative example 17 | (A)-7 [100] | (B)-1 [5.0] | (B)-2 [2.0] | (C)-1 [3.5] | (F)-10 [4.0] | (S)-1 [3300] | x | x |
| Comparative example 18 | (A)-6 [100] | (B)-1 [5.0] | (B)-2 [2.0] | (C)-1 [3.5] | (F)-0 [4.0] | (S)-1 [3300] | x | x |

Further, the combinations of the component (A1) and the component (F) used in the examples 1 to 17 and the comparative examples 1 to 18, and the dissolution rates (nm/s) of the component (A1) and the component (F) are shown in Table 3.

Further, the absolute value of the difference in the dissolution rates in each of the examples and comparative examples is shown in the brackets [ ] in Table 3.

The dissolution rate was calculated in the manner described below.

First, a 10% solution was prepared by dissolving the target component (A1) or component (F) in PGMEA, and the thus prepared solution was applied uniformly to an 8-inch silicon substrate using a spinner. A prebake (PAB) treatment was then performed on a hotplate at 110° C. for 60 seconds, forming a resin film having a thickness of 350 nm. Subsequently, the resin film was dipped in butyl acetate at 23° C. for 60 seconds, and the dissolution rate (thickness loss/dipping time) was measured.

TABLE 3

| | | | Component (A1) | | | | | | |
|---|---|---|---|---|---|---|---|---|---|
| | | | (A)-1 | (A)-2 | (A)-3 | (A)-4 | (A)-5 | (A)-6 | (A)-7 |
| | | Dissolution rate (nm/s) | 185 | 95.9 | 31.4 | 24.5 | 11.24 | 5.20 | 2.99 |
| Component (F) | (F)-0 | 1200 | | | | | | Comparative example 18 [1194.8] | |
| | (F)-1 | 1000 | | | | Comparative example 7 [975.55] | | | |
| | (F)-2 | 600 | | | | Comparative example 8 [575.55] | | | |
| | (F)-3 | 340.9 | Comparative example 1 [155.9] | | | Comparative example 9 [316.45] | | | |
| | (F)-4 | 261.83 | Example 1 [76.83] | | | Comparative example 10 [237.38] | | | |
| | (F)-5 | 205.41 | Example 2 [20.41] | Comparative example 3 [109.5] | Comparative example 5 [173.97] | Comparative example 11 [180.96] | | | |

TABLE 3-continued

| | | Component (A1) | | | | | | |
|---|---|---|---|---|---|---|---|---|
| | | (A)-1 | (A)-2 | (A)-3 | (A)-4 | (A)-5 | (A)-6 | (A)-7 |
| (F)-6 | 108.83 | Example 3 [76.17] | Example 4 [12.92] | Example 8 [77.39] | Comparative example 12 [84.38] | Comparative example 14 [97.59] | | |
| (F)-7 | 80.88 | Comparative example 2 [104.12] | Example 5 [15.03] | Example 9 [49.44] | Example 12 [56.43] | Example 15 [69.64] | | |
| (F)-8 | 29.53 | | Example 6 [66.38] | Example 10 [1.91] | Example 13 [5.08] | Example 16 [18.29] | | Comparative example 16 [26.54] |
| (F)-9 | 18.9 | | Example 7 [77.01] | Example 11 [12.54] | Example 14 [5.55] | Example 17 [7.66] | | |
| (F)-10 | 6.09 | | Comparative example 4 [89.82] | Comparative example 6 [25.35] | Comparative example 13 [18.36] | Comparative example 15 [5.15] | | Comparative example 17 [3.1] |

The reference characters in Tables 1 to 3 have the following meanings. Further, the numerical values in brackets [ ] indicate the amount (in terms of parts by weight) of the component added.

(A)-1: a polymeric compound (A)-1 shown below [Mw=5,000, Mw/Mn=1.78, l/m/n=60/20/20 (molar ratio)].

(A)-2: a polymeric compound (A)-2 shown below [Mw=8,300, Mw/Mn=1.96, l/m/n=60/30/10 (molar ratio)].

(A)-3: a polymeric compound (A)-3 shown below [Mw=7,000, Mw/Mn=1.65, l/m/n=50/30/20 (molar ratio)].

(A)-4: a polymeric compound (A)-4 shown below [Mw=9,100, Mw/Mn=1.80, l/m/n/o/p=40/30/10/10/10 (molar ratio)].

(A)-5: a polymeric compound (A)-5 shown below [Mw=7,000, Mw/Mn=1.53, l/m/n/o=40/20/20/20 (molar ratio)].

(A)-6: a polymeric compound (A)-6 shown below [Mw=8,500, Mw/Mn=1.85, l/m/n/o=30/40/20/10 (molar ratio)].

(A)-7: a polymeric compound (A)-7 shown below [Mw=6,800, Mw/Mn=1.91, l/m/n/o=30/20/40/10 (molar ratio)].

(B)-1: a compound (B)-1 shown below.
(B)-2: a compound (B)-2 shown below.
(C)-1: a compound (C)-1 shown below.
(F)-0: a polymeric compound (F)-0 shown below [Mw=7,600, Mw/Mn=1.6, l=100 (molar ratio)].

(F)-1: a polymeric compound (F)-1 shown below [Mw=28,000, Mw/Mn=1.89, l/m=50/50 (molar ratio)].

(F)-2: a polymeric compound (F)-2 shown below [Mw=14,000, Mw/Mn=1.50, l/m=80/20 (molar ratio)].

(F)-3: a polymeric compound (F)-A shown below [Mw=28,000, Mw/Mn=1.79, l/m=70/30 (molar ratio)].

(F)-4: a polymeric compound (F)-4 shown below [Mw=28,000, Mw/Mn=1.86, l/m=50/50 (molar ratio)].

(F)-5: a polymeric compound (F)-A shown below [Mw=14,000, Mw/Mn=1.78, l/m=50/50 (molar ratio)].

(F)-6: a polymeric compound (F)-A shown below [Mw=28,000, Mw/Mn=1.99, l/m=50/50 (molar ratio)].

(F)-7: a polymeric compound (F)-A shown below [Mw=50,000, Mw/Mn=1.92, l/m=50/50 (molar ratio)].

(F)-8: a polymeric compound (F)-A shown below [Mw=28,000, Mw/Mn=1.94, l/m=30/70 (molar ratio)].

(F)-9: a polymeric compound (F)-A shown below [Mw=48,000, Mw/Mn=1.99, l/m=30/70 (molar ratio)].

(F)-10: a polymeric compound (F)-10 shown below [Mw=32,000, Mw/Mn=1.98, l/m/n=40/40/20 (molar ratio)].

(S)-1: A mixed solvent in which PGMEA/cyclohexanone=9/1 (weight ratio).

[Chemical Formula 78]

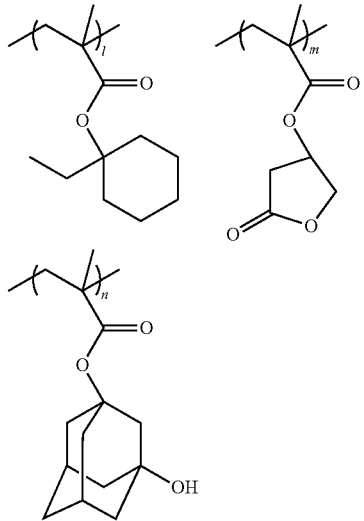

(A)-1

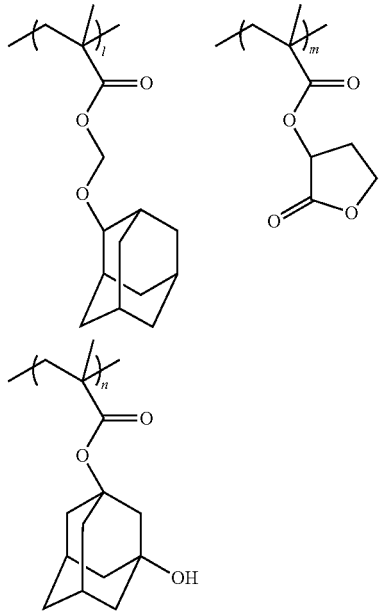

(A)-2

-continued
(A)-3
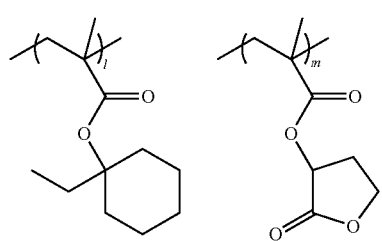
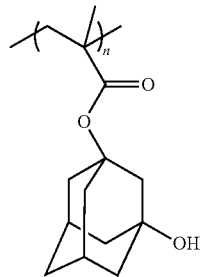
(A)-4
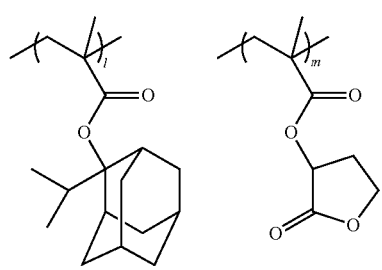
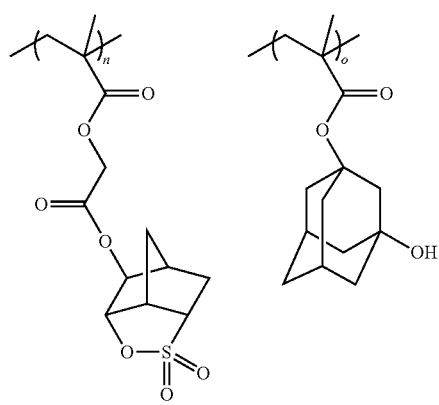
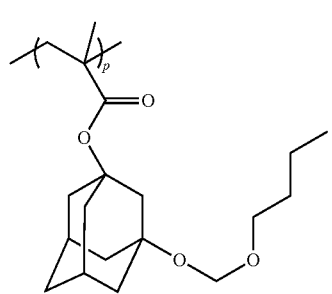
-continued
[Chemical Formula 79]
(A)-5
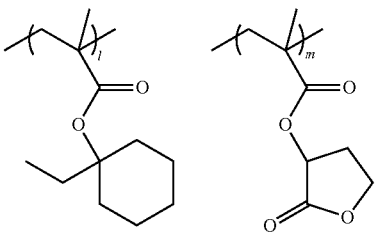
(A)-6
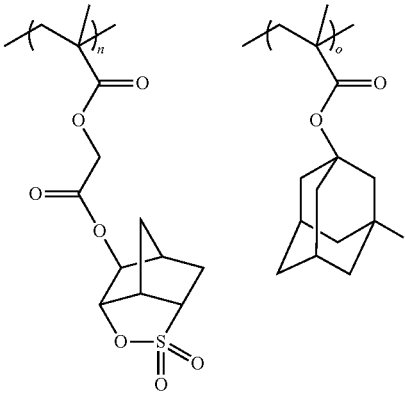
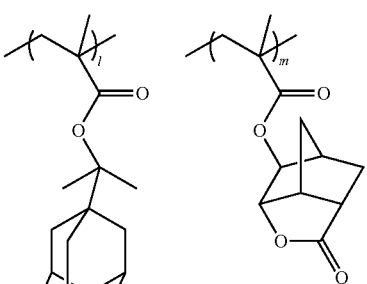
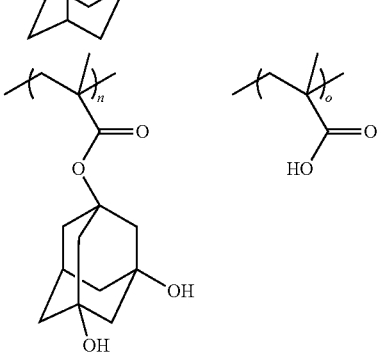
(A)-7
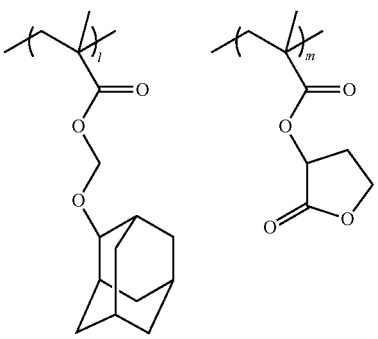

-continued
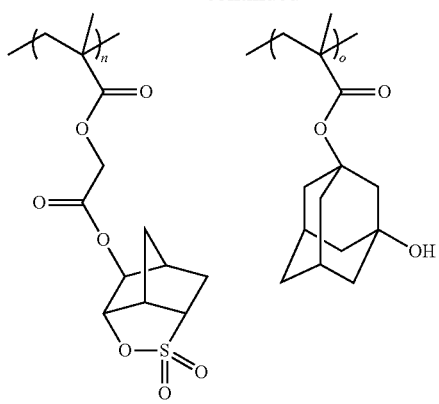
[Chemical Formula 80]
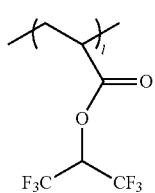
(F)-0
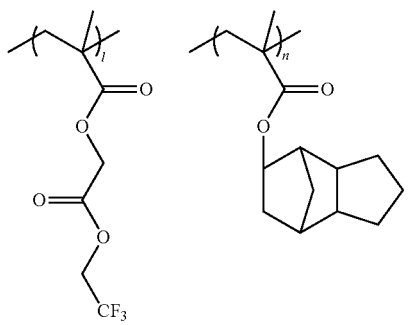
(F)-1
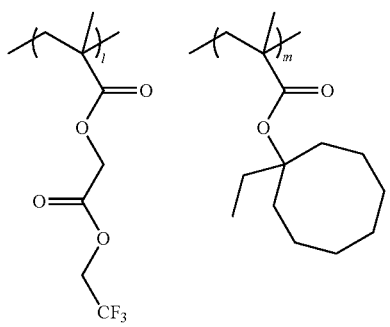
(F)-2)
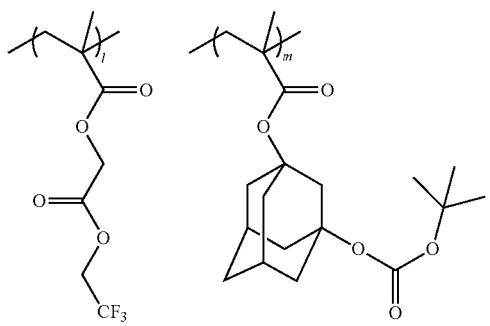
(F)-A
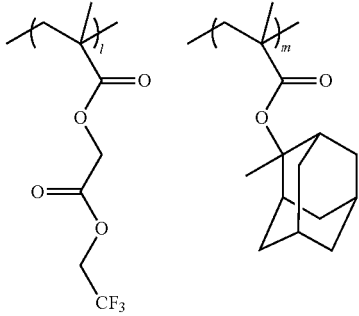
(F)-4
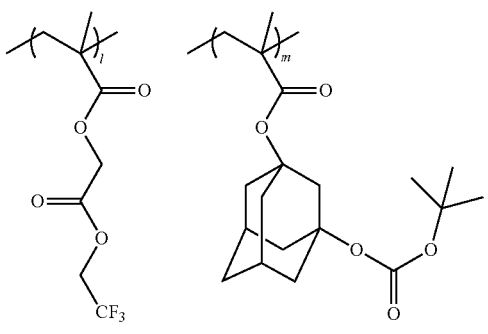
(F)-10
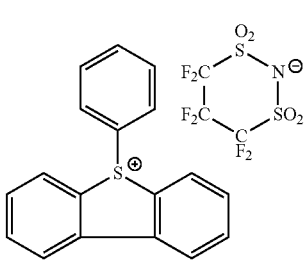
[Chemical Formula 81]
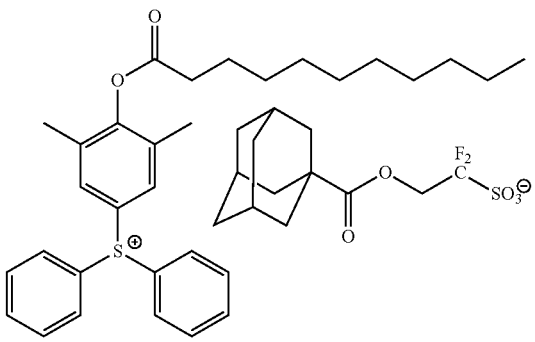
(B)-1
(B)-2

-continued

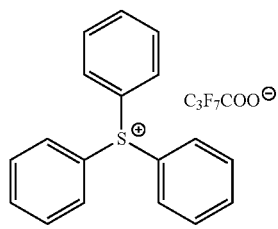

(C)-1

Using each of the resist compositions for negative tone development prepared above, a resist pattern was formed using the procedure described below, and the evaluations described below were then performed.

[Formation of Resist Pattern]

An organic antireflection film composition ARC95 (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 90 nm.

Each of the resist compositions from the examples above was applied onto a thus formed antireflection film using a spinner, and was then subjected to a prebake (PAB) treatment on a hotplate at 105° C. for 60 seconds and dried, thereby forming a resist film having a film thickness of 100 nm.

Subsequently, using an ArF lithography exposure apparatus NSR-5609B (manufactured by Nikon Corporation, NA (numerical aperture)=1.07, Cross pole (0.78/0.97) w/POL-ANO), the resist film was selectively irradiated with an ArF excimer laser (193 nm) through a mask.

Next, a PEB treatment was conducted at 85, 90 or 95° C. for 60 seconds, followed by development for 13 seconds at 23° C. in butyl acetate. The wafer was then shaken dry, and a post-bake treatment was performed at 100° C. for 60 seconds.

As a result, in each of the examples (with the exceptions of the comparative examples 4, 6, 13 and 15 to 18), a contact hole (CH) pattern was obtained in which holes having a hole diameter of 50 nm were arranged with equal spacing therebetween (pitch: 100 nm).

[Evaluation of CDU]

The CH pattern having a hole diameter of 50 nm formed at the optimum exposure Eop for forming the CH pattern was inspected, and the hole diameter (CD) was measured for 100 holes within CH pattern. A standard deviation (σ) was calculated from these results, and the value of 3 times the standard deviation (3σ) was determined and used as an indicator of the CDU. A smaller value for 3σ indicates superior CDU, and a value of 8 or less was considered satisfactory. For the three PEB temperatures mentioned above, the best result for the value of 3σ was recorded in Table 1 or 2 as "CDU 3σ". In the tables, a result of "x" means that a CH pattern could not be formed.

Further, using the optimum exposure Eop for forming a CH pattern having a hole diameter of 50 nm (and the best PEB temperature for each resist composition), a CH pattern was formed using a mask pattern that targeted a hole diameter of 49 nm. The hole diameter (CD) was measured for 100 holes within the resulting CH pattern, and the value of 3 times the standard deviation was calculated from the results and used as an indicator of CDU (−1 nm). A smaller value indicates superior CDU at very fine levels, and a value of 10 or less was considered satisfactory. When this value exceeded 10, visual inspection of the CH pattern clearly revealed that the pattern had collapsed. The results are shown in Table 1 or 2 as "CDU−1 nm". In the tables, a result of "x" means that a CH pattern could not be formed.

Based on the above results, it was confirmed that the resist compositions of the examples 1 to 17 exhibited excellent CDU compared with the resist compositions of the comparative examples 1 to 18.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, the method comprising: a step of forming a resist film on a substrate using a resist composition comprising a base component (A) that exhibits reduced solubility in an organic solvent under action of acid, an acid generator component (B) that generates acid upon exposure, and a fluorine-containing polymeric compound (F), a step of exposing the resist film, and a step of patterning the resist film by negative tone development using a developing solution containing the organic solvent, thereby forming a resist pattern, wherein the base component (A) comprises a resin component (A1) containing a structural unit (a1), which is derived from an acrylate ester in which a hydrogen atom bonded to a carbon atom on an α-position may be substituted with a substituent, and contains an acid-decomposable group that exhibits increased polarity under action of acid, dissolution rates of the resin component (A1) and the fluorine-containing polymeric compound (F) in the developing solution are each at least 10 nm/s, and an absolute value of a difference in the dissolution rates of the resin component (A1) and the fluorine-containing polymeric compound (F) in the developing solution is not more than 80 nm/s.

2. The method of forming a resist pattern according to claim 1, wherein the weight-average molecular weight of the resin component (A1) is within a range from 6,000 to 15,000, and the weight-average molecular weight of the fluorine-containing polymeric compound (F) is within a range from 7,000 to 70,000.

3. The method of forming a resist pattern according to claim 1, wherein the fluorine-containing polymeric compound (F) comprises at least one structural unit represented by general formulae (f1-1) and (f1-2) shown below:

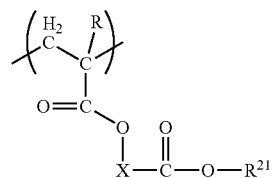

(f1-1)

-continued

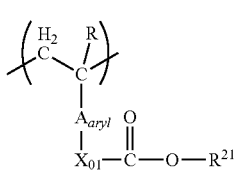
(f1-2)

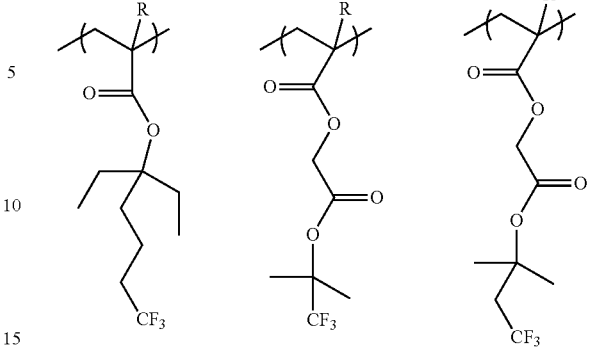

wherein each R independently represents a hydrogen atom, an alkyl group of 1 to 5 carbon atoms or a halogenated alkyl group of 1 to 5 carbon atoms, X represents a divalent organic group, $A_{aryl}$ represents an aromatic cyclic group which may have a substituent, $X_{01}$ represents a single bond or a divalent linking group, and each $R^{21}$ independently represents an organic group which may contain a fluorine atom, provided that when $R^{21}$ does not contain a fluorine atom, either X in the formula (f1-1), or $A_{aryl}$ or $X_{01}$ in the formula (f1-2), contains a fluorine atom.

4. The method of forming a resist pattern according to claim 1, wherein the fluorine-containing polymeric compound (F) comprises a structural unit represented by general formula (f1) shown below:

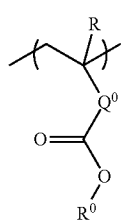
(f1)

wherein R represents a hydrogen atom, an alkyl group of 1 to 5 carbon atoms or a halogenated alkyl group of 1 to 5 carbon atoms, $Q^0$ represents a single bond or a divalent linking group, and $R^0$ represents an acid-dissociable group which may contain a fluorine atom, provided that when $R^0$ does not contain a fluorine atom, $Q^0$ contains a fluorine atom.

5. The method of forming a resist pattern according to claim 4, wherein the fluorine-containing polymeric compound (F) comprises at least one member selected from the group consisting of structural units shown below:

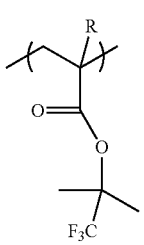 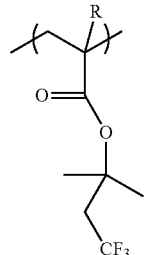 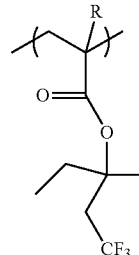

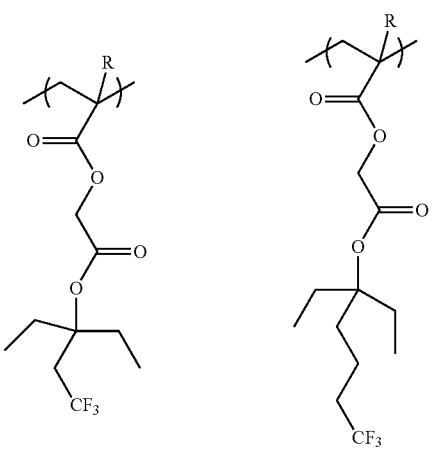

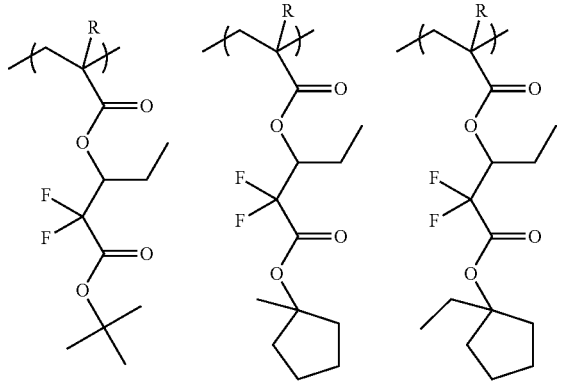

* * * * *